(12) United States Patent
Kato et al.

(10) Patent No.: US 7,955,780 B2
(45) Date of Patent: Jun. 7, 2011

(54) POSITIVE RESIST COMPOSITION AND PATTERN FORMING METHOD USING THE SAME

(75) Inventors: Takayuki Kato, Shizuoka (JP); Akinori Shibuya, Shizuoka (JP); Yusuke Iizuka, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 12/668,674

(22) PCT Filed: Jul. 10, 2008

(86) PCT No.: PCT/JP2008/062524
§ 371 (c)(1),
(2), (4) Date: Jan. 12, 2010

(87) PCT Pub. No.: WO2009/011289
PCT Pub. Date: Jan. 22, 2009

(65) Prior Publication Data
US 2010/0203451 A1    Aug. 12, 2010

(30) Foreign Application Priority Data

Jul. 13, 2007  (JP) .................................. 2007-184394

(51) Int. Cl.
*G03F 7/00* (2006.01)
*G03F 7/004* (2006.01)

(52) U.S. Cl. .................. 430/270.1; 430/273.1; 430/311; 430/396; 430/905; 430/913; 430/945

(58) Field of Classification Search ............... 430/270.1, 430/273.1, 311, 396, 905, 913, 945
See application file for complete search history.

(56) References Cited

U.S. PATENT DOCUMENTS

| 6,207,342 | B1 | 3/2001 | Takechi et al. | |
| 6,368,770 | B1 | 4/2002 | Jung et al. | |
| 7,504,194 | B2 * | 3/2009 | Fukuhara et al. | 430/270.1 |
| 7,550,250 | B2 * | 6/2009 | Kanda | 430/270.1 |
| 7,569,326 | B2 * | 8/2009 | Ohsawa et al. | 430/270.1 |
| 7,611,820 | B2 * | 11/2009 | Kanda et al. | 430/270.1 |
| 7,645,557 | B2 * | 1/2010 | Mizutani et al. | 430/270.1 |
| 7,700,260 | B2 * | 4/2010 | Kanna et al. | 430/270.1 |
| 7,771,914 | B2 * | 8/2010 | Hatakeyama et al. | 430/270.1 |
| 2004/0058269 | A1 | 3/2004 | Hada et al. | |
| 2005/0019690 | A1 * | 1/2005 | Kodama | 430/270.1 |
| 2006/0068324 | A1 | 3/2006 | Mita | |
| 2006/0204888 | A1 | 9/2006 | Aoki et al. | |
| 2007/0111135 | A1 | 5/2007 | Hayashi et al. | |
| 2007/0190449 | A1 * | 8/2007 | Momose et al. | 430/270.1 |

FOREIGN PATENT DOCUMENTS

| EP | 1754999 A2 * | 2/2007 |
| EP | 1795961 A1 * | 6/2007 |
| JP | 11-119434 A | 4/1999 |
| JP | 2000-214587 A | 8/2000 |
| JP | 2001-98034 A | 4/2001 |
| JP | 2003-167347 A | 6/2003 |
| JP | 2003-223001 A | 8/2003 |
| JP | 2004-334156 A | 11/2004 |
| JP | 2005-37893 A | 2/2005 |
| JP | 2006-91762 A | 4/2006 |
| JP | 2006-249225 A | 9/2006 |
| WO | 2005/085301 A1 | 9/2005 |

OTHER PUBLICATIONS

International Search Report for PCT/JP2008/062524 dated Aug. 12, 2008 [PCT/ISA/210].
Written Opinion for PCT/JP2008/062524 [PCT/ISA/237].

* cited by examiner

*Primary Examiner* — Amanda C. Walke
(74) *Attorney, Agent, or Firm* — Sughrue Mion, PLLC

(57) ABSTRACT

Provided is a positive resist composition using a resin having, in the polymer main chain, a specific acid decomposable structure and further having, in the side chain thereof, several specific acid decomposable groups, satisfactory in an exposure latitude, a focus latitude, and pattern collapse prevention at a high level, and having reduced development defects; and a pattern forming method.

11 Claims, No Drawings

POSITIVE RESIST COMPOSITION AND PATTERN FORMING METHOD USING THE SAME

TECHNICAL FIELD

The present invention relates to a positive resist composition that reacts when exposed to actinic rays or radiation and changes its properties; and a pattern forming method using the positive resist composition. More specifically, the present invention pertains to a positive resist composition for use in a manufacturing step of semiconductors such as IC, manufacture of circuit substrates for liquid crystals, thermal heads and the like, other photo-fabrication steps, lithographic printing, and acid curable compositions; and also a pattern forming method using the positive resist composition.

BACKGROUND ART

In recent years, with an increasing degree of integration in integrated circuits, processing of an ultrafine pattern composed of lines having a width not greater than half micron has come to be required in the manufacturing of semiconductor substrates such as very-large-scale integrated circuit. To satisfy such a requirement, the wavelength to be used in an exposure apparatus for photolithography is decreasing. Now, even use of, among far ultraviolet lights, an excimer laser beam (such as XeCl, KrF or ArF) having a short wavelength is under investigation. For the formation of patterns for lithography in this wavelength region, chemical amplification resists are typically employed.

When a KrF excimer laser is used as an exposure light source, a resin having small absorption mainly in a region of 248 nm and having poly(hydroxystyrene) as a basic skeleton is used as the main component so that the chemically amplified resist forms good patterns with high sensitivity and high resolution. It therefore becomes a superior system to a conventional naphthoquinone/novolac resin system.

When a light source having a shorter wavelength such as an ArF excimer laser (193 nm) is used as an exposure light source, on the other hand, a compound having an aromatic group essentially exhibits large absorption in a 193 nm region so that even the chemical amplification system does not produce sufficient results.

Resists for ArF excimer laser containing a resin having an alicyclic hydrocarbon structure has therefore been developed.

For example, Patent Document 1 and Patent Document 2 describe a composition containing a resin having a polycyclic acid-decomposable recurring unit and a non-acid-decomposable recurring unit. These resins are chemically amplified resists containing a protective group which is labile to an acid and dissociates in the presence of an acid. In spite of an eager demand for finer resist patterns, it has become difficult to achieve sufficient resist performances only by using such a protective group singly.

For example, Patent Document 3 therefore discloses a positive resist composition containing a resin having two recurring units having an acid-decomposable group.

As described in Patent Documents 4 to 6, a resist polymer obtained by introducing a crosslinking site, which dissociates in the presence of an acid, into the side chain of a resin containing a recurring unit having an acid dissociable protecting group is studied.

In this resist polymer, a crosslinking bond is cleaved by an acid catalyst, leading to improvement in dissolution contrast between an exposed area and an unexposed area. For the polymerization to obtain the polymer, a bifunctional monomer such as diacrylate is used and a crosslink reaction occurs in the side chain of a high molecular chain. As a result, the molecular weight distribution of the polymer thus formed is extremely large so that the polymer has poor solubility and the polymer tends to have an ultrahigh molecular weight. Even after decomposition with an acid, high-molecular-weight components sparingly soluble in an alkaline developer remain and existence of these foreign matters causes a problem, that is, an increase in development defects.

As described in Patent Document 5, when a crosslinked polymer having, in the high molecular side chain thereof, a crosslinking site having an acid-labile acetal skeleton is used as a resist polymer, it tends to have poor storage stability due to very high sensitivity to an acid.

There is proposed, on the other hand, a positive photosensitive resin having, in the high molecular main chain thereof, an acid dissociable structure (Patent Documents 7 and 8). Although such a proposal is made for overcoming the above-described problem of the side-chain crosslinking polymer, it does not produce a sufficient effect.

In addition, improvement in exposure latitude, focus latitude, and pattern collapse property is required more strongly than ever in order to satisfy the demand for finer resist patterns.

Patent Document 1: Japanese Patent Laid-Open No. 2003-167347
Patent Document 2: Japanese Patent Laid-Open No. 2003-223001
Patent Document 3: Japanese Patent Laid-Open No. Hei 11-119434
Patent Document 4: Japanese Patent Laid-Open No. 2005-37893
Patent Document 5: Japanese Patent Laid-Open No. 2001-98034
Patent Document 6: Japanese Patent Laid-Open No. 2000-214587
Patent Document 7: Japanese Patent Laid-Open No. 2006-91762
Patent Document 8: International publication WO05/085301 pamphlet

DISCLOSURE OF THE INVENTION

Problems that the Invention is to Solve

The present invention has been made based on the above-described background. An object of it is to provide a positive resist composition used for the formation of fine patterns in semiconductor manufacture or the like, satisfactory in exposure latitude, focus latitude, and pattern collapse prevention at a higher level than that of conventional products, and having reduced development defects; and a pattern forming method using the positive resist composition.

Means for Solving the Problems

The present inventors have carried out an intensive investigation of constituent materials of a positive chemically amplified resist composition. As a result, it has been found that the object of the present invention can be achieved by using a resin having, in the high molecular main chain thereof, a specific acid decomposable structure and further having, in the side chain of the resin, a plurality of specific acid decomposable groups, leading to the completion of the present invention. Described specifically, the above-described object can be achieved by the following constitutions.

[1] A positive resist composition containing:
(A) a resin capable of increasing solubility in an alkaline developer under action of an acid, wherein the resin (A) has a recurring unit having a first group selected from the groups represented by any of the following formulas (pI) to (pV), a recurring unit having a second group selected from the groups represented by any of the following formulas (pI) to (pV) but different from the first group, and a structure represented by the following formula (1) in the polymer main chain;
(B) a compound generating an acid when exposed to actinic rays or radiation; and
(C) a solvent:

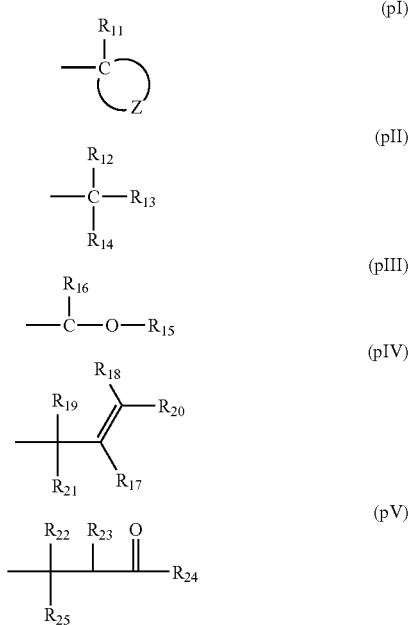

in the formulas (pI) to (pV), $R_{11}$ represents an alkyl group or a cycloalkyl group;

Z represents an atomic group necessary to form a cycloalkyl group with a carbon atom;

$R_{12}$ to $R_{16}$ each independently represents an alkyl group or a cycloalkyl group provided that at least one of $R_{12}$ to $R_{14}$ or either one of $R_{15}$ or $R_{16}$ represents a cycloalkyl group;

$R_{17}$ to $R_{21}$ each independently represents a hydrogen atom, an alkyl group, or a cycloalkyl group provided that at least one of $R_{17}$ to $R_{21}$ represents a cycloalkyl group and either one of $R_{19}$ or $R_{21}$ represents an alkyl group or a cycloalkyl group; and $R_{22}$ to $R_{25}$ each independently represents a hydrogen atom, an alkyl group, or a cycloalkyl group provided that at least one of $R_{22}$ to $R_{25}$ represents a cycloalkyl group and $R_{23}$ and $R_{24}$ may be coupled together to form a ring,

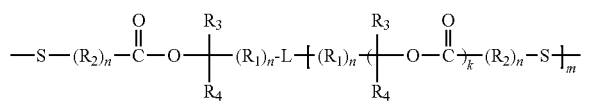

in the formula (1),

L represents, when m=1, a single bond or a divalent hydrocarbon group which may have a heteroatom and L represents, when m≧2, an m+1 valent hydrocarbon group which may have a heteroatom;

$R_1$ and $R_2$ each independently represents a group selected from the group consisting of alkylenes, cycloalkylenes, oxyalkylenes, arylenes, divalent thiazoline rings, divalent oxazoline rings, and divalent imidazoline rings or a divalent group formed using two or more thereof in combination;

$R_3$ and $R_4$ each independently represents an alkyl group, a cycloalkyl group, an alkenyl group, or an aryl group and $R_3$ and $R_4$ may be coupled with a carbon atom of $R_1$ or L adjacent thereto to form a ring structure;

n and k each independently stands for 0 or 1; and m stands for an integer of from 1 to 16.

[2] The positive resist composition as described above in [1], wherein the resin (A) is obtained by polymerization of monomers by using a compound represented by the following formula (2) and a polymerization initiator:

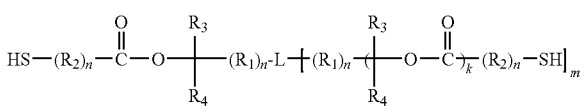

in the formula (2),

L represents, when m=1, a single bond or a divalent hydrocarbon group which may have a heteroatom and L represents, when m≧2, an m+1 valent hydrocarbon group which may have a heteroatom;

$R_1$ and $R_2$ each independently represents a group selected from the group consisting of alkylenes, cycloalkylenes, oxyalkylenes, arylenes, divalent thiazoline rings, divalent oxazoline rings, and divalent imidazoline rings or a divalent group formed using two or more thereof in combination;

$R_3$ and $R_4$ each independently represents an alkyl group, a cycloalkyl group, an alkenyl group, or an aryl group and $R_3$ and $R_4$ may be coupled with a carbon atom of $R_1$ or L adjacent thereto to form a ring structure;

n and k each independently stands for 0 or 1; and m stands for an integer of from 1 to 16.

[3] The positive resist composition as described above in [1] or [2], wherein the resin (A) further has a recurring unit containing a lactone group.

[4] The positive resist composition as described above in any of [1] to [3], wherein the resin (A) further has a recurring unit containing an alicyclic hydrocarbon structure substituted with a polar group.

[5] The positive resist composition as described above in any of [1] to [4], wherein the resin (A) further has a recurring unit containing an alkali soluble group.

[6] The positive resist composition as described above in any of [1] to [5], wherein the number of moles of the structure represented by the formula (1) is from 2.5 to 10 mol % based on the total number of moles of the structural units contained in the resin (A).

[7] A process for preparing a resin capable of increasing solubility in an alkaline developer under action of an acid, the process including:

polymerizing monomers by using a monomer having a first group selected from the groups represented by any of the following formulas (pI) to (pV), a monomer having a second group selected from the groups represented by any of the following formulas (pI) to (pV) but different from the first group, a compound represented by formula (2) and a polymerization initiator:

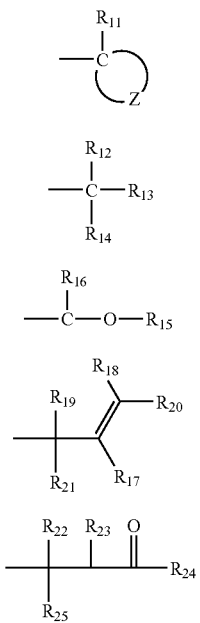

in the formulas (pI) to (pV), $R_{11}$ represents an alkyl group or a cycloalkyl group;

Z represents an atomic group necessary to form a cycloalkyl group with a carbon atom;

$R_{12}$ to $R_{16}$ each independently represents an alkyl group or a cycloalkyl group provided that at least one of $R_{12}$ to $R_{14}$ or either one of $R_{15}$ or $R_{16}$ represents a cycloalkyl group;

$R_{17}$ to $R_{21}$ each independently represents a hydrogen atom, an alkyl group, or a cycloalkyl group provided that at least one of $R_{17}$ to $R_{21}$ represents a cycloalkyl group and either one of $R_{19}$ or $R_{21}$ represents an alkyl or cycloalkyl group;

$R_{22}$ to $R_{25}$ each independently represents a hydrogen atom, an alkyl group, or a cycloalkyl group provided that at least one of $R_{22}$ to $R_{25}$ represents a cycloalkyl group and $R_{23}$ and $R_{24}$ may be coupled together to form a ring,

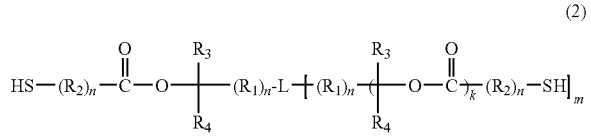

in the formula (2),

L represents, when m=1, a single bond or a divalent hydrocarbon group which may have a heteroatom and L represents, when m≧2, an m+1 valent hydrocarbon group which may have a heteroatom;

$R_1$ and $R_2$ each independently represents a group selected from the group consisting of alkylenes, cycloalkylenes, oxyalkylenes, arylenes, divalent thiazoline rings, divalent oxazoline rings, divalent imidazoline rings or a divalent group formed using two or more thereof in combination;

$R_3$ and $R_4$ each independently represents an alkyl group, a cycloalkyl group, an alkenyl group, or an aryl group and $R_3$ and $R_4$ may be coupled with a carbon atom of $R_1$, or L adjacent thereto to form a ring structure;

n and k each independently stands for 0 or 1; and m stands for an integer of from 1 to 16.

[8] A pattern forming method, comprising:

forming a film from the positive resist composition as described above in any of [1] to [6]; and exposing and developing the film.

ADVANTAGE OF THE INVENTION

The present invention can provide a positive resist composition to be used for the formation of fine patterns in semiconductor manufacture and the like, satisfactory in exposure latitude, focus latitude, and pattern collapse prevention at a higher level than that of conventional products, and having reduced development defects; and a pattern forming method using the positive resist composition.

BEST MODE FOR CARRYING OUT THE INVENTION

Components to be used in the present invention will next be described specifically.

It is to be noted that the term "group (atomic group)" as used herein herein encompasses that having a substituent as well as that having no substituent when it is denoted without specifying whether substituted or unsubstituted. For example, the term "alkyl group" encompasses not only an alkyl group having no substituent (unsubstituted alkyl group) but also an alkyl group having a substituent (substituted alkyl group).

[1] (A) Resin (Resin A) Capable of Increasing Solubility in an Alkaline Developer under the Action of an Acid.

The resin A is a resin capable of increasing solubility in an alkaline developer under the action of an acid.

The resin (A) contains a group (acid decomposable group) which decomposes under the action of an acid. The term "acid decomposable group" means a group obtained by substituting the hydrogen atom of an alkali soluble group such as —COOH group or —OH group with an acid eliminable group.

Examples of the acid eliminable group include —C($R_{36}$)($R_{37}$)($R_{38}$), —C($R_{36}$)($R_{37}$)(O$R_{39}$), and —C($R_{01}$)($R_{02}$)(O$R_{39}$).

In the above formulas, $R_{36}$ to $R_{39}$ each independently represents an alkyl group, a cycloalkyl group, an aryl group, an aralkyl group or an alkenyl group. $R_{36}$ and $R_{37}$ or $R_{36}$ and $R_{39}$ may be coupled together to form a ring.

$R_{01}$ and $R_{02}$ each independently represents a hydrogen atom, an alkyl group, a cycloalkyl group, an aryl group, an aralkyl group, or an alkenyl group.

The resin (A) of the present invention is characterized by that it has a recurring unit having a first group selected from groups represented by any of the following formulas (pI) to (pV) and a recurring unit having a second group selected from the groups represented by any of the following formulas (pI) to (pV) but different from the first group, and further has a structure represented by the following formula (1) in the main chain of the polymer.

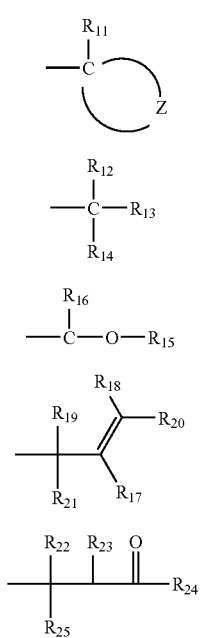

(pI)

(pII)

(pIII)

(pIV)

(pV)

In the formulas (pI) to (pV), $R_{11}$ represents an alkyl group or a cycloalkyl group, Z represents an atomic group necessary to form a cycloalkyl group with a carbon atom, $R_{12}$ to $R_{16}$ each independently represents an alkyl group or a cycloalkyl group with the proviso that at least one of $R_{12}$ to $R_{14}$ or either one of $R_{15}$ or $R_{16}$ represents a cycloalkyl group, $R_{17}$ to $R_{21}$ each independently represents a hydrogen atom, an alkyl group, or a cycloalkyl group with the proviso that at least one of $R_{17}$ to $R_{21}$ represents a cycloalkyl group and either one of $R_{19}$ or $R_{21}$ represents an alkyl or cycloalkyl group, and $R_{22}$ to $R_{25}$ each independently represents a hydrogen atom, an alkyl group, or a cycloalkyl group with the proviso that at least one of $R_{22}$ to $R_{25}$ represents a cycloalkyl group and $R_{23}$ and $R_{24}$ may be coupled together to form a ring.

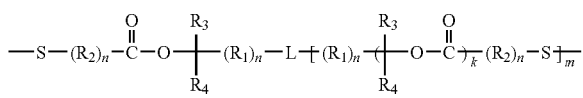

(1)

In the formula (1),

L represents, when m=1, a single bond or a divalent hydrocarbon group which may have a heteroatom and L represents, when m≧2, an m+1 valent hydrocarbon group which may have a heteroatom;

$R_1$ and $R_2$ each independently represents a group selected from the group consisting of alkylenes, cycloalkylenes, oxyalkylenes, arylenes, divalent thiazoline rings, divalent oxazoline rings, and divalent imidazoline rings or a divalent group formed by using two or more thereof in combination, $R_3$ and $R_4$ each independently represents an alkyl group, a cycloalkyl group, an alkenyl group, or an aryl group or $R_3$ and $R_4$ may be coupled with a carbon atom on $R_1$ or L adjacent thereto to form a ring structure, n and k each independently stands for 0 or 1, and m stands for an integer of from 1 to 16.

First, "L" will be described.

In the formula (1), L represents, when m=1, a single bond or a divalent hydrocarbon group which may have a heteroatom and L represents, when m≧2, an m+1 valent hydrocarbon group which may have a heteroatom.

The hydrocarbon group of L which may have a heteroatom includes, for example, following partial structural skeletons:

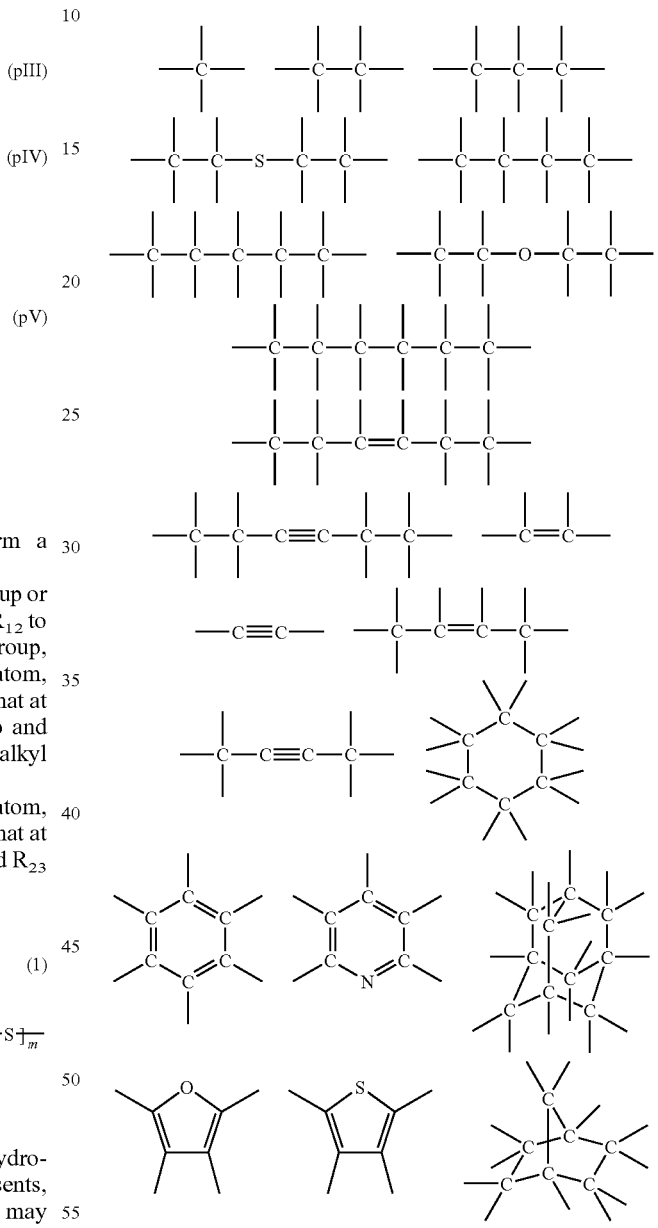

In addition, the divalent hydrocarbon group having a heteroatom includes, for example, a group containing the following partial structural skeletons:

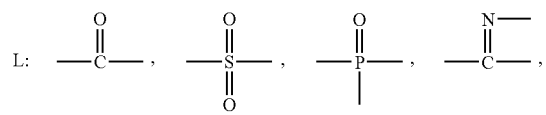

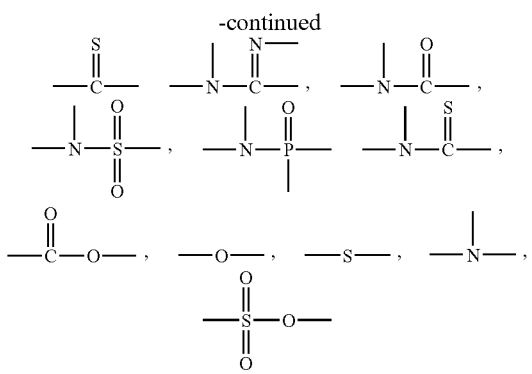

The bonds in the specific skeletal structure of L contain bonds on both sides of L in the formula (1) but they may be partially a hydrogen atom or the like.

Examples of a substituent that the hydrocarbon group as L may have include linear, branched or cyclic alkyl groups having from 1 to 6 carbon atoms which alkyl groups may have a group composed of one or more groups selected from the group consisting of a thiol group, a hydroxyl group, a carboxyl group, an acyl group having from 1 to 6 carbon atoms, a carboxyl group esterified with an alcohol having from 1 to 6 carbon atoms, a carboxyl group thioesterified with a thiol having 1 to 6 carbon atoms, a cyano group, an amino group, halogen, and a nitroxy group; a thiol group; a hydroxyl group; a carboxyl group; an acyl group having 1 to 6 carbon atoms; an alkoxy group having from 1 to 6 carbon atoms; a carboxyl group esterified with an alcohol having from 1 to 6 carbon atoms; a carboxyl group thioesterified with a thiol having from 1 to 6 carbon atoms; a cyano group; an amino group; halogen; or a nitroxy group. Examples of the heteroatom contained in the hydrocarbon group as L include a sulfur atom, an oxygen atom, a nitrogen atom, and a phosphorus atom. At this time, the number of the bonds from the heteroatom varies depending on the valence of the heteroatom.

Next, $R_1$ and $R_2$ will be described.

$R_1$ and $R_2$ each independently represents a group selected from the group consisting of alkylenes, cycloalkylenes, oxyalkylenes, arylenes, divalent thiazoline rings, divalent oxazoline rings, and divalent imidazoline rings or a divalent group formed using two or more thereof in combination.

Of these, alkylene, cycloalkylene, and arylene groups are preferred, with alkylene groups having from 1 to 10 carbon atoms, oxyalkylene groups having from 1 to 10 carbon atoms, cycloalkylene groups having from 3 to 10 carbon atoms, and arylene groups having from 6 to 10 carbon atoms being more preferred.

$R_3$ and $R_4$ each independently represents an alkyl group, a cycloalkyl group, an alkenyl group, or an aryl group and it has preferably 18 or less carbon atoms.

Of these, methyl group, ethyl group, propyl group, and isobutyl group are preferred. $R_3$ and $R_4$ may be coupled with the carbon atom of $R_1$ or L adjacent thereto to form a ring structure.

m stands for an integer of from 1 to 16, preferably from 1 to 3 because it can make the structure represented by the formula (1) bifunctional to tetrafunctional.

n and k each independently stands for 0 or 1. Since a ratio of main chain scission increases when the compound has many acid decomposable structures, k is preferably 1, meaning that the compound has two or more acid decomposable structures.

Specific examples of the structure represented by the formula (1) include structures represented by the formula (2), particularly, structures obtained by removing a hydrogen atom from a thiol group contained in the structure corresponding to the specific examples of the compounds represented by the formula (2) which will be described later.

Since the resin (A) has, in the main chain thereof, a structure represented by the above formula (1), it becomes easily soluble in an alkaline developer after decomposition with an acid and can reduce development defects.

The following are specific examples of the structural unit represented by the formula (1), but the present invention is not limited thereto.

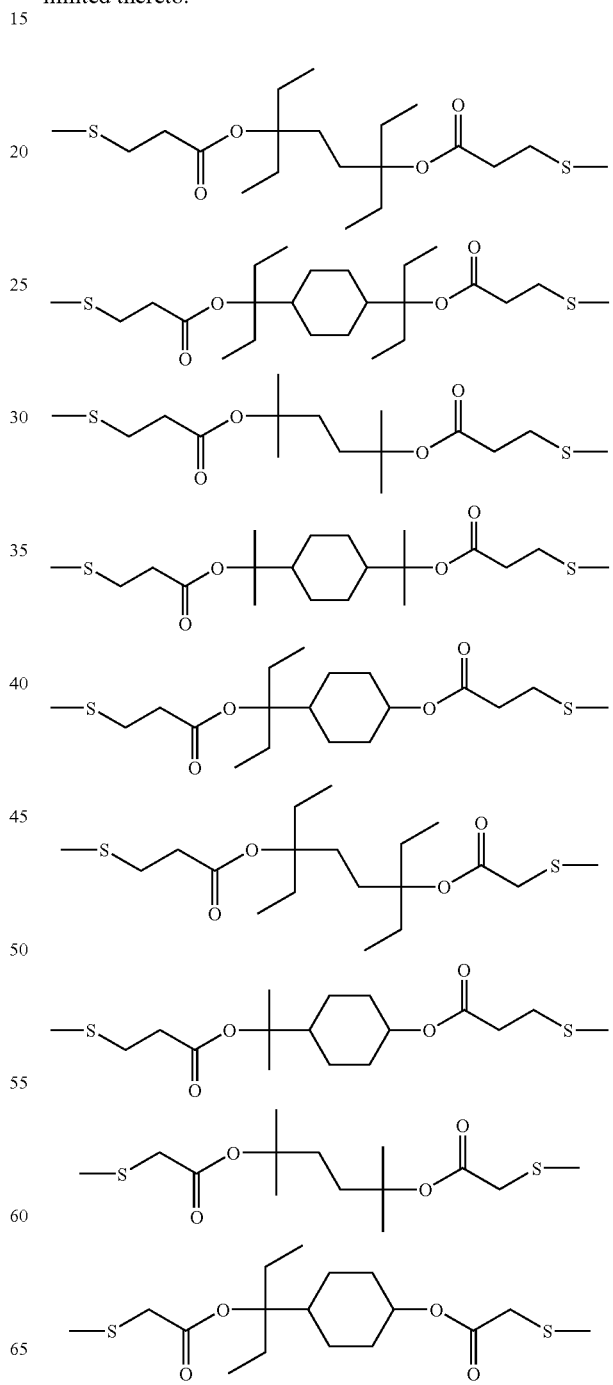

-continued
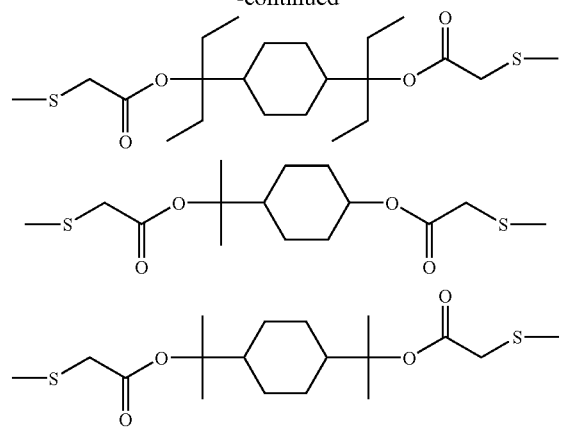
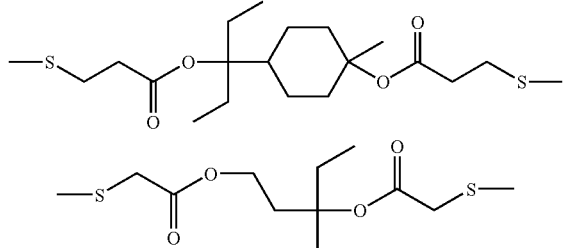
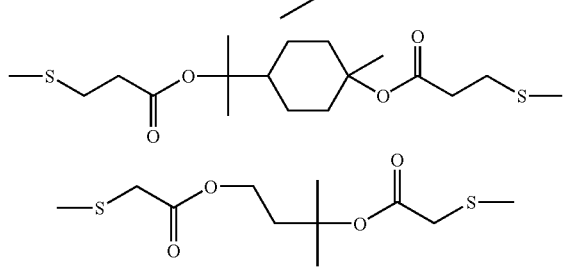
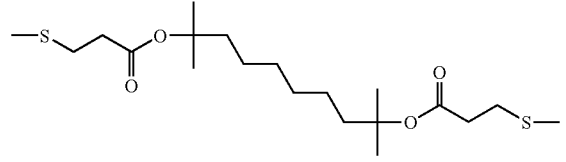
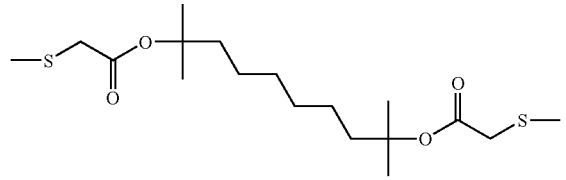
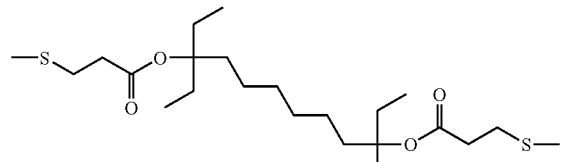
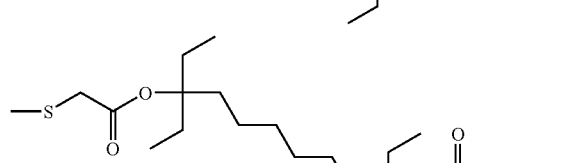
-continued
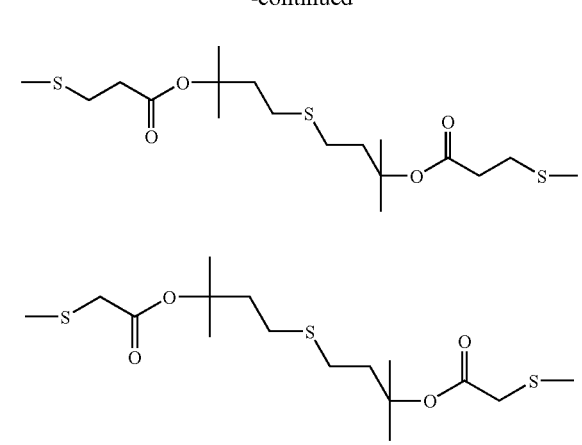
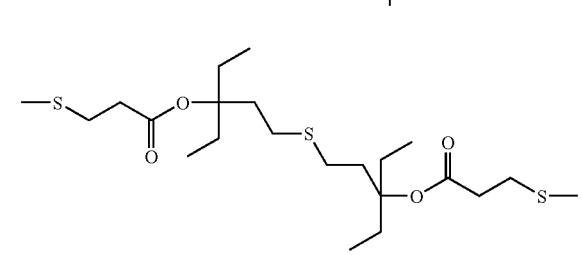
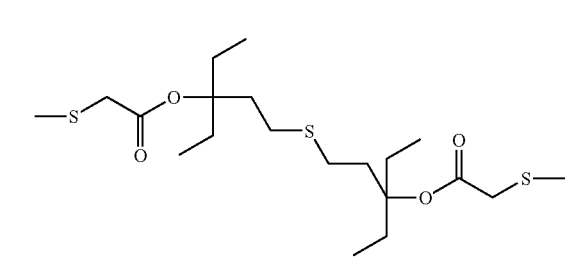
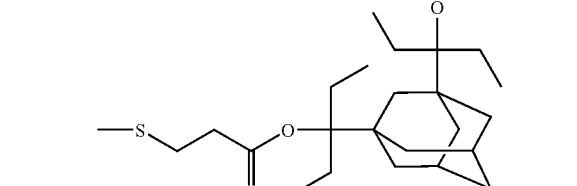
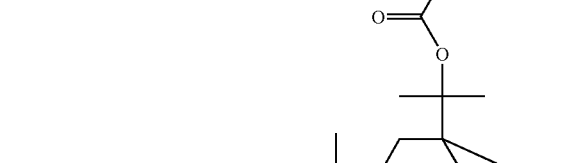
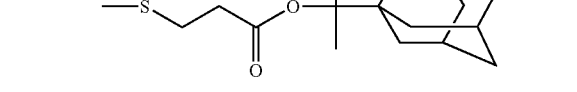

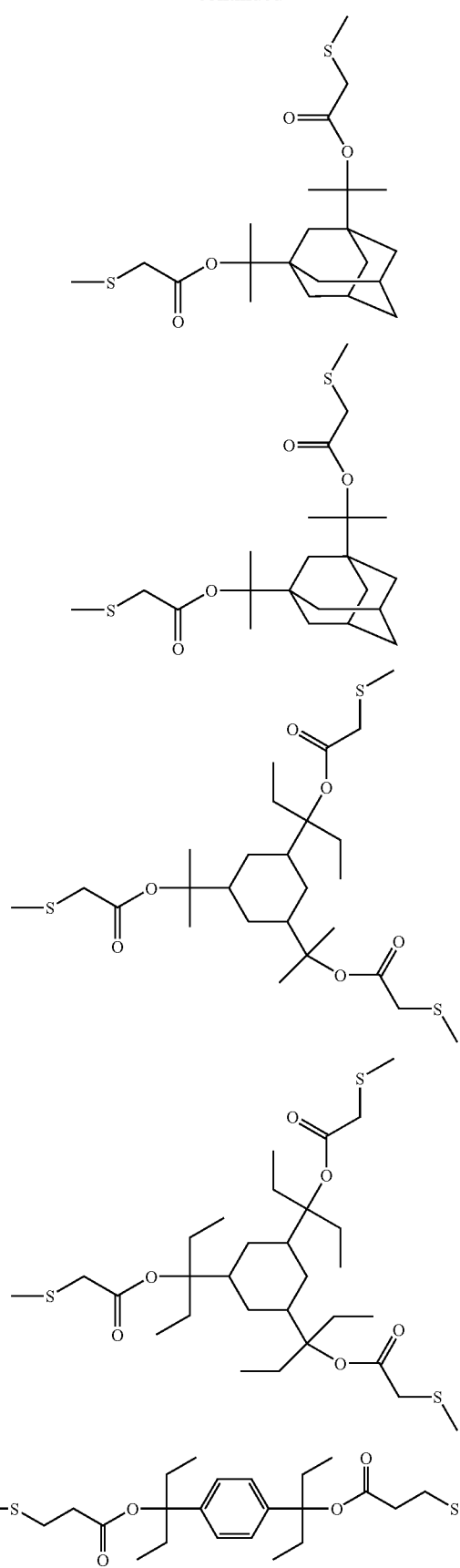
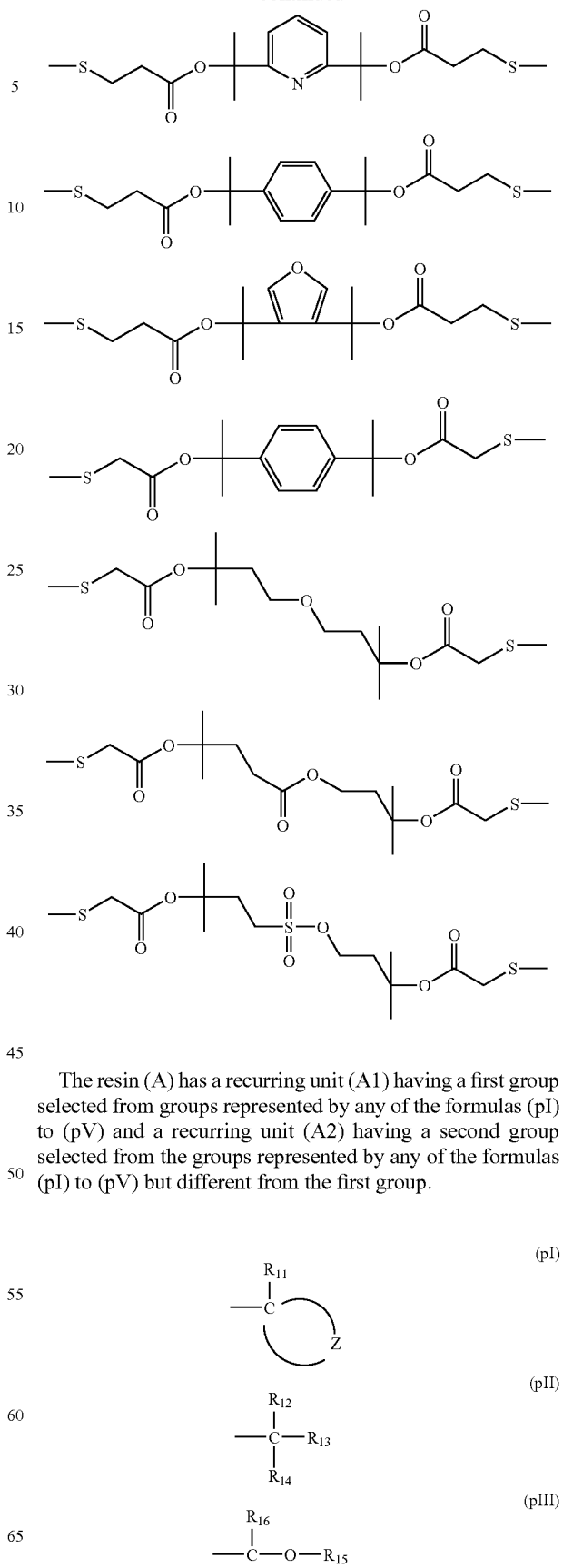
The resin (A) has a recurring unit (A1) having a first group selected from groups represented by any of the formulas (pI) to (pV) and a recurring unit (A2) having a second group selected from the groups represented by any of the formulas (pI) to (pV) but different from the first group.
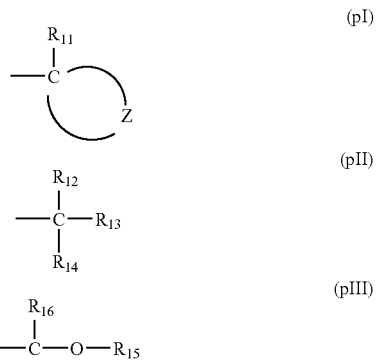

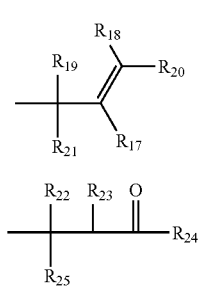
(pIV)

(pV)

In the formulas (pI) to (pV), $R_{11}$ represents an alkyl group or a cycloalkyl group, Z represents an atomic group necessary to form a cycloalkyl group with a carbon atom, $R_{12}$ to $R_{16}$ each independently represents an alkyl group or a cycloalkyl group with the proviso that at least one of $R_{12}$ to $R_{14}$ or either one of $R_{15}$ or $R_{16}$ represents a cycloalkyl group, $R_{17}$ to $R_{21}$ each independently represents a hydrogen atom, an alkyl group, or a cycloalkyl group with the proviso that at least one of $R_{17}$ to $R_{21}$ represents a cycloalkyl group and either one of $R_{19}$ or $R_{21}$ represents an alkyl group or a cycloalkyl group, and $R_{22}$ to $R_{25}$ each independently represents a hydrogen atom, an alkyl group, or a cycloalkyl group with the proviso that at least one of $R_{22}$ to $R_{25}$ represents a cycloalkyl group and $R_{23}$ and $R_{24}$ may be coupled together to form a ring.

In the formulas (pI) to (pV), the alkyl group represented by $R_{11}$ to $R_{25}$ is preferably a linear or branched alkyl group having from 1 to 8 carbon atoms such as methyl group, ethyl group, propyl group, n-butyl group, sec-butyl group or t-butyl group.

The cycloalkyl group represented by $R_{11}$ to $R_{25}$ or the cycloalkyl group formed by Z with a carbon atom may be either monocyclic or polycyclic. Specific examples include groups having a monocyclic, bicyclo, tricycle, or tetracyclo structure having 5 or more carbon atoms. These groups having such a structure preferably have from 6 to 30, especially preferably from 7 to 25 carbon atoms. The cycloalkyl groups may have, in the ring thereof, an unsaturated double bond. The cycloalkyl groups may have a substituent.

Preferred examples of the cycloalkyl groups include adamantyl group, noradamantyl group, decaline residue, tricyclodecanyl group, tetracyclododecanyl group, norbornyl group, cedrol group, cyclopentyl group, cyclohexyl group, cycloheptyl group, cyclooctyl group, cyclodecanyl group, and cyclododecanyl group. Of these, adamantyl group, norbornyl group, cyclohexyl group, cyclopentyl group, tetracyclododecanyl group, and tricyclodecanyl group are more preferred.

These alkyl and cycloalkyl groups may have a substituent. Examples of the substituent for the alkyl or cycloalkyl group include alkyl groups (having from 1 to 4 carbon atoms), halogen atoms, a hydroxyl group, alkoxy groups (having from 1 to 4 carbon atoms), a carboxyl group, and alkoxycarbonyl groups (having from 2 to 6 carbon atoms). The alkyl, alkoxy, and alkoxycarbonyl groups as described above may further have a substituent. Examples of the substituent which the alkyl group, alkoxy group, or alkoxycarbonyl group may further have include a hydroxyl group, halogen atoms, and alkoxy group.

In the resin (A), the first group selected from the groups represented by any of the formulas (pI) to (pV) is different from the second group selected from the groups represented by any of the formulas (pI) to (pV).

The term "the first group is different from the second group" means not only that they are represented by different formulas but also that they are represented by the same formula but have different substituents. The former one is preferred. For example, the first group and the second group are both represented by the formula (pI) but are different in $R_{11}$ or Z or they are both represented by the formula (pII) but different in at least one of $R_{12}$, $R_{13}$, and $R_{14}$. In this case, it is more preferred that one of the first and second groups is represented by the formula (pI) and the other one is represented by the formula (pII).

In the present invention, it is preferred that at least one of the first group and the second group has 10 or less carbon atoms and it is more preferred that each of the first group and the second group has 10 or less carbon atoms.

The combination of the first group selected from the groups represented by any of the formulas (pI) to (pV) and the second group selected from the groups represented by any of the formulas (pI) to (pV) is preferably a combination of the first and second groups, at least one of which is selected from (pI), (pII), and (pV), more preferably a combination of the first and second groups, both of which are selected from (pI), (pII), and (pV), still more preferably a combination of and the first and second groups, both of which are selected from (pI) and (pII).

The group represented by any of the formulas (pI) to (pV) can form an acid decomposable group by using it for protection of an alkali soluble group. As the alkali soluble group, various groups known in this technical field can be used.

Specific examples include structures obtained by substituting the hydrogen atom of a carboxylic acid group, a sulfonic acid group, a phenol group, or a thiol group with the group represented by any of the formulas (pI) to (pV). Of these, structures obtained by substituting the hydrogen atom of a carboxylic acid group or a sulfonic acid group with the group represented by any of the formulas (pI) to (pV) are preferred.

The recurring unit having the alkali soluble group protected with the group represented by any of the formulas (pI) to (pV) is preferably represented by the following formula (pA):

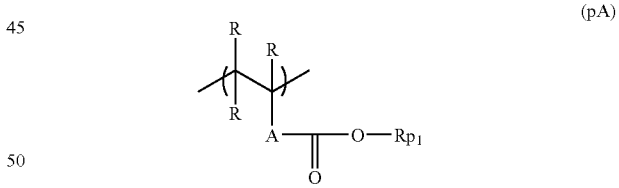

(pA)

In the formula (pA), R represents a hydrogen atom, a halogen atom, or a linear or branched alkyl group having from 1 to 4 carbon atoms. A plurality of Rs may be the same or different.

A represents one or a combination of two or more groups selected from the group consisting of a single bond, an alkylene group, an ether group, a thioether group, a carbonyl group, an ester group, an amide group, a sulfonamide group, a urethane group, and a urea group. A preferably represents a single bond.

$Rp_1$ represents a group represented by any of the formulas (pI) to (pV).

The recurring unit represented by the formula (pA) is most preferably that of 2-alkyl-2-adamantyl(meth)acrylate or dialkyl(1-adamantyl)methyl(meth)acrylate.

Next, the following are specific examples of the recurring unit represented by the formula (pA).
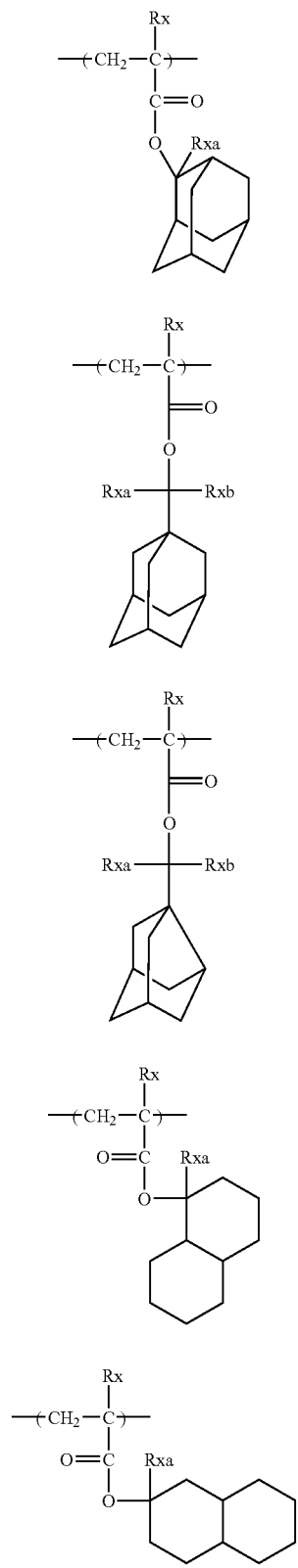
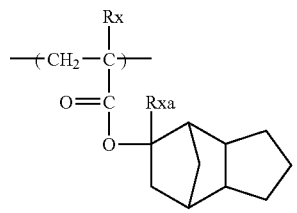
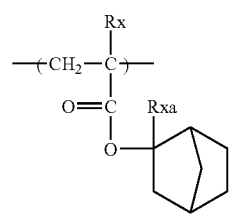
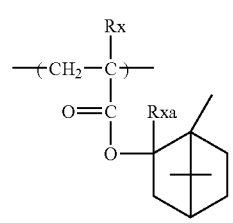
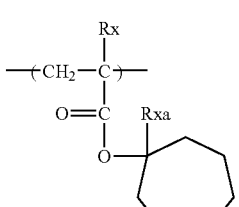
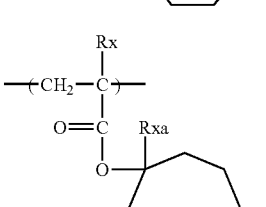
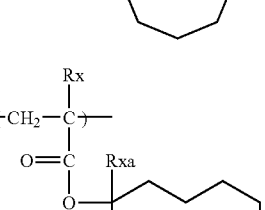
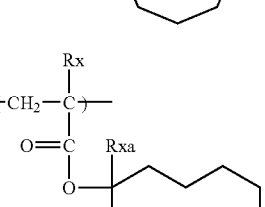

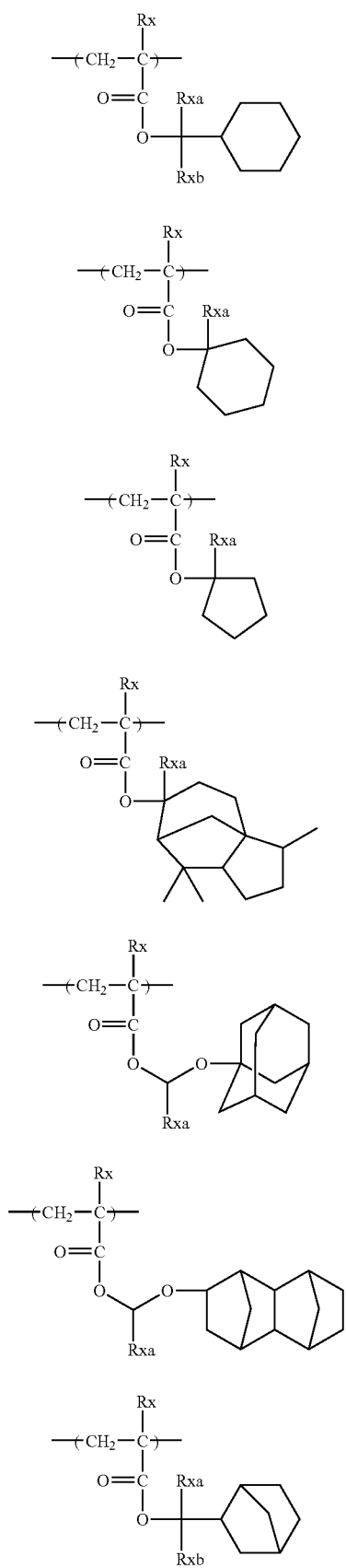
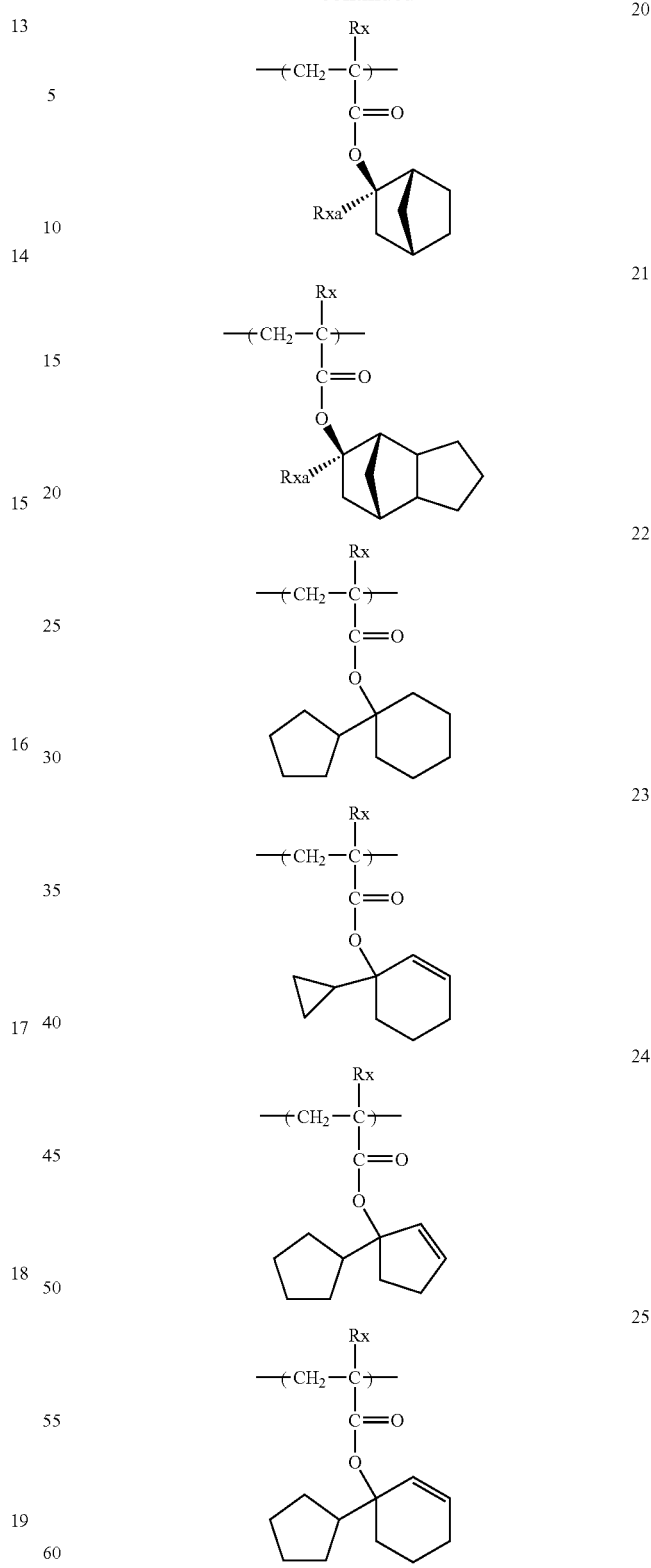
In each of the above structural formulas, $R_x$ represents H, $CH_3$, $CF_3$, or $CH_2OH$ and $R_{xa}$ and $R_{xb}$ each independently represents an alkyl group having from 1 to 4 carbon atoms.
The resin (A) of the present invention has preferably a lactone group. As the lactone group, any group is usable insofar as it has a lactone structure. A group having a 5- to 7-membered lactone structure is preferred and a 5- to 7-membered lactone structure condensed with another ring structure to form a bicyclo structure or a Spiro structure is preferred. The resin has more preferably a structural unit having a group with a lactone structure represented by any of the following formulas (LC1-1) to (LC1-16). The group having a lactone structure may be attached directly to the main chain. The lactone structures are preferably (LC1-1), (LC1-4), (LC1-5), (LC1-6), (LC1-13), and (LC1-14). Using a specific lactone structure reduces line edge roughness and development defects.

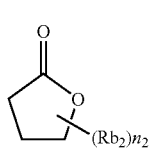
LC1-1

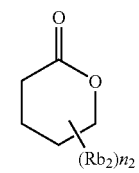
LC1-2

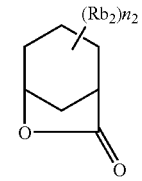
LC1-3

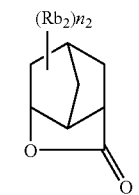
LC1-4

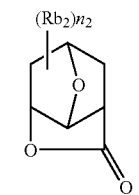
LC1-5

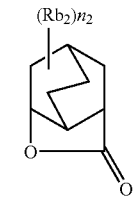
LC1-6

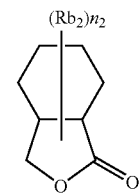
LC1-7

-continued

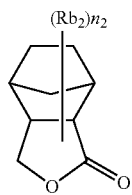
LC1-8

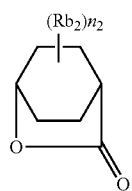
LC1-9

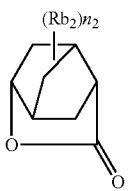
LC1-10

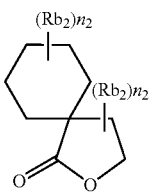
LC1-11

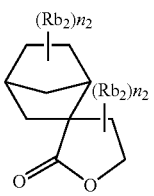
LC1-12

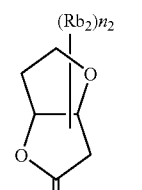
LC1-13

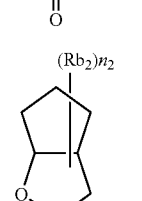
LC1-14

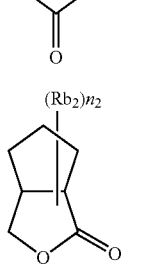
LC1-15

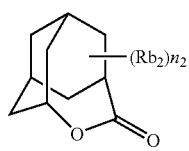

LC1-16

The lactone structure portion may or may not have a substituent ($Rb_2$). Preferred examples of the substituent ($Rb_2$) include alkyl groups having from 1 to 8 carbon atoms, cycloalkyl groups having from 4 to 7 carbon atoms, alkoxy groups having from 1 to 8 carbon atoms, alkoxycarbonyl groups having from 1 to 8 carbon atoms, a carboxyl group, halogen atoms, a hydroxyl group, a cyano group, and acid-decomposable groups. n2 stands for an integer of from 0 to 4. When n2 is an integer of 2 or greater, plural ($Rb_2$)s may be the same or different. Alternatively, these ($Rb_2$)s may be coupled together to form a ring Examples of the structural unit having group with a lactone structure represented by any of the formulas (LC1-1) to (LC1-16) include structural units represented by the formula (II-AB1) or (II-AB2) given below in which at least one of $R_{13}'$ to $R_{16}'$ has a group represented by any of the formulas (LC1-1) to (LC1-16) (for example, a group —$COOR_5$ having as $R_5$ a group represented by any of the formulas (LC1-1) to (LC1-16)) and structural units represented by the following formula (AI):

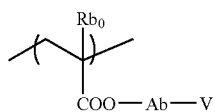

(AI)

In the formula (AI), $Rb_0$ represents a hydrogen atom, a halogen atom, or an alkyl group having from 1 to 4 carbon atoms. Preferred examples of a substituent which the alkyl group as $Rb_0$ may have include a hydroxyl group and halogen atoms. Examples of the halogen atom as $Rb_0$ include fluorine, chlorine, bromine, and iodine atoms. $Rb_0$ is preferably a hydrogen atom or a methyl group.

Ab represents a single bond, an alkylene group, a divalent linking group having a monocyclic or polycyclic alicyclic hydrocarbon structure, an ether group, an ester group, a carbonyl group, or a carboxyl group, or a divalent group having these groups in combination. Of these, a single bond and a linking group represented by -$Ab_1$-$CO_2$— are preferred. $Ab_1$ represents a linear or branched alkylene group or a monocyclic or polycyclic cycloalkylene group and it is preferably a methylene group, an ethylene group, a cyclohexyl group, an adamantyl group, or a norbornyl group.

V represents a group having a structure represented by any of the formulas (LC1-1) to (LC1-16).

The recurring unit having a lactone structure usually occurs as optical isomers and any optical isomer may be used. The optical isomers may be used either singly or as a mixture. When a single optical isomer is used mainly, the optical purity (ee) thereof is preferably 90 or greater, more preferably 95 or greater.

The following are specific examples of the structural unit having a group having a lactone structure, but the present invention is not limited to them.

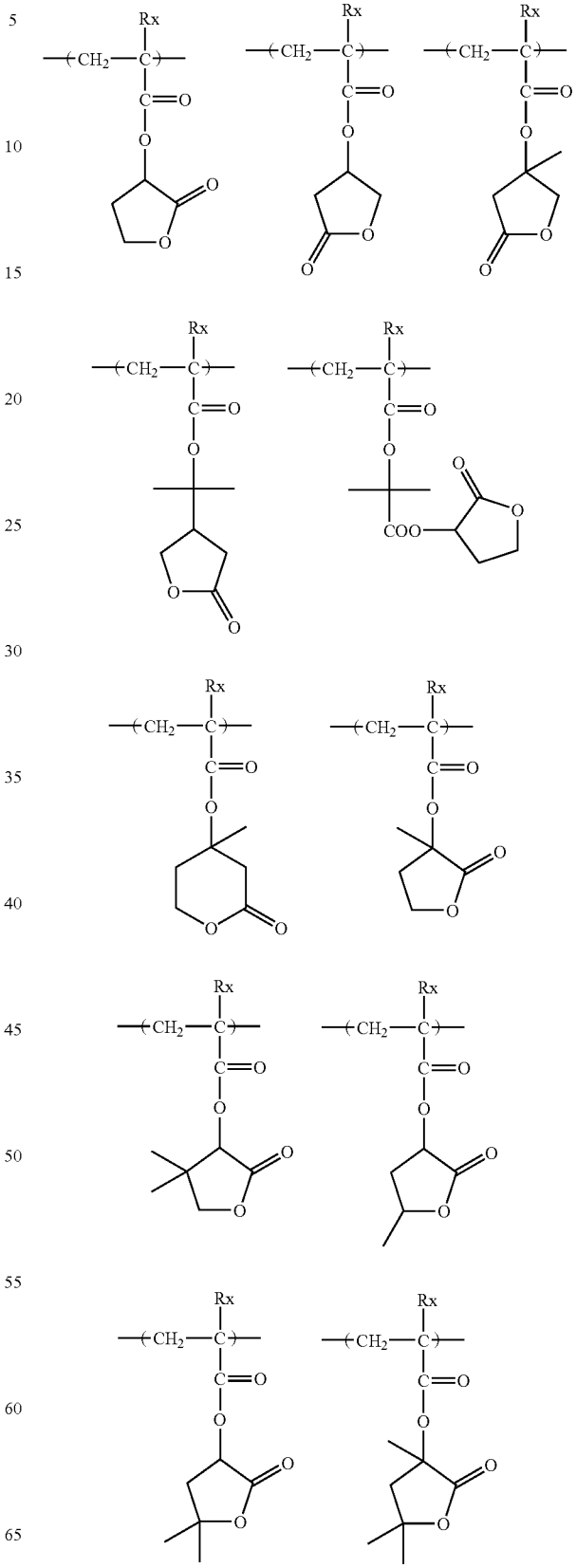

-continued
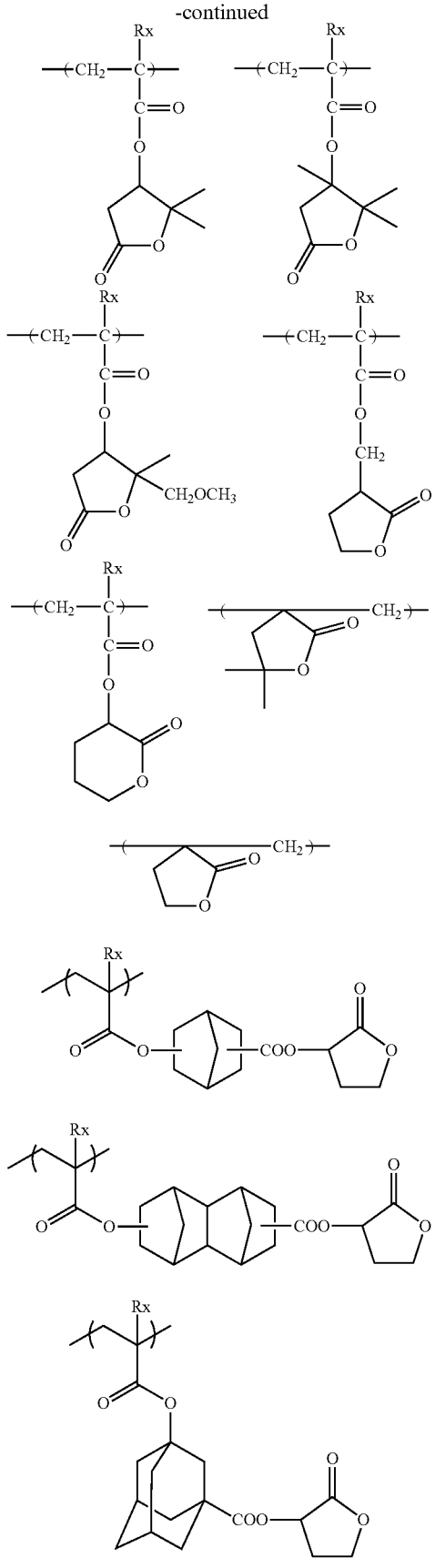
(wherein, R$_x$ represents H, CH$_3$, CH$_2$OH, or CF$_3$)
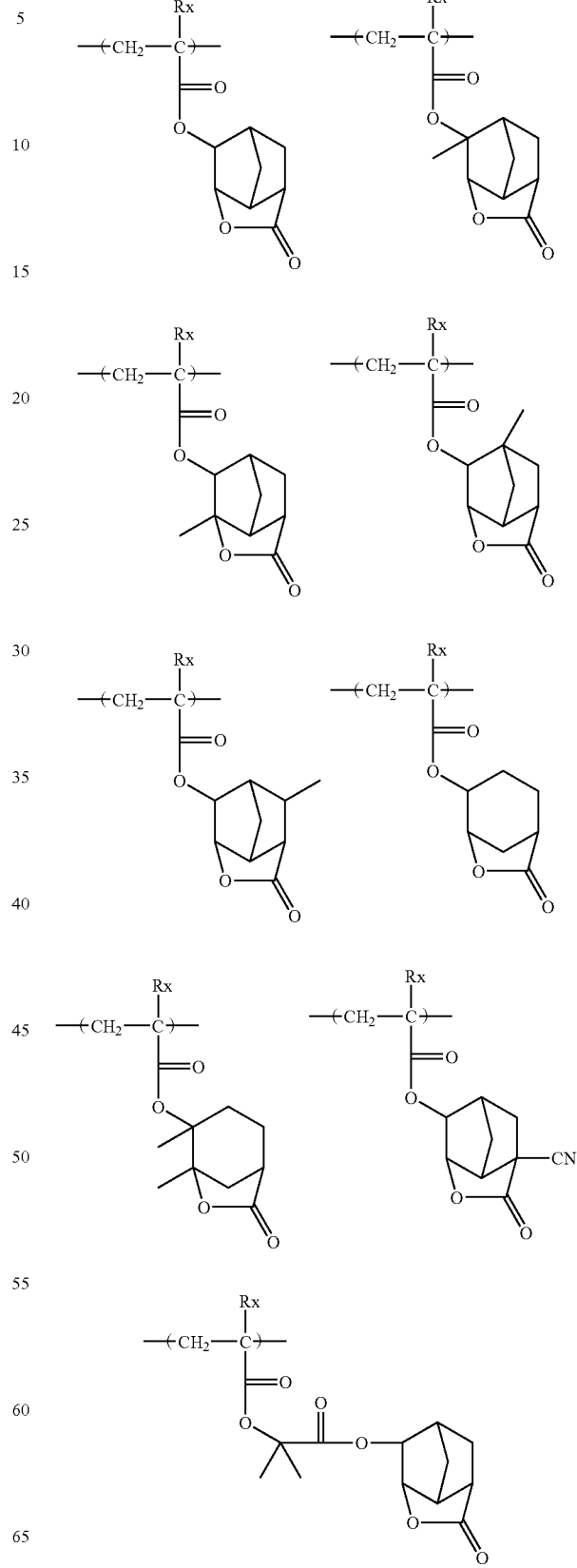

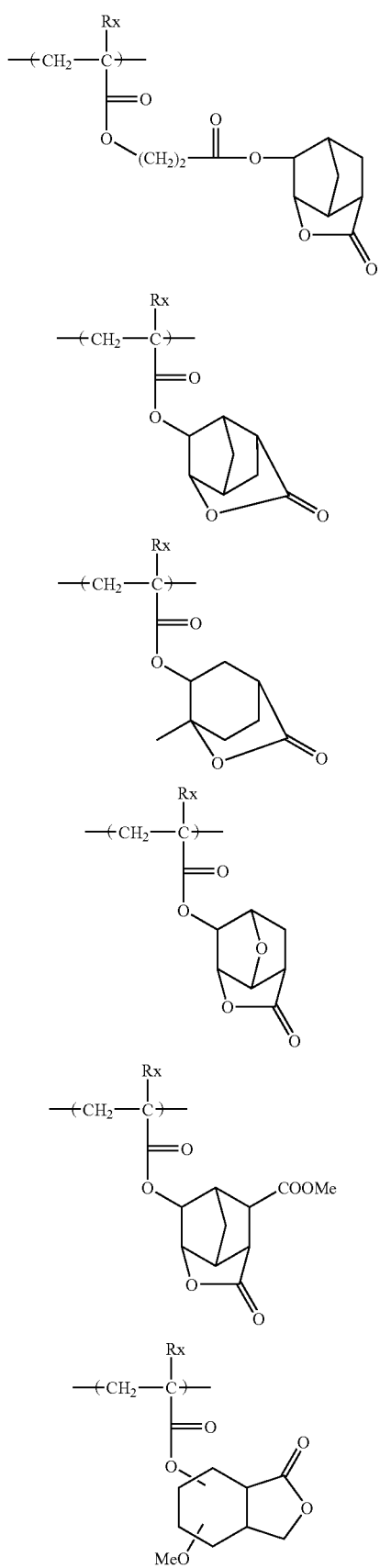
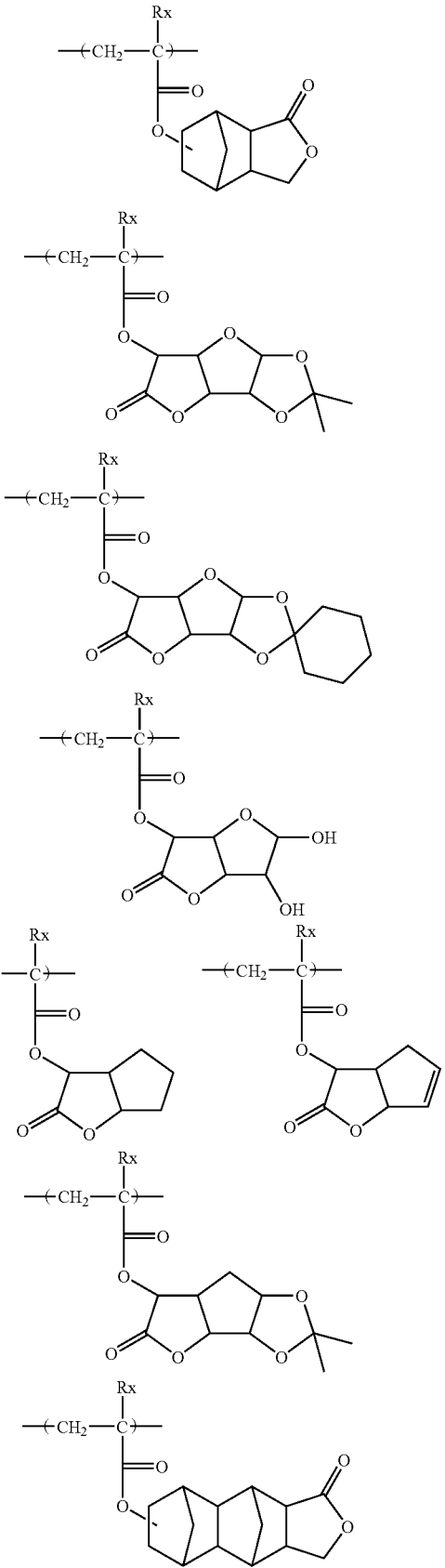

(wherein, $R_x$ represents H, $CH_3$, $CH_2OH$, or $CF_3$)
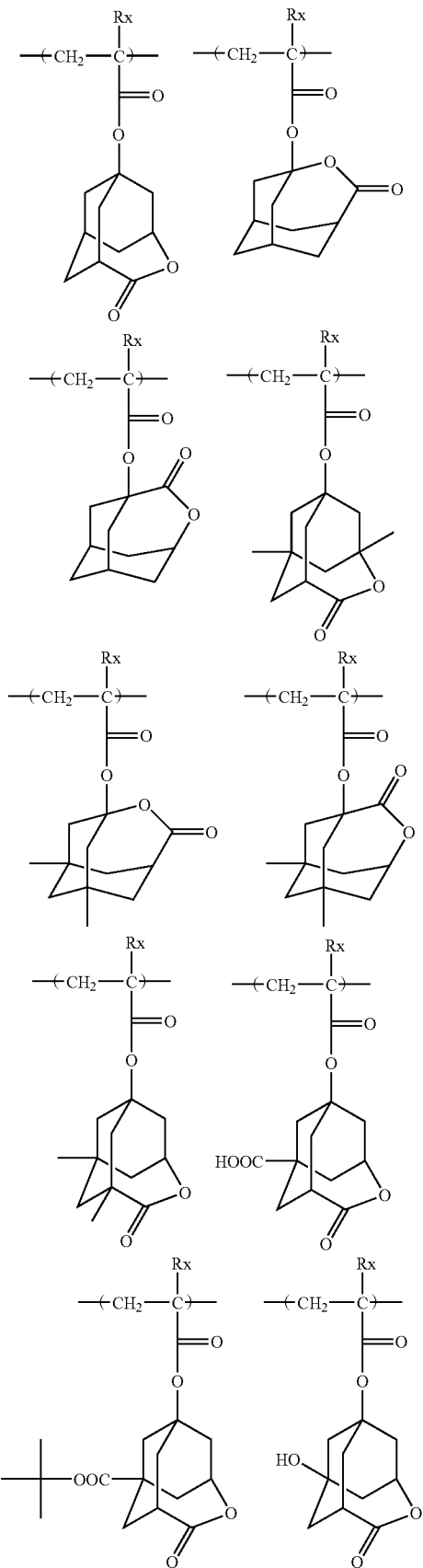
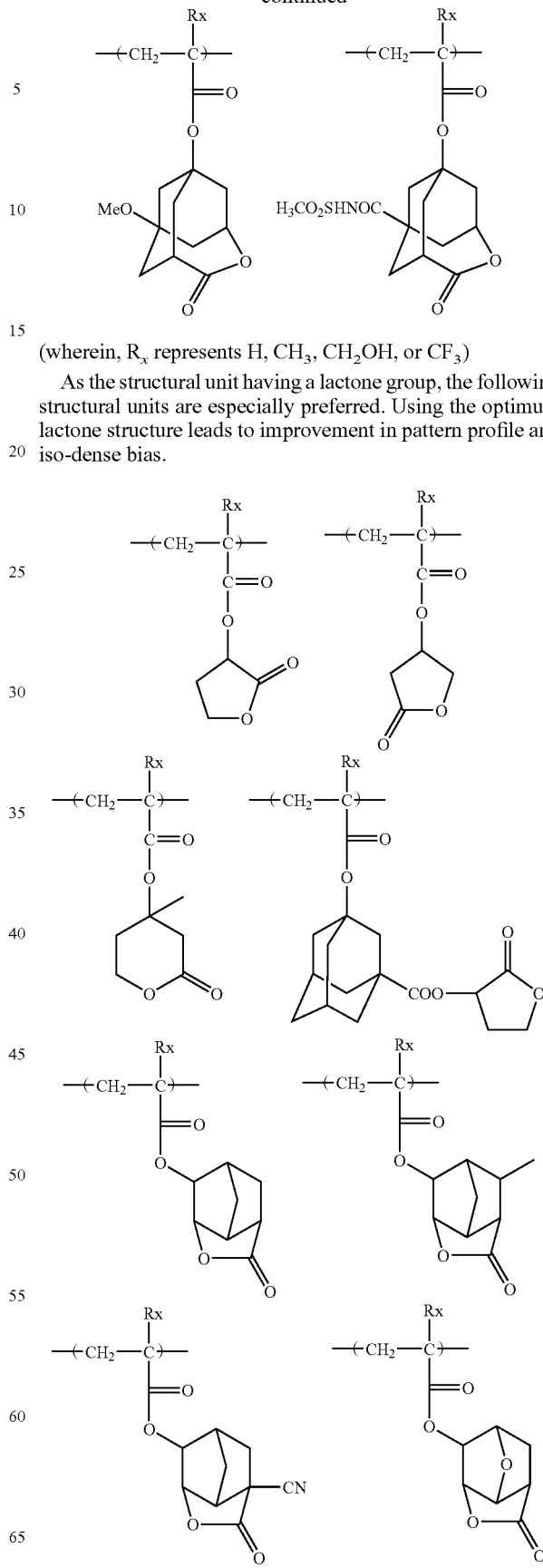
(wherein, $R_x$ represents H, $CH_3$, $CH_2OH$, or $CF_3$)
As the structural unit having a lactone group, the following structural units are especially preferred. Using the optimum lactone structure leads to improvement in pattern profile and iso-dense bias.

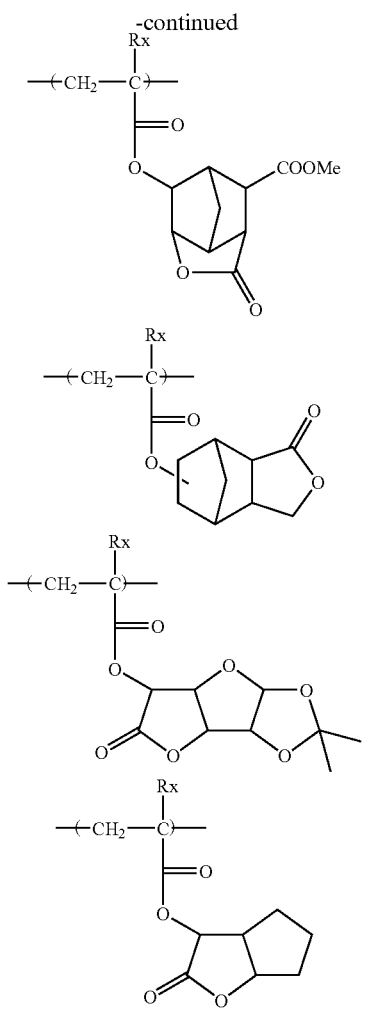

(wherein, $R_x$ represents H, $CH_3$, $CH_2OH$, or $CF_3$)

The resin (A) of the present invention preferably has a recurring unit having an alicyclic hydrocarbon structure substituted with a polar group. The resin having this unit has improved substrate adhesion and affinity with a developer. Preferred examples of the polar group include a hydroxyl group and a cyano group.

The alicyclic hydrocarbon structure substituted with a polar group is, for example, a structure represented by the following formulas (VIIa) or (VIIb).

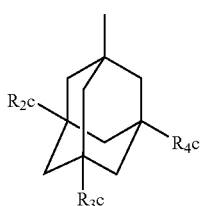
(VIIa)

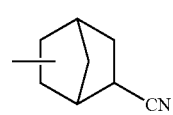
(VIIb)

In the formula (VIIa), $R_2c$ to $R_4c$ each independently represents a hydrogen atom, a hydroxyl group, or a cyano group, with the proviso that at least one of $R_2c$ to $R_4c$ represents a hydroxyl group or a cyano group. It is preferred that one or two of $R_2c$ to $R_4c$ are hydroxyl groups and the remaining one is a hydrogen atom. It is more preferred that two of $R_2c$ to $R_4c$ are hydroxyl groups and the remaining one is a hydrogen atom.

The group represented by the formula (VIIa) is preferably a dihydroxy form or a monohydroxy form, more preferably a dihydroxy form.

Examples of the recurring unit having a group represented by either one of the formula (VIIa) or (VIIb) include recurring units represented by the following formula (II-AB1) or (II-AB2) having, as at least one of $R_{13}'$ to $R_{16}'$, a group represented by the foregoing formula (VIIa) or (VIIb) (for example, —$COOR_5$ having, as $R_5$, a group represented by the formula (VIIa) or (VIIb)), and recurring units represented by the following formulas (AIIa) or (AIIb).

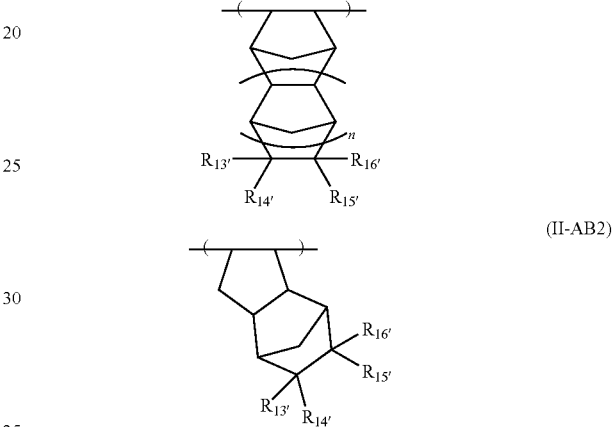

In the formulas (II-AB1) and (II-AB2), $R_{13}'$ to $R_{16}'$ each independently represents a hydrogen atom, a halogen atom, a cyano group, —COOH, —$COOR_5$, a group being decomposed by the action of an acid, —C(=O)—X-A'-$R_{17}'$, an alkyl group, or a cycloalkyl group and at least two of $R_{13}'$ to $R_{16}'$ may be coupled together to form a ring.

In the above formula, $R_5$ represents an alkyl group, a cycloalkyl group, or a group having a lactone structure, X represents an oxygen atom, a sulfur atom, —NH—, —$NHSO_2$—, or —$NHSO_2NH$—, A' represents a single bond or a divalent linking group, $R_{17}'$ represents —COOH, —$COOR_5$, —CN, a hydroxyl group, an alkoxy group, —CO—NH—$R_6$, —CO—NH—$SO_2$—$R_6$, or a group having a lactone structure, $R_6$ represents an alkyl group or a cycloalkyl group, and n stands for 0 or 1.

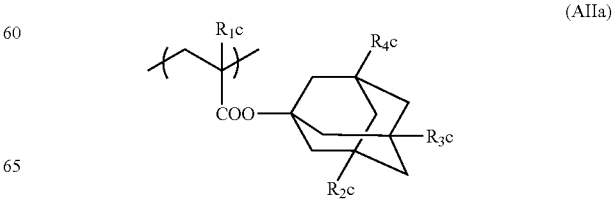
(AIIa)

-continued

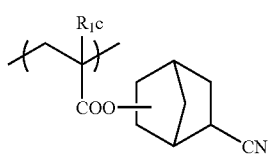
(AIIb)

In the formulas (AIIa) and (AIIb), $R_1c$ represents a hydrogen atom, a methyl group, a trifluoromethyl group, or a hydroxymethyl group, and $R_2c$ to $R_4c$ have the same meanings as $R_2c$ to $R_4c$ in the formula (VIIa).

The following are specific examples of the recurring unit having an alicyclic hydrocarbon structure substituted with a polar group and represented by the formula (AIIa) or (AIIb), but the present invention is not limited thereto.

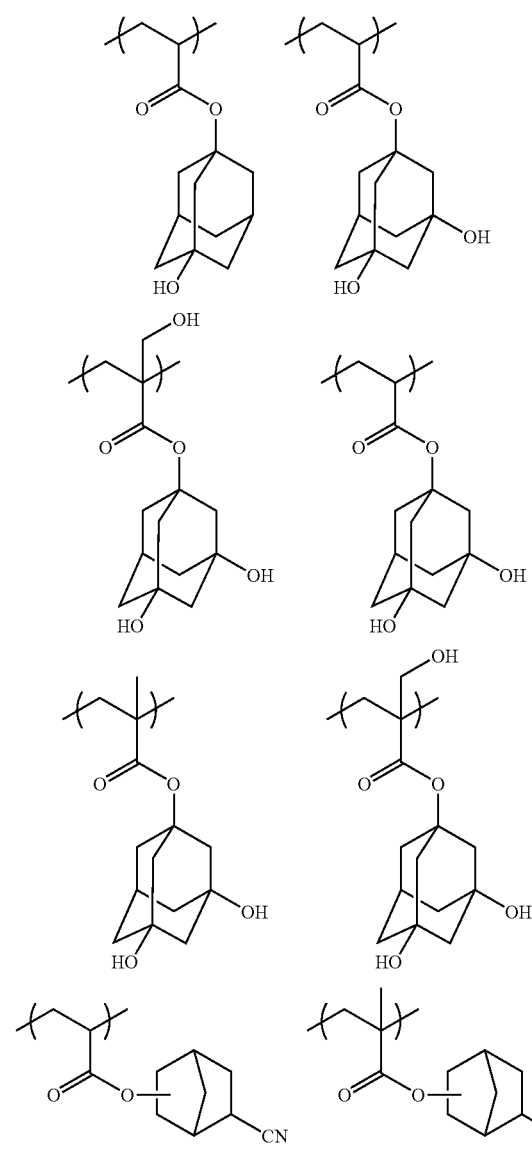

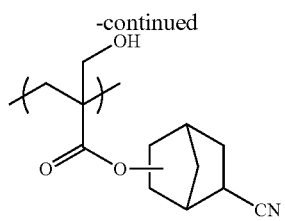

The resin (A) may have a recurring unit represented by the following formula (VIII):

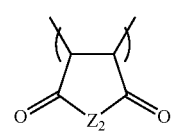
(VIII)

In the formula (VIII), $Z_2$ represents —O— or —N($R_{41}$)—, wherein $R_{41}$ represents a hydrogen atom, a hydroxyl group, an alkyl group, or —OSO$_2$—$R_{42}$, in which $R_{42}$ represents an alkyl group, a cycloalkyl group, or a camphor residue. The alkyl group as $R_{41}$ or $R_{42}$ may be substituted with a halogen atom (preferably a fluorine atom) or the like.

The following are specific examples of the recurring unit represented by the formula (VIII), but the present invention is not limited thereto.

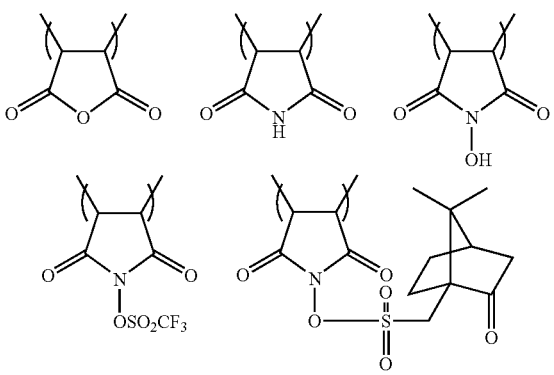

The resin (A) has preferably a recurring unit having an alkali soluble group, more preferably a recurring unit having a carboxyl group. The resin having such a recurring unit has enhanced resolution when used for contact holes. As the recurring unit having a carboxyl group, recurring units in which a carboxyl group is attached directly to the main chain of a resin, for example, recurring units derived from acrylic acid or methacrylic acid; and recurring units in which a carboxyl group is attached to the main chain of a resin via a linking group are preferred. The linking group may have a monocyclic or polycyclic hydrocarbon structure. The recurring unit derived from acrylic acid or methacrylic acid is most preferred.

The resin (A) may have a recurring unit having one to three groups represented by the following formula (F1). The resin having such a unit has improved line edge roughness performance.

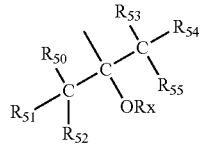

(F1)

In the formula (F1), $R_{50}$ to $R_{55}$ each independently represents a hydrogen atom, a fluorine atom, or an alkyl group, with the proviso that at least one of $R_{50}$ to $R_{55}$ represents a fluorine atom or an alkyl group in which at least one hydrogen is substituted with a fluorine atom, and $R_x$ represents a hydrogen atom or an organic group (preferably, an acid-decomposable protecting group, an alkyl group, a cycloalkyl group, an acyl group, or an alkoxycarbonyl group).

The alkyl group represented by $R_{50}$ to $R_{55}$ may be substituted with a halogen atom such as a fluorine atom, a cyano group, or the like. Preferred examples include alkyl groups having from 1 to 3 carbon atoms such as methyl group and trifluoromethyl group.

It is preferred that $R_{50}$ to $R_{55}$ each represents a fluorine atom.

Preferred examples of the organic group represented by $R_x$ include acid decomposable protecting groups and alkyl groups, cycloalkyl groups, acyl groups, alkylcarbonyl groups, alkoxycarbonyl groups, alkoxycarbonylmethyl groups, alkoxymethyl groups, and 1-alkoxyethyl groups, each of which may have a substituent.

The recurring unit having a group represented by the formula (F1) is preferably a recurring unit represented by the following formula (F2):

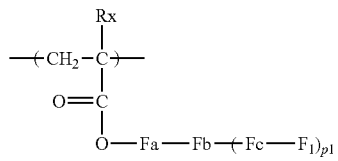

(F2)

In the formula (F2), $R_x$ represents a hydrogen atom, a halogen atom, or an alkyl group having from 1 to 4 carbon atoms. Preferred examples of the substituent which the alkyl group as $R_x$ may have include a hydroxyl group and halogen atoms.

$F_a$ represents a single bond or a linear or branched alkylene group, with a single bond being preferred.

$F_b$ represents a monocyclic or polycyclic hydrocarbon group.

$F_c$ represents a single bond or a linear or branched alkylene group, with a single bond or a methylene group being preferred.

$F_1$ represents a group represented by the formula (F1).

$p_1$ stands for from 1 to 3.

The cyclic hydrocarbon group in $F_b$ is preferably a cyclopentyl group, a cyclohexyl group, or a norbonyl group.

The following are specific examples of the recurring unit having the structure of the formula (F1).

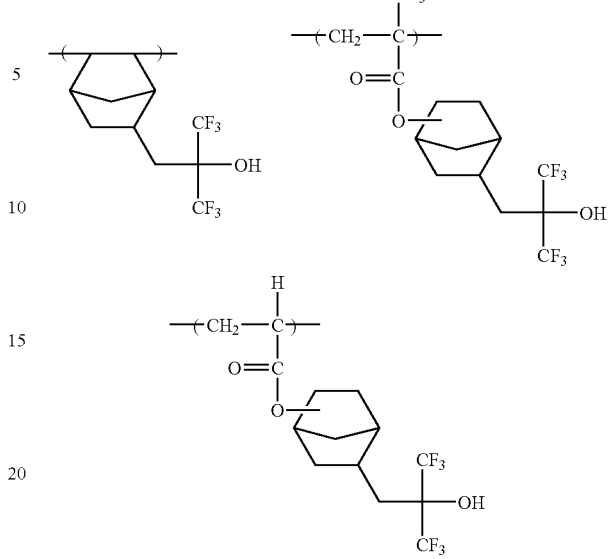

The resin (A) may have, in addition to the recurring structural units as described above, various recurring structural units in order to control resistance to dry etching, suitability for standard developer solutions, adhesion to a substrate, resist profile, and other characteristics generally required for resists such as resolution, heat resistance and sensitivity.

Examples of such recurring structural units include, but not limited to, recurring structural units corresponding to the following monomers.

Incorporation of such a recurring unit enables fine tuning of characteristics required for the resin (A), in particular, the following ones:

(1) solubility in a coating solvent,
(2) film-forming properties (glass transition point),
(3) alkali developability,
(4) thinning of film (hydrophilic-hydrophobic balance, selection of an alkali soluble group),
(5) adhesion of an un-exposed area to a substrate,
(6) dry etching resistance, and the like.

Examples of such monomers include compounds having one addition-polymerizable unsaturated bond selected from acrylic acid esters, methacrylic acid esters, acrylamides, methacrylamides, allyl compounds, vinyl ethers, vinyl esters and the like.

Furthermore, addition polymerizable unsaturated compounds may be copolymerized insofar as they are copolymerizable with the monomers corresponding to the above-described various recurring units.

In the resin (A), a molar ratio of the recurring structural units may be determined as needed so as to control the dry etching resistance, suitability for standard developer solutions, adhesion to a substrate, and resist profile, and moreover, generally required performances for resists resolution, heat resistance, and sensitivity.

The total amount of the recurring units (A1) and (A2) having the group represented by any of the formulas (pI) to (pV) is preferably from 25 to 70 mol %, more preferably from 35 to 65 mol %, still more preferably from 40 to 60 mol % relative to the number of moles of all the units constituting the resin (A).

A ratio (molar ratio) of the recurring unit (A1) having the first group to the recurring unit (A2) having the second group is preferably from 10:90 to 90:10, more preferably from 15:85 to 85:15, still more preferably from 20:80 to 80:20.

The content of the structure represented by the formula (1) is preferably from 2.5 to 10 mol %, more preferably from 3 to 9 mol %, still more preferably from 3.5 to 8.5 mol %, especially preferably from 4 to 8 mol % relative to the total number of moles of the constituting units contained in the resin (A).

The term "units constituting the resin" means recurring units derived from monomers such as monomer having a group represented by any of the formulas (pI) to (pV) or units in the resin corresponding to one compound serving as a polymerization raw material such as the compound represented by the formula (2).

The molecular weight of the resin (A) can be controlled to fall within a preferred range by the content of the structure represented by the formula (1).

When the content of the structure represented by the formula (1) in the resin (A) is greater, the resulting resin (A) has a smaller molecular weight. When the content of the structure represented by the formula (1) is smaller, the resulting resin (A) has a greater molecular weight.

The content of a recurring structural unit based on a monomer of the additional copolymerizable component in the resin can also be determined as needed, depending on the desired resist performance. In general, the content of it is preferably 99 mol % or less, more preferably 90 mol % or less, still more preferably 80 mol % or less based on the total number of moles of the recurring structural units having the group represented by any of the formulas (pI) to (pV).

The content of the recurring unit containing a lactone structure is preferably from 15 to 60 mol %, more preferably from 20 to 50 mol %, still more preferably from 30 to 50 mol % based on the number of moles of all the units constituting the resin (A).

The content of the recurring unit containing an alicyclic hydrocarbon structure substituted with a polar group is preferably from 1 to 40 mol %, more preferably from 5 to 30 mol %, still more preferably from 10 to 20 mol % based on the number of moles of all the units constituting the resin (A).

The content of the recurring unit containing an alkali soluble resin is preferably from 1 to 20 mol %, more preferably from 5 to 15 mol %, still more preferably from 7 to 10 mol % based on the number of moles of all the units constituting the resin (A).

When the composition of the present invention is used for ArF exposure, the resin (A) is preferably free from an aromatic group from the standpoint of transparency to an ArF light.

The resin (A) to be used in the present invention preferably is a resin whose recurring units are composed only of (meth)acrylate recurring units. In this case, although all the recurring units may be composed of methacrylate ones, acrylate ones, or methacrylate/acrylate mixtures, the acrylate recurring units preferably account for 50 mol % or less of all the recurring units.

The resin (A) to be used in the present invention can be synthesized in a manner known per se in the art (for example, radical polymerization).

Described specifically, the resin (A) is available by polymerizing monomers using the monomer having a first group selected from the groups represented by any of the formulas (pI) to (pV), the monomer having a second group selected from the groups represented by any of the formulas (pI) to (pV) but different from the first group, the compound represented by the formula (2) and a polymerization initiator.

Examples of the typical synthesis process include batch polymerization in which polymerization is performed by dissolving the monomer species, the compound represented by the formula (2), and the polymerization initiator in a solvent and heating the resulting solution; and dropwise addition polymerization in which a solution of the monomer species, the compound represented by the formula (2), and the polymerization initiator is added dropwise to a heated solvent over 1 to 10 hours. The dropwise addition polymerization is preferred.

Compounds represented by the formula (2) to be used for synthesis of the resin (A) which characterizes the present invention will next be described in detail.

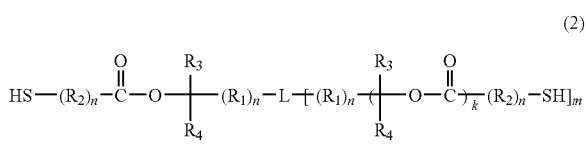

(2)

In the formula (2),

L represents, when m=1, a single bond or a divalent hydrocarbon group which may have a heteroatom and L represents, when m≧2, an m+1 valent hydrocarbon group which may have a heteroatom, $R_1$ and $R_2$ each independently represents a group selected from the group consisting of alkylene groups, cycloalkylene groups, oxyalkylene groups, arylene groups, divalent thiazoline rings, divalent oxazoline rings, and divalent imidazoline rings or a divalent group formed using two or more thereof in combination, $R_3$ and $R_4$ each independently represents an alkyl group, a cycloalkyl group, an alkenyl group, or an aryl group or $R_3$ and $R_4$ may be coupled with carbon atoms of $R_1$ or L adjacent thereto to form a ring structure, n and k each independently stands for 0 or 1, and m stands for an integer of from 1 to 16.

The L, m, $R_1$ to $R_4$, n and k in the formula (2) have the same meanings as described above in the formula (1). The compound represented by the formula (2) and suited for use in the synthesis of the resin (A) of the present invention can be obtained by the process as described in Japanese Patent Laid-Open No. 2006-91762 or WO2005/085301. The following are specific compound examples (S1) to (S38), but the present invention is not limited to them.

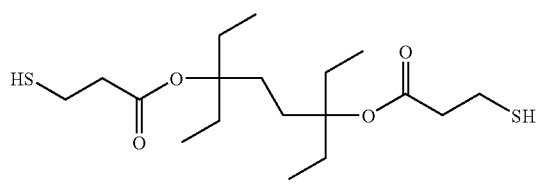

(S1)

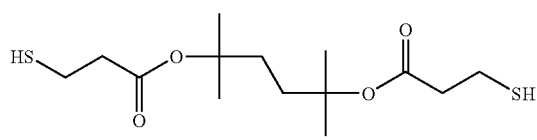

(S2)

(S3) 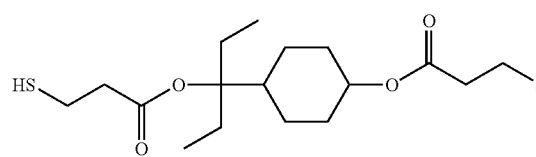
(S4) 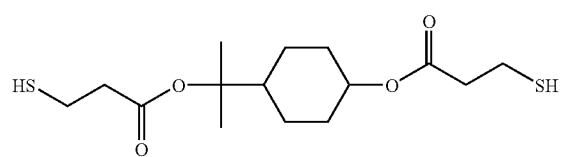
(S5) 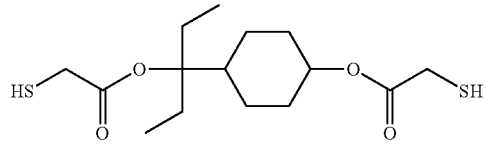
(S6) 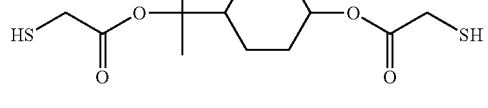
(S7) 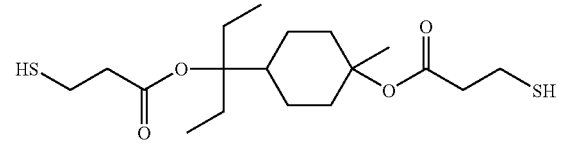
(S8) 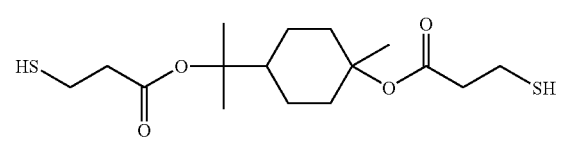
(S9) 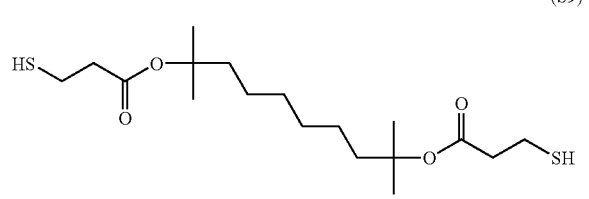
(S10) 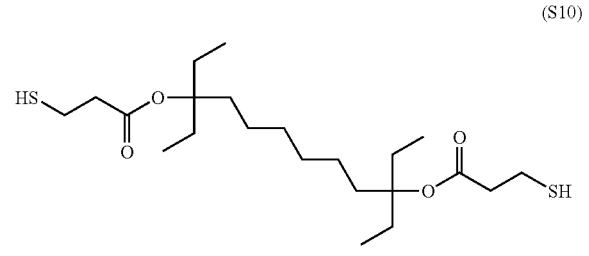
(S11) 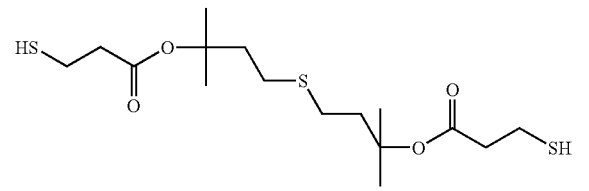
(S12) 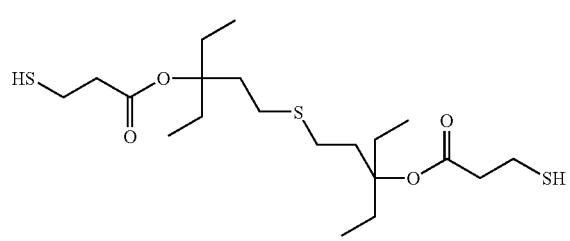
(S13) 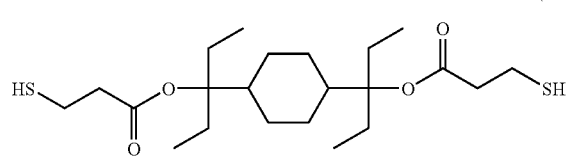
(S14) 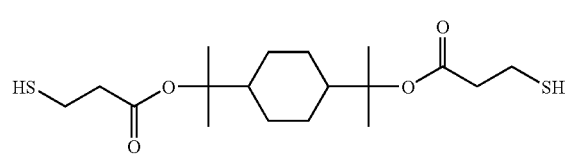
(S15) 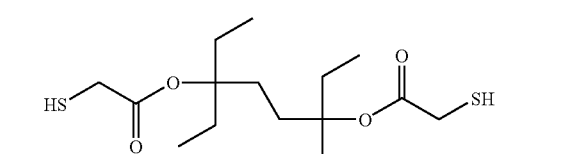
(S16) 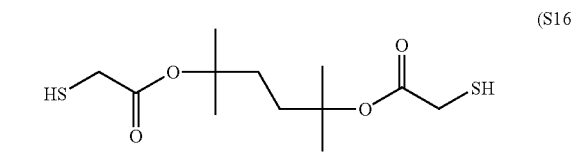
(S17) 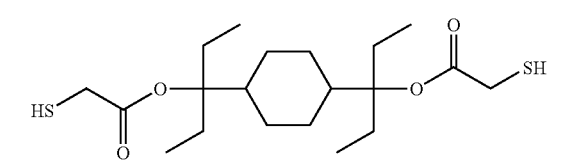
(S18) 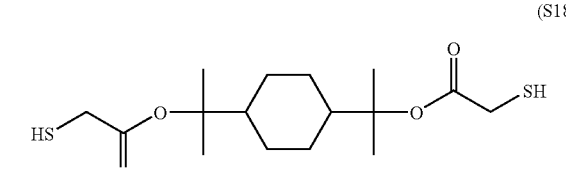
(S19) 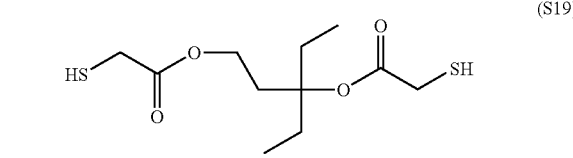
(S20) 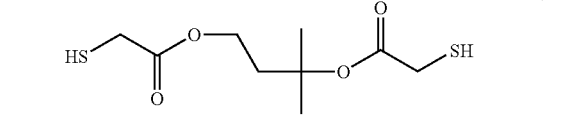

(S21) 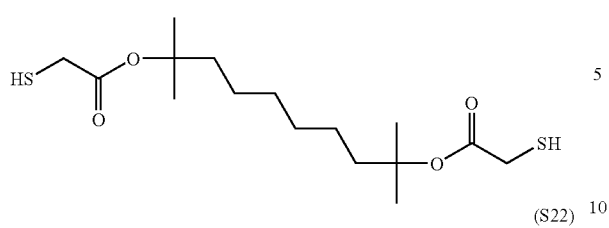
(S22) 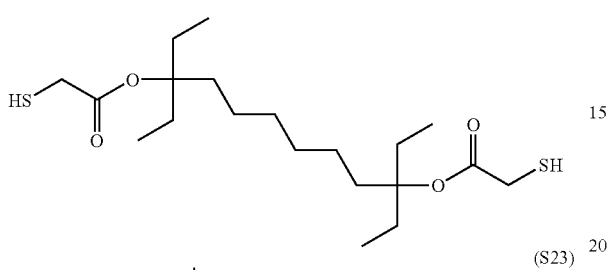
(S23) 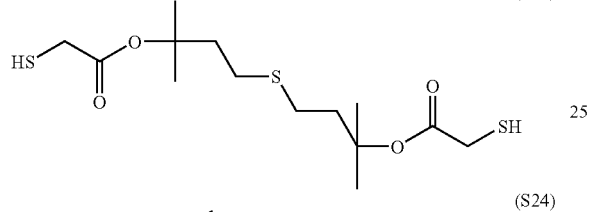
(S24) 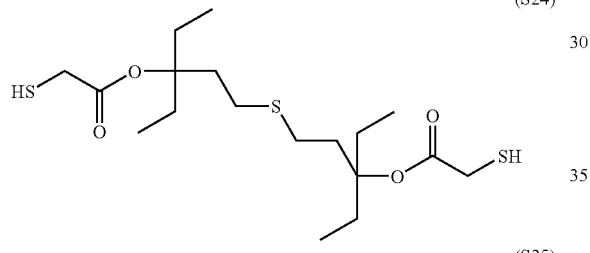
(S25) 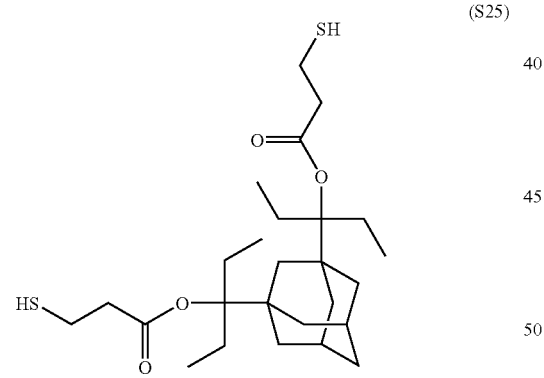
(S26) 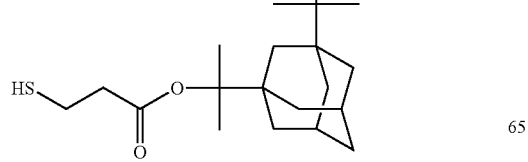
(S27) 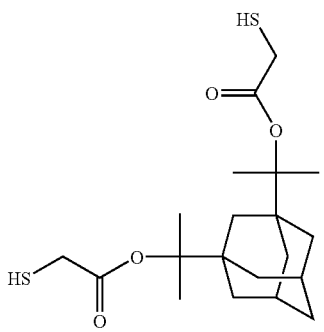
(S28) 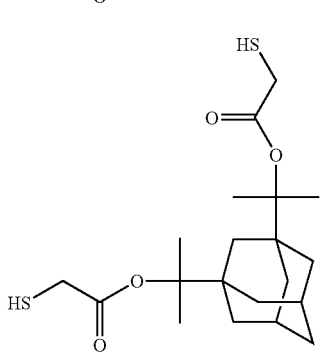
(S29) 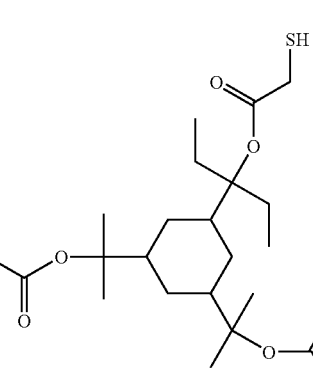
(S30) 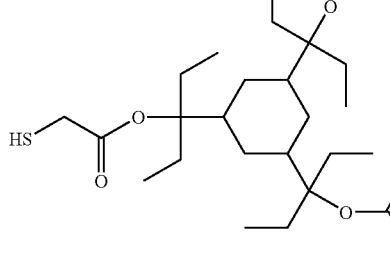
(S31) 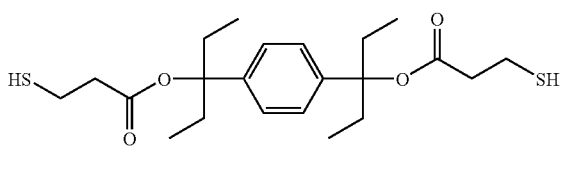

-continued (S32)
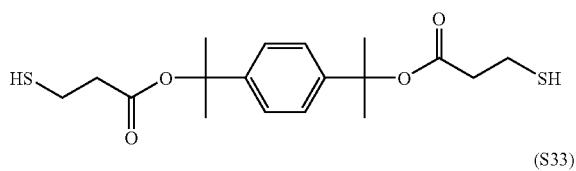

(S33)
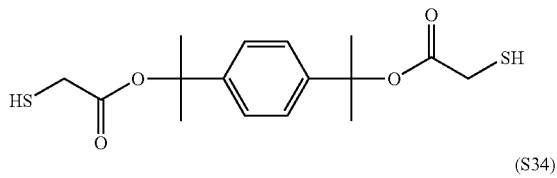

(S34)
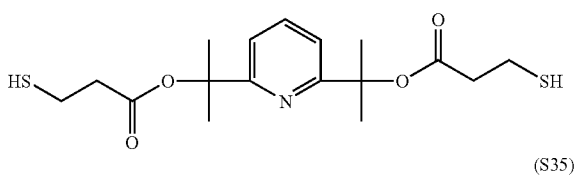

(S35)
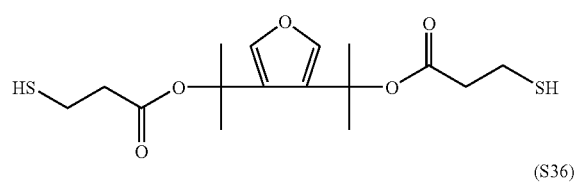

(S36)
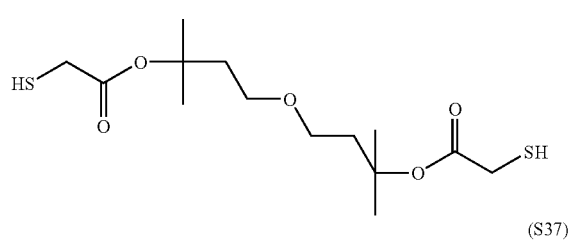

(S37)
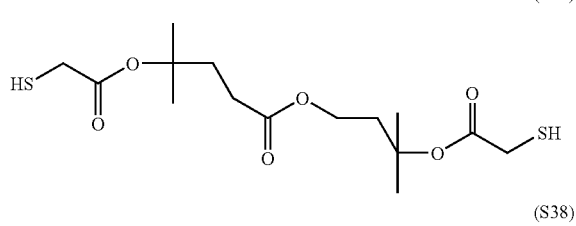

(S38)

Examples of the reaction solvent include ethers such as tetrahydrofuran, 1,4-dioxane, and diisopropyl ether, ketones such as methyl ethyl ketone and methyl isobutyl ketone, ester solvents such as ethyl acetate, and amide solvents such as dimethylformamide and diethylacetamide. In addition, solvents capable of dissolving therein the resist composition of the present invention such as propylene glycol monomethyl ether acetate, propylene glycol monomethyl ether, and cyclohexanone, which will be described later, can be used. The polymerization is preferably performed by using the same solvent as the solvent used in the resist composition of the present invention. Using such a solvent can prevent generation of particles during storage.

The polymerization reaction is preferably performed in an inert gas atmosphere such as nitrogen and argon.

After completion of reaction, the reaction product is charged in a solvent and the desired high molecular compound is collected in powder or solid form. The concentration of the reaction solute is from 5 to 50 mass %, preferably from 10 to 30 mass %. The reaction temperature is usually from 10 to 150° C., preferably from 30 to 120° C., more preferably from 60 to 100° C.

The weight average molecular weight of the resin (A) is preferably from 1,000 to 200,000, more preferably from 3,000 to 20,000, most preferably from 5,000 to 15,000 in terms of polystyrene by the GPC method. It is preferred to adjust the weight average molecular weight to from 1,000 to 200,000 in order to prevent deterioration of the heat resistance or dry etching resistance, prevent deterioration of the developability, and prevent deterioration of the film-forming property due to an increased viscosity.

The dispersity (molecular weight distribution) of the resin (A) is usually from 1 to 5, preferably from 1 to 3, more preferably from 1 to 2. The resin having a smaller molecular weight distribution is more excellent in resolution and resist profile and can provide a resist pattern with smoother side walls and better roughness.

The polymerization initiator to be used in the present invention is not particularly limited insofar as it is usually employed as a radical generator. Examples include azo compounds such as 2,2'-azobisisobutyronitrile, 2,2'-azobis(2-methylbutyronitrile), dimethyl 2,2'-azobisisobutyrate, 1,1'-azobis(cyclohexane-1-carbonitrile), and 4,4'-azobis(4-cyanovaleric acid); and organic peroxides such as decanoyl peroxide, lauroyl peroxide, benzoyl peroxide, bis(3,5,5-trimethylhexanoyl) peroxide, succinic acid peroxide, t-butyl peroxy-2-ethylhexanoate. They may be used either singly or in combination.

The using amount of the compound represented by the formula (2) when it is used as a chain transfer agent is from 0.1 to 50 mol %, preferably from 1 to 30 mol %, especially preferably from 2.5 to 10 mol % based on the total number of moles of the raw material monomers. As the amount of the compound represented by the formula (2) is greater, the content of the structure represented by the formula (1) in the resin becomes greater, but the molecular weight of the resin (A) thus obtained becomes smaller. The amounts within the above-described range are therefore preferred when the high molecular compound of the present invention is used as a resist composition.

With regard to the amount of the compound (S) represented by formula (2) and the polymerization initiator (I) in the synthesis process of the resin (A) of the present invention, a molar ratio (I/S) is preferably 1.0 or less. When the molar ratio (I/S) is 1.0 or less, it is possible to suppress a proportion of the molecule in which a residue derived from the polymerization initiator is introduced into the terminal of the main chain of the polymer (A) and thereby sufficiently bring out a molecular-weight reducing effect due to cleavage of the main chain.

When the composition of the present invention is used for an upper resist layer of a multilayer resist, the resin (A) preferably contains a silicon atom.

As a resin having a silicon atom and decomposing under the action of an acid to increase its solubility in an alkaline developer, a resin having a silicon atom in at least either one of the main chain or side chain can be used. Examples of the resin having, in the side chain thereof, a siloxane structure include copolymers of an olefin-based monomer having a silicon atom in the side chain and a (meth)acrylic acid-based monomer having maleic anhydride and an acid decomposable group in the side chain.

The resin having a silicon atom is preferably a resin having a trialkylsilyl structure or a monocyclic or polycyclic siloxane structure, more preferably a resin having a recurring unit having a structure represented by any of the following formulas (SS-1) to (SS-4), still more preferably a resin having a (meth)acrylic acid ester-based recurring unit, vinyl-based recurring unit, or acryl-based recurring unit each of which has a structure represented by any of formulas (SS-1) to (SS-4).

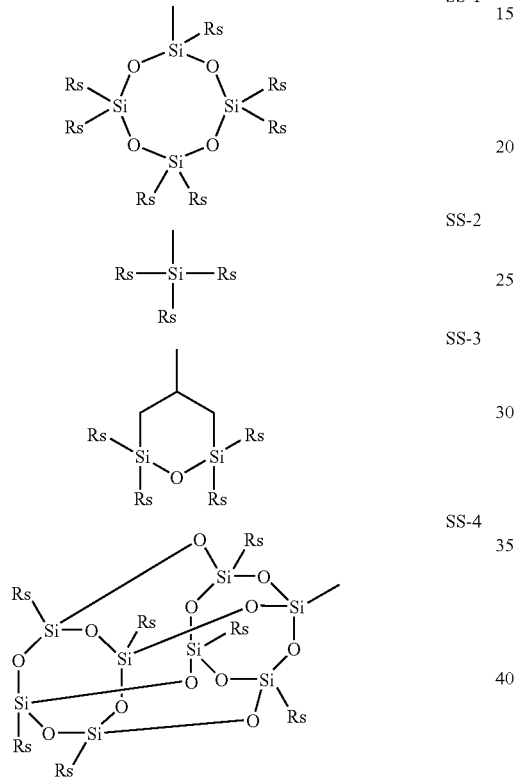

In formulas (SS-1) to (SS-4), Rs each independently represents an alkyl group having from 1 to 5 carbon atoms, preferably a methyl group or an ethyl group.

The resin having a silicon atom preferably contains two or more different recurring units having a silicon atom, more preferably contains both (Sa) a recurring unit having from 1 to 4 silicon atoms and (Sb) a recurring unit having from 5 to 10 silicon atoms, still more preferably contains both at least one recurring unit having a structure represented by any of the formulas (SS-1) to (SS-3) and a recurring unit having a structure represented by the formula (SS-4).

When the positive resist composition of the present invention is exposed to $F_2$ excimer laser light, the resin (A) is preferably a resin which has a fluorine-substituted structure in the main chain and/or the side chain of the polymer skeleton atom and decomposes under the action of an acid to increase the solubility in an alkaline developer; more preferably a resin containing a hydroxyl group substituted, at the 1-position, with a fluorine atom or a fluoroalkyl group or a group obtained by protecting, with an acid decomposable group, a hydroxyl group substituted, at the 1-position, with a fluorine atom or a fluoroalkyl group; especially preferably a resin containing a hexafluoro-2-propanol structure or a structure obtained by protecting the hydroxyl group of hexafluoro-2-propanol with an acid decomposable group. Introduction of a fluorine atom enables to improve the transparency to far ultraviolet light, particularly $F_2$ (157 nm).

Preferred examples of the fluorine-containing resin (A) include resins having at least one recurring unit represented by the following formulas (FA) to (FG):

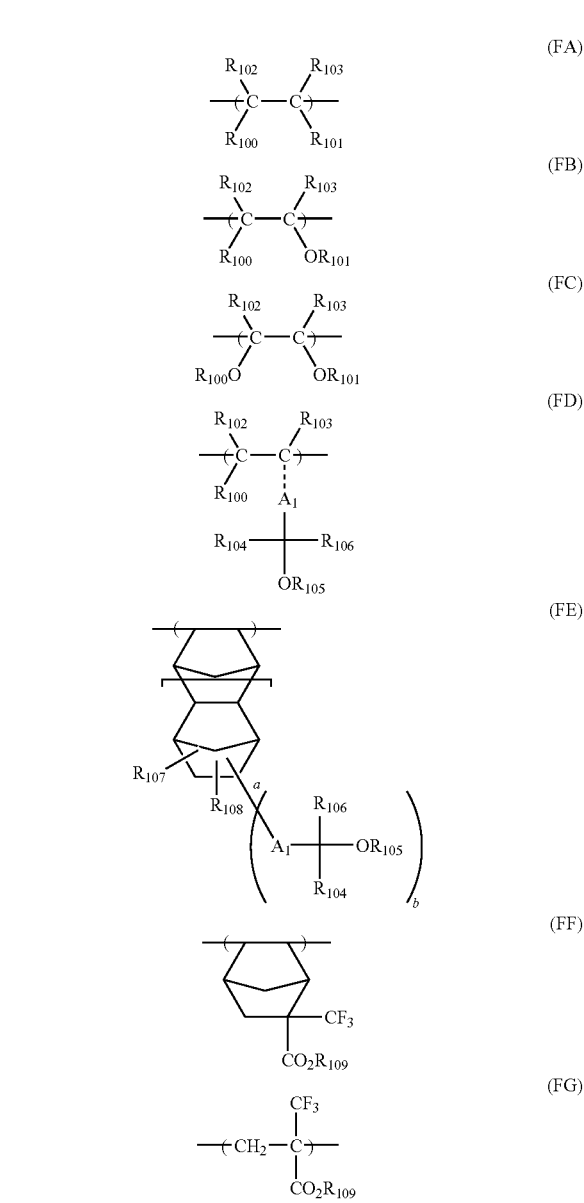

In the formulas (FA) to (FG), $R_{100}$ to $R_{103}$ each independently represents a hydrogen atom, a fluorine atom, an alkyl group, or an aryl group.

$R_{104}$ and $R_{106}$ each independently represents a hydrogen atom, a fluorine atom, or an alkyl group and at least one of $R_{104}$ and $R_{106}$ represents a fluorine atom or a fluoroalkyl group. $R_{104}$ and $R_{106}$ are each preferably a trifluoromethyl group.

$R_{105}$ represents a hydrogen atom, an alkyl group, a cycloalkyl group, an acyl group, an alkoxycarbonyl group, or a group which decomposes under the action of an acid.

$A_1$ represents a single bond or a divalent linking group, for example, a linear, branched, or cyclic alkylene group, an alkenylene group, an arylene group, —OCO—, —COO— or —CON($R_{24}$)—, or a linking group in which two or more thereof have been coupled to each other. $R_{24}$ represents a hydrogen atom or an alkyl group.

$R_{107}$ and $R_{108}$ each independently represents a hydrogen atom, a halogen atom, an alkyl group, an alkoxy group, an alkoxycarbonyl group, or a group which decomposes under the action of an acid.

$R_{109}$ represents a hydrogen atom, an alkyl group, a cycloalkyl group, or a group which decomposes under the action of an acid.

a stands for 0 or 1.

b stands for 0, 1 or 2.

$R_{100}$ and $R_{101}$ in the formulas (FA) and (FC) may form a ring via an alkylene group (having from 1 to 5 carbon atoms) which may be substituted with fluorine.

Each of the recurring units represented by the formulas (FA) to (FG) contains at least one fluorine atom, preferably three or more fluorine atoms per recurring unit.

In the positive resist composition of the present invention, an amount of the resin (A) according to the present invention is preferably from 40 to 99.9 mass %, more preferably from 50 to 99 mass %, still more preferably from 80 to 96 mass in the total solid content of the composition.

[2] (B) Compound Generating an Acid When Exposed to Actinic Rays or Radiation:

A compound generating an acid when exposed to actinic rays or radiation (which may hereinafter be called "acid generator") and to be used in the positive resist composition of the present invention will hereinafter be described.

The acid generator to be used in the present invention can be selected from compounds ordinarily used as an acid generator.

Described specifically, an acid generator selected as needed from photoinitiators for photoinitiated cationic polymerization, photoinitiators for photoinitiated radical polymerization, photo decoloring agents for dyes, photo-discoloring agents, known compounds used in micro resists or the like and generating an acid when exposed to actinic rays or radiation, for example, far ultraviolet radiation or X-ray, and mixtures of them can be used.

Examples include diazonium salts, phosphonium salts, sulfonium salts, iodonium salts, imide sulfonate, oxime sulfonate, diazodisulfone, disulfone, and o-nitrobenzyl sulfonate.

In addition, compounds obtained by introducing, into the main chain or side chain of the polymer, such a group or compound generating an acid upon exposure to actinic rays or radiation can be used. Examples include compounds described in U.S. Pat. No. 3,849,137, German Patent No. 3,914,407, Japanese Patent Laid-Open No. Sho 63-26653, Japanese Patent Laid-Open No. Sho 55-164824, Japanese Patent Laid-Open No. Sho 62-69263, Japanese Patent Laid-Open No. Sho 63-146038, Japanese Patent Laid-Open No. Sho 63-163452, Japanese Patent Laid-Open No. Sho 62-153853, and Japanese Patent Laid-Open No. Sho 63-146029.

Furthermore, compounds generating an acid when exposed to light, as described in U.S. Pat. No. 3,779,778, European Patent No. 126,712 and the like can also be used.

Among the acid generators, compounds represented by the following formulas (ZI), (ZII) and (ZIII) are preferred.

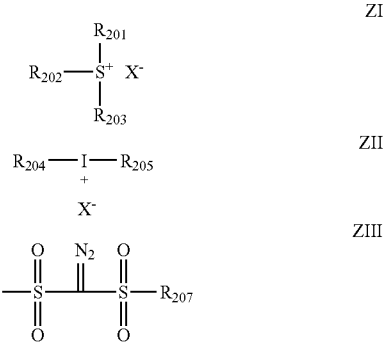

In formula (ZI), $R_{201}$, $R_{202}$ and $R_{203}$ each independently represents an organic group.

$X^-$ represents a non-nucleophilic anion.

The number of carbon atoms of the organic group represented by $R_{201}$, $R_{202}$ or $R_{203}$ is usually from 1 to 30, preferably from 1 to 20.

Two of $R_{201}$ to $R_{203}$ may be coupled to form a ring structure and may contain, in the ring thereof, an oxygen atom, a sulfur atom, an ester bond, an amide bond or a carbonyl group.

Examples of the group formed by coupling of two of $R_{201}$ to $R_{203}$ include alkylene groups (such as butylene group and pentylene group).

Specific examples of the organic group represented by $R_{201}$, $R_{202}$, and $R_{203}$ include groups corresponding thereto in compounds (ZI-1), (ZI-2) and (ZI-3) which will be described later.

Incidentally, the acid generator may be a compound having plural structures represented by the formula (ZI). For example, the compound may have a structure obtained by coupling at least one of $R_{201}$ to $R_{203}$ of a compound represented by the formula (ZI) with at least one of $R_{201}$ to $R_{203}$ of another compound represented by the formula (ZI).

More preferred examples of the component (ZI) include compounds (ZI-1), (ZI-2) and (ZI-3) which will be described below.

The compound (ZI-1) is an arylsulfonium compound, that is, a compound of the formula (Z1) having an aryl group as at least one of $R_{201}$ to $R_{203}$. It is a compound having an arylsulfonium as a cation.

In the arylsulfonium compound, all of $R_{201}$ to $R_{203}$ may be an aryl group, or some of $R_{201}$ to $R_{203}$ may be an aryl group, with the remaining one being an alkyl or cycloalkyl group.

Examples of the arylsulfonium compound include triarylsulfonium compounds, diarylalkylsulfonium compounds, aryldialkylsulfonium compounds, diarylcycloalkylsulfonium compounds, and aryldicycloalkylsulfonium compounds.

The aryl group of the arylsulfonium compound is preferably a phenyl group or a naphthyl group, more preferably a phenyl group. The aryl group may be a aryl group having a heterocyclic structure having an oxygen atom, a nitrogen atom, a sulfur atom or the like. Examples of the aryl group having a heterocyclic structure include a pyrrole residue (a group remaining after a hydrogen atom is lost from pyrrole), a furan residue (a group remaining after a hydrogen atom is lost from furan), a thiophene residue (a group remaining after a hydrogen atom is lost from thiophene), an indole residue (a group remaining after a hydrogen atom is lost from indole), a benzofuran residue (a group remaining after a hydrogen atom is lost from benzofuran), and a benzothiophene residue (a group remaining after a hydrogen atom is lost from benzothiophene). When the arylsulfonium compound has two or more aryl groups, the two or more aryl groups may be the same or different.

The alkyl group which the arylsulfonium compound optionally has is preferably a linear or branched alkyl group having from 1 to 15 carbon atoms. Examples thereof include methyl group, ethyl group, propyl group, n-butyl group, sec-butyl group, and t-butyl group.

The cycloalkyl group which the arylsulfonium compound optionally has is preferably a cycloalkyl group having from 3 to 15 carbon atoms. Examples thereof include cyclopropyl group, cyclobutyl group, and cyclohexyl group.

Each of the aryl group, the alkyl group, or the cycloalkyl group represented by $R_{201}$ to $R_{203}$ may have, as a substituent, an alkyl group (for example, having from 1 to 15 carbon atoms), a cycloalkyl group (for example, having from 3 to 15 carbon atoms), an aryl group (for example, having from 6 to 14 carbon atoms), an alkoxy group (for example, having from 1 to 15 carbon atoms), a halogen atom, a hydroxyl group, a phenylthio group, or the like. Preferred examples of the substituent include linear or branched alkyl groups having from 1 to 12 carbon atoms, cycloalkyl groups having from 3 to 12 carbon atoms, and alkoxy groups having from 1 to 12 carbon atoms, of which alkyl groups having from 1 to 4 carbon atoms and alkoxy groups having from 1 to 4 carbon atoms are most preferred. The substituents may be introduced into any one of three $R_{201}$ to $R_{203}$ or into all of them. When $R_{201}$ to $R_{203}$ each represents an aryl group, the substituents may be introduced at the p-position thereof.

Examples of the non-nucleophilic anion represented by $X^-$ include sulfonate anions, carboxylate anions, sulfonyl imide anions, bis(alkylsulfonyl)imide anions, and tris(alkylsulfonyl)methyl anions.

The term "non-nucleophilic anion" as used herein means an anion having extremely low ability to cause a nucleophilic reaction and it can inhibit the time-dependent decomposition due to an intramolecular nucleophilic reaction. It is effective for improving the temporal stability of the resist.

Examples of the sulfonate anions include aliphatic sulfonate anions, aromatic sulfonate anions, and camphorsulfonate anion.

Examples of the carboxylate anions include aliphatic carboxylate anions, aromatic carboxylate anions, and aralkyl carboxylate anions.

Examples of the aliphatic group in the aliphatic sulfonate anions include alkyl groups having from 1 to 30 carbon atoms, more specifically, a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, and an eicosyl group; and cycloalkyl groups having from 3 to 30 carbon atoms, more specifically, a cyclopropyl group, a cyclopentyl group, a cyclohexyl group, an adamantyl group, a norbornyl group, and a boronyl group.

Preferred examples of the aromatic group in the aromatic sulfonate anions include aryl groups having from 6 to 14 carbon atoms such as phenyl, tolyl, and naphthyl.

Each of the alkyl group, the cycloalkyl group, and the aryl group in the above aliphatic sulfonate anions and aromatic sulfonate anions may have a substituent.

Examples of such a substituent include a nitro group, halogen atoms (such as fluorine, chlorine, bromine, and iodine), a carboxyl group, a hydroxyl group, an amino group, a cyano group, alkoxy groups (having preferably from 1 to 5 carbon atoms), cycloalkyl groups (having preferably from 3 to 15 carbon atoms), aryl groups (having preferably from 6 to 14 carbon atoms), alkoxycarbonyl groups (having preferably from 2 to 7 carbon atoms), acyl groups (having preferably from 2 to 12 carbon atoms), alkoxycarbonyloxy groups (having preferably from 2 to 7 carbon atoms), and alkylthio groups (having preferably from 1 to 15 carbon atoms). With respect to the aryl group and ring structure which each of the groups has, alkyl groups (having preferably from 1 to 15 carbon atoms) can be given as the substituent.

Examples of the aliphatic groups in the aliphatic carboxylate anions include aliphatic groups similar to those described in the aliphatic sulfonate anions.

Examples of the aromatic groups in the aromatic carboxylate anions include aromatic groups similar to those described in the aromatic sulfonic anions.

Preferred example of the aralkyl groups in the aralkyl carboxylate anions include aralkyl groups having from 6 to 12 carbon atoms such as benzyl, phenethyl, naphthylmethyl, naphthylethyl, and naphthylmethyl.

Each of the aliphatic groups, the aromatic groups, and the aralkyl groups in the above aliphatic carboxylate anions, aromatic carboxylate anions, and aralkyl carboxylate anions may have a substituent. Examples of the substituent include halogen atoms, alkyl groups, cycloalkyl groups, alkoxy groups, and alkylthio groups similar to those described in the aliphatic sulfonate anions.

Examples of the sulfonylimide anions include a saccharin anion.

The alkyl group in the bis(alkylsulfonyl)imide anion and the tris(alkylsulfonyl)methyl anions is preferably an alkyl group having from 1 to 5 carbon atoms such as methyl group, ethyl group, propyl group, isopropyl group, n-butyl group, isobutyl group, sec-butyl group, pentyl group, and neopentyl group. These alkyl groups may have a substituent. Examples of the substituent include halogen atoms, halogen-substituted alkyl groups, alkoxy groups, and alkylthio groups. Of these, fluorine-substituted alkyl groups are preferred.

Examples of the other non-nucleophilic anion include fluorinated phosphorus, fluorinated boron, and fluorinated antimony.

Preferred examples of the non-nucleophilic anion represented by $X^-$ include aliphatic sulfonate anions in which sulfonic acid is substituted at the α-position thereof with a fluorine atom, aromatic sulfonate anions substituted with a fluorine atom or a fluorine-containing group, bis(alkylsulfonyl)imide anions in which the alkyl group is substituted with a fluorine atom, and tris(alkylsulfonyl)methide anions in which the alkyl group is substituted with a fluorine atom. Of these non-nucleophilic anions, perfluoro-aliphatic sulfonate anions having from 4 to 8 carbon atoms and aromatic sulfonate anions having a fluorine atom are especially preferred, with a nonafluorobutane sulfonate anion, a perfluorooctane sulfonate anion, a pentafluorobenzene sulfonate anion, and a 3,5-bis(trifluoro-methyl)benzene sulfonate anion being most preferred.

The compound (ZI-2) will next be described.

The compound (ZI-2) is a compound of the formula (ZI) in which $R_{201}$ to $R_{203}$ each independently represents an aromatic ring-free organic group. The term "aromatic ring" as used herein embraces a heteroatom-containing aromatic ring.

The aromatic ring-free organic group represented by $R_{201}$ to $R_{203}$ usually has usually from 1 to 30 carbon atoms, preferably from 1 to 20 carbon atoms.

$R_{201}$ to $R_{203}$ each independently represents preferably an alkyl group, a cycloalkyl group, an allyl group, or a vinyl group, more preferably a linear, branched, or cyclic 2-oxoalkyl group or an alkoxycarbonylmethyl group, most preferably a linear or branched 2-oxoalkyl group.

The alkyl group represented by $R_{201}$ to $R_{203}$ may be either linear or branched and is preferably a linear or branched alkyl group having from 1 to 10 carbon atoms such as methyl, ethyl, propyl, butyl, or pentyl. The alkyl group is more preferably a 2-(linear or branched oxoalkyl) group or an alkoxycarbonylmethyl group.

The cycloalkyl group represented by $R_{201}$ to $R_{203}$ is preferably a cycloalkyl group having from 3 to 10 carbon atoms such as cyclopentyl, cyclohexyl or norbornyl. The cycloalkyl group is more preferably a 2-oxocycloalkyl group.

The 2-oxoalkyl group may be any of linear, branched, or cyclic and is preferably the above-described alkyl or cycloalkyl group having, at the 2-position thereof, $>C=O$.

Preferred examples of the alkoxy group in the alkoxycarbonylmethyl group include alkoxy groups having from 1 to 5 carbon atoms (such as methoxy, ethoxy, propoxy, butoxy, and pentoxy).

Each of $R_{201}$ to $R_{203}$ may be substituted further with a halogen atom, an alkoxy group (for example, having from 1 to 5 carbon atoms), a hydroxyl group, a cyano group, or a nitro group.

The compound (ZI-3) is a compound represented by the following formula (ZI-3) and having a phenacyl sulfonium salt structure.

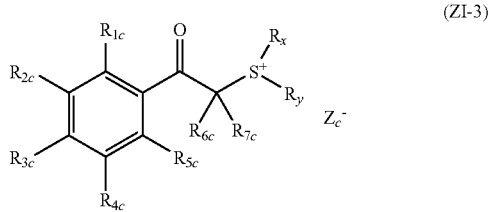

(ZI-3)

In the formula (ZI-3), $R_{1c}$ to $R_{5c}$ each independently represents a hydrogen atom, an alkyl group, a cycloalkyl group, an alkoxy group, or a halogen atom, $R_{6c}$ and $R_{7c}$ each independently represents a hydrogen atom, an alkyl group, or a cycloalkyl group, and $R_x$ and $R_y$ each independently represents an alkyl group, a cycloalkyl group, an allyl group, or a vinyl group.

Any two or more of $R_{1c}$ to $R_{7c}$ and $R_x$ and $R_y$ may be coupled together to form ring structures, respectively. These ring structures may each contain an oxygen atom, a sulfur atom, an ester bond, or an amide bond. Examples of the group formed by coupling of any two or more of $R_{1c}$ to $R_{7c}$ or coupling of $R_x$ and $R_y$ include a butylene group and a pentylene group.

$Zc^-$ represents a non-nucleophilic anion and examples thereof include non-nucleophilic anions similar to those exemplified as $X^-$ in the formula (ZI).

The alkyl group represented by $R_{1c}$ to $R_{7c}$ is preferably a linear or branched alkyl group having from 1 to 20 carbon atoms such as methyl, ethyl, linear or branched propyl, linear or branched butyl, and linear or branched pentyl.

The cycloalkyl group represented by $R_{1c}$ to $R_{7c}$ is preferably a cycloalkyl group having from 3 to 8 carbon atoms. Examples thereof include a cyclopentyl group and a cyclohexyl group.

The alkoxy group represented by $R_{1c}$ to $R_{5c}$ may be any of linear, branched, and cyclic. Examples thereof include alkoxy groups having from 1 to 10 carbon atoms. Of these, linear or branched alkoxy groups having from 1 to 5 carbon atoms (such as methoxy, ethoxy, linear or branched propoxy group, linear or branched butoxy, and linear or branched pentoxy) and cyclic alkoxy groups having from 3 to 8 carbon atoms (such as cyclopentyloxy and cyclohexyloxy).

It is preferred that any one of $R_{1c}$ to $R_{5c}$ is a linear or branched alkyl group, a cycloalkyl group, or a linear, branched, or cyclic alkoxy group and it is more preferred that the sum of the carbon atoms of $R_{1c}$ to $R_{5c}$ is from 2 to 15. This makes it possible to improve the solubility in solvents and suppress generation of particles upon storage.

Examples of the alkyl group or the cycloalkyl group represented by $R_x$ or $R_y$ are similar to the alkyl groups and cycloalkyl groups exemplified as $R_{1c}$ to $R_{7c}$. Of these, 2-oxoalkyl groups, 2-oxocycloalkyl groups, and alkoxycarbonylmethyl groups are more preferred.

Examples of the 2-oxoalkyl groups and the 2-oxocycloalkyl groups include the alkyl groups and the cycloalkyl groups as $R_{1c}$ to $R_{7c}$ having, at the 2-position thereof, $>C=O$, respectively.

Examples of the alkoxy groups in the alkoxycarbonylmethyl groups are similar to the alkoxy groups represented by $R_{1c}$ to $R_{5c}$.

$R_x$ and $R_y$ are each preferably an alkyl group having 4 or more carbon atoms, more preferably 6 or more carbon atoms, still more preferably 8 or more carbon atoms.

In the formulas (ZII) and (ZIII), $R_{204}$ to $R_{207}$ each independently represents an aryl group, an alkyl group, or a cycloalkyl group.

The aryl group represented by $R_{204}$ to $R_{207}$ is preferably a phenyl group or a naphthyl group, more preferably a phenyl group. The aryl group represented by $R_{204}$ to $R_{207}$ may be an aryl group having a heterocyclic structure having an oxygen atom, a nitrogen atom, a sulfur atom, or the like. Examples of the aryl group having a heterocyclic structure include a pyrrole residue (a group remaining after a hydrogen atom is lost from pyrrole), a furan residue (a group remaining after a hydrogen atom is lost from furan), a thiophene residue (a group remaining after a hydrogen atom is lost from thiophene), an indole residue (a group remaining after a hydrogen atom is lost from indole), a benzofuran residue (a group remaining after a hydrogen atom is lost from benzofuran), and a benzothiophene residue (a group remaining after a hydrogen atom is lost from benzothiophene).

Preferred examples of the alkyl group represented by $R_{204}$ to $R_{207}$ include linear or branched alkyl groups having from 1 to 10 carbon atoms such as methyl, ethyl, propyl, butyl, and pentyl.

Preferred examples of the cycloalkyl group represented by $R_{204}$ to $R_{207}$ include cycloalkyl groups having from 3 to 10 carbon atoms such as cyclopentyl group, cyclohexyl group, and norbornyl group.

Examples of the substituent which each of $R_{204}$ to $R_{207}$ may have include alkyl groups (having, for example, from 1 to 15 carbon atoms), cycloalkyl groups (having, for example, from 3 to 15 carbon atoms), aryl groups (having, for example, from 6 to 15 carbon atoms), alkoxy groups (having, for example, from 1 to 15 carbon atoms), halogen atoms, a hydroxyl group, and a phenylthio group.

$X^-$ represents a non-nucleophilic anion and examples thereof are similar to the non-nucleophilic anions of $X^-$ in the formula (ZI).

As the acid generator, compounds represented by the following formulas (ZIV), (ZV) and (ZVI) can be given further as preferred ones.

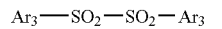

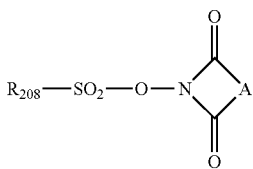

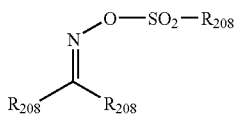

In the formula (ZIV), two Ar₃s each independently represents an aryl group. In the formulas (ZV) and (ZVI), R₂₀₈s each independently represents an alkyl group, a cycloalkyl group, or an aryl group and examples thereof are similar to the alkyl groups, the cycloalkyl groups or the aryl groups as $R_{204}$ to $R_{207}$ in above-described formulas (ZI) to (ZIII).

A represents an alkylene group, an alkenylene group, or an arylene group.

Of the acid generators, the compounds represented by the formulas (ZI) to (ZIII) are more preferred.

As the acid generator in the present invention, especially preferred are acid generators having both an anion structure containing a fluorine-substituted alkyl group having 4 or less carbon atoms, a fluorine-substituted cycloalkyl group, or a fluorine-substituted aromatic group and a triarylsulfonium cation structure. Of these, an acid generator represented by any of the following formulas (B1) to (B3) is preferred.

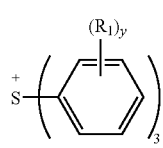

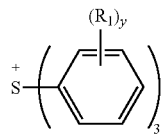

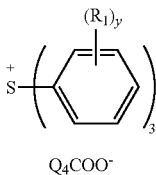

In the formulas (B1) to (B3), $R_1$ represents an alkyl group, an alicyclic hydrocarbon group, a hydroxyl group, a carboxyl group, an alkoxy group, or a halogen atom.

ys each independently represents 0 or an integer of from 1 to 5. When y is an integer of 2 or greater, two or more $R_1$s may be the same or different.

$Q_1$ to $Q_4$ each independently represents a fluorine-substituted alkyl group having from 1 to 8 carbon atoms, a fluorine-substituted cycloalkyl group, a fluorine-substituted aryl group, or a fluorinated alkyl substituted aryl group.

In particular, an acid generator represented by the formula (B2) wherein $Q_2$ and $Q_3$ are coupled together to form a ring structure is preferred in view of improvement in the exposure latitude.

The alkyl group as $R_1$ is preferably a linear or branched alkyl group having from 1 to 15 carbon atoms and examples thereof include a methyl group, an ethyl group, a propyl group, an n-butyl group, a sec-butyl group, and a t-butyl group.

The alicyclic hydrocarbon group as $R_1$ is preferably a cycloalkyl group having from 3 to 15 carbon atoms and examples thereof include a cyclopropyl group, a cyclobutyl group, a cyclopentyl group, a cyclohexyl group, a norbornyl group, and an adamantyl group.

Examples of the fluorine-substituted alkyl group as $Q_1$ to $Q_4$ include $-CF_3$, $-C_2F_5$, $-n-C_3F_7$, $-n-C_4F_9$, $-n-C_8F_{17}$, $-CF(CF_3)_2$, $-CH(CF_3)_2$, $-(CF_2)_2OCF_2CF_3$, $-(CF_2)_2-O-(CH_2)_3CH_3$, $-(CF_2)_2O(CH_2)_{13}CH_3$ and $-(CF_2)_2O(CF_2)_2(CH_2)_3CH_3$. The fluorine-substituted alkyl group having 4 or less carbon atoms as $Q_1$ to $Q_4$ may further have a substituent such as alkoxy group and fluoroalkoxy group.

Examples of the fluorine-substituted aryl group as $Q_1$ to $Q_4$ include a 2,3,4,5,6-pentafluorophenyl group, a 2,3,4-trifluorophenyl group, a 2,4-difluorophenyl group, a 4-fluorophenyl group, and a 4-undecanyloxy-2,3,5,6-tetrafluorophenyl group.

Examples of the fluorinated alkyl substituted aryl group as $Q_1$ to $Q_4$ include a 3-trifluoromethylphenyl group, a 3,5-bis(trifluoromethyl)phenyl group, a 4-trifluoromethylphenyl group, and a 4-n-nonafluorobutylphenyl group.

The following are especially preferred examples of the acid generator.

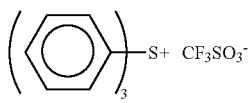

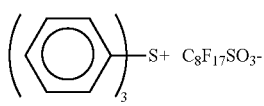

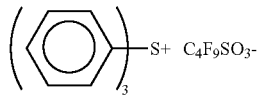

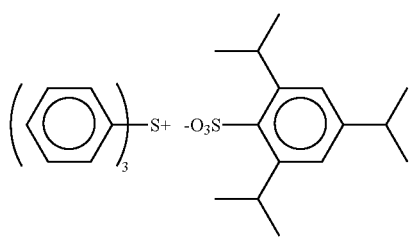

-continued
(z5) 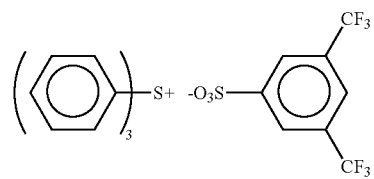
(z6) 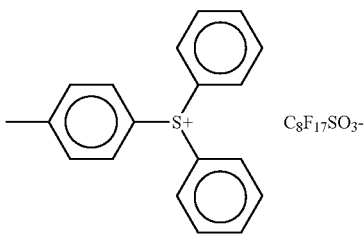
(z7) 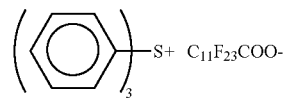
(z8) 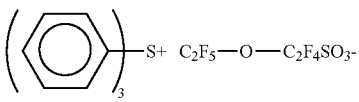
(z9) 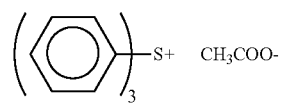
(z10) 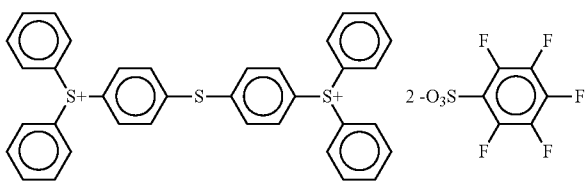
(z11) 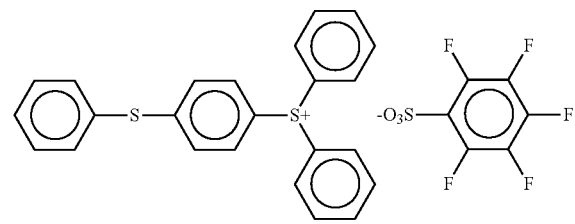
(z12) 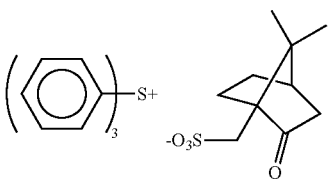
(z13) 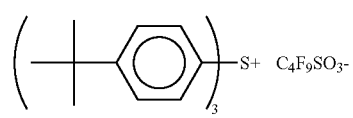
(z14) 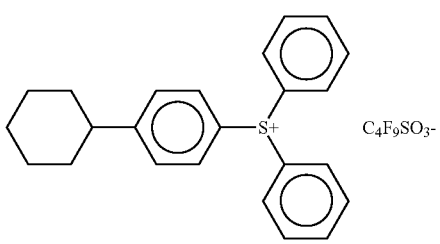
(z15) 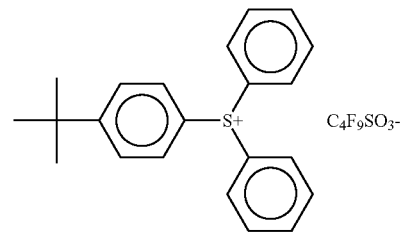
(z16) 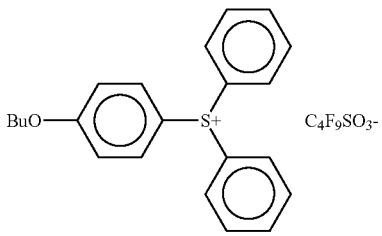
(z17) 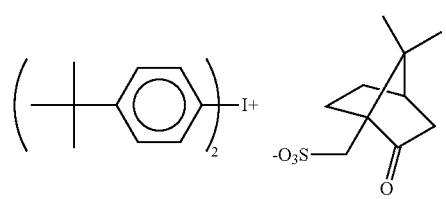
(z18) 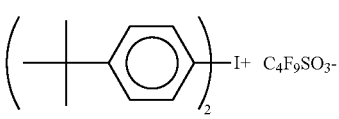

-continued
(z19) 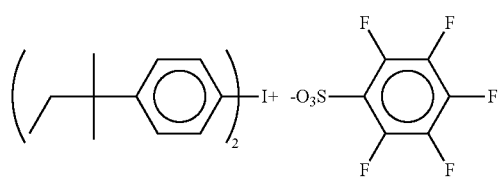 (z20) 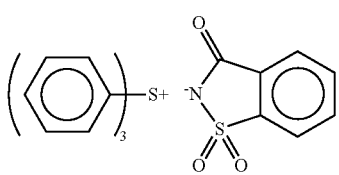
(z21) 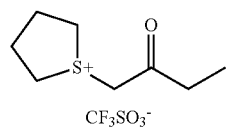 (z22) 
(z23) 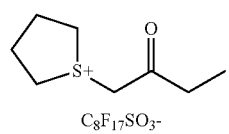 (z24) 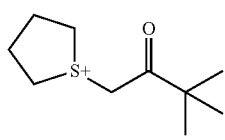
(z25) 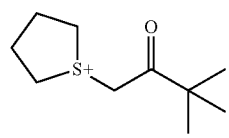 (z26) 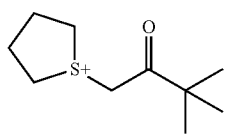
(z27) 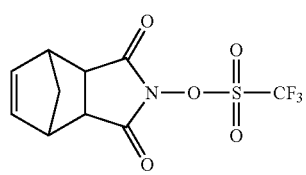 (z28) 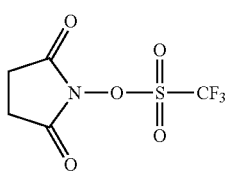
(z29) 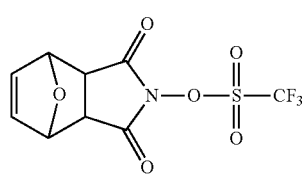 (z30) 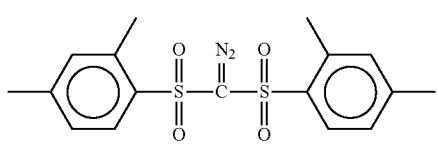
(z31) 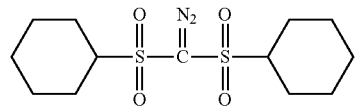 (z32) 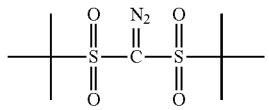
(z33) 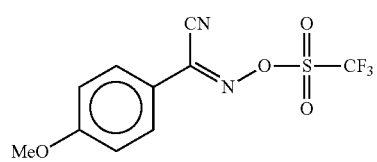
(z34) 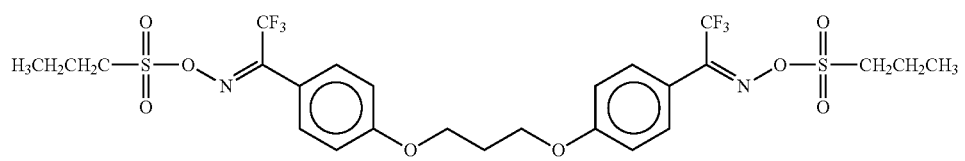

-continued
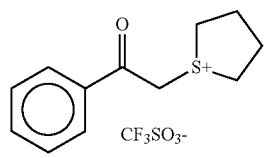
(z35)
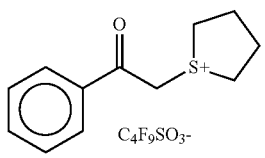
(z36)
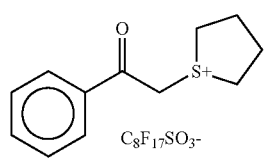
(z37)
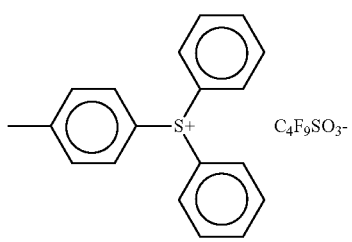
(z38)
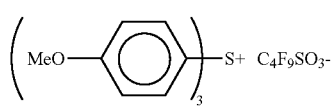
(z39)
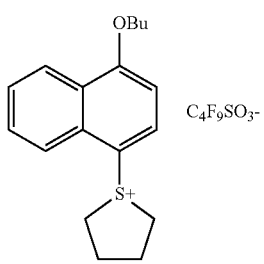
(z40)
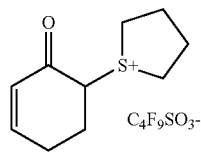
(z41)
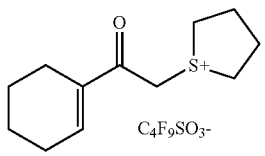
(z42)
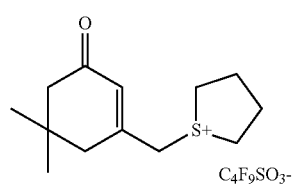
(z43)
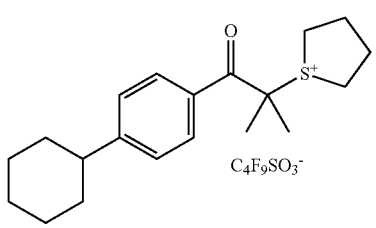
(z44)
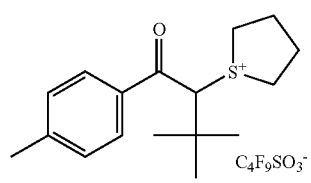
(z45)
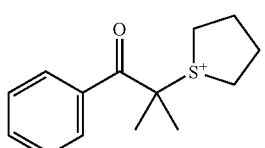
(z46)
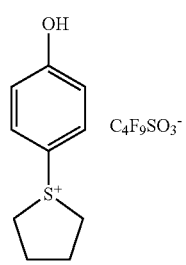
(z47)
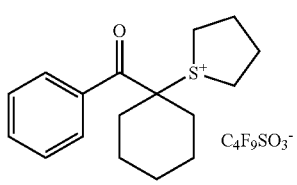
(z48)

-continued
(z49) 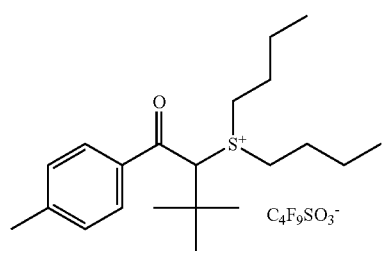
(z50) 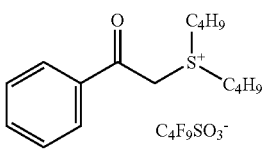
(z51) 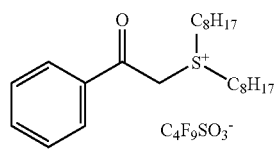
(z52) 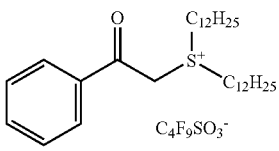
(z53) 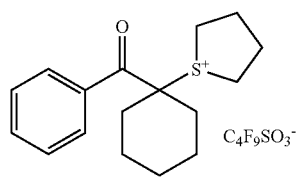
(z54) 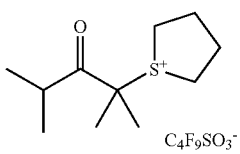
(z55) 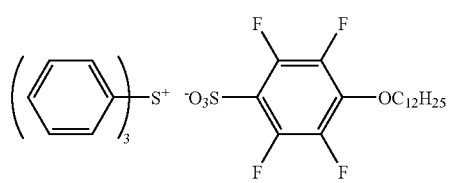
(z56) 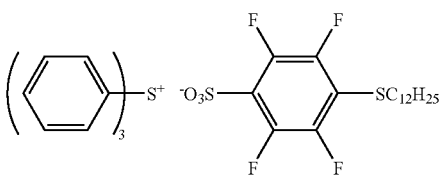
(z57) 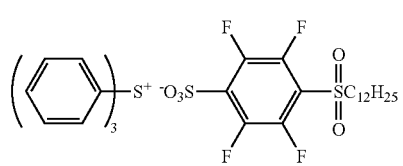
(z58) 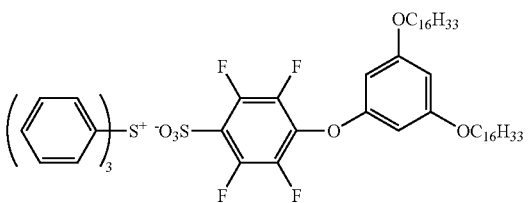
(z59) 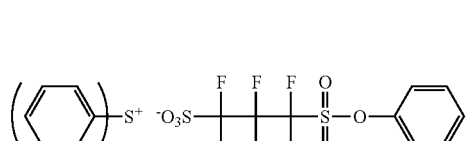
(z60) 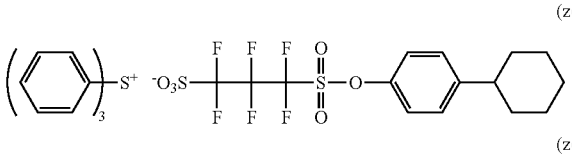
(z61) 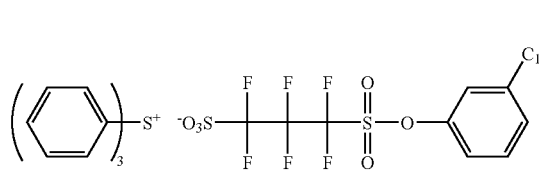
(z62) 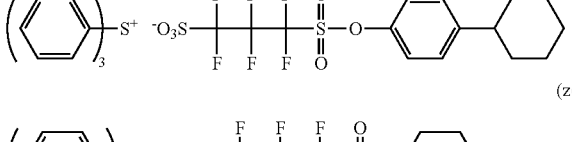
(z63) 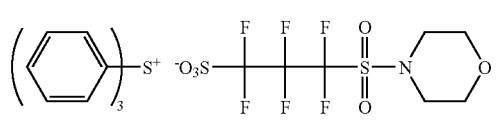
(z64) 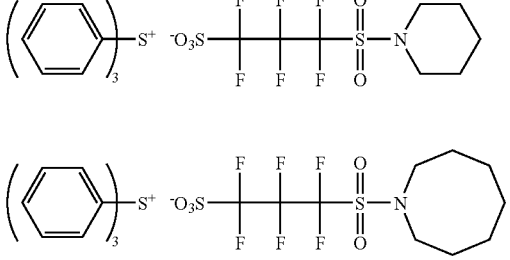
(z65) 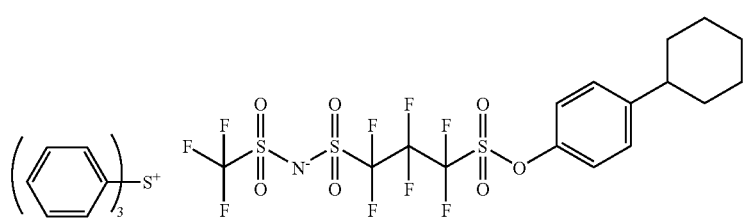

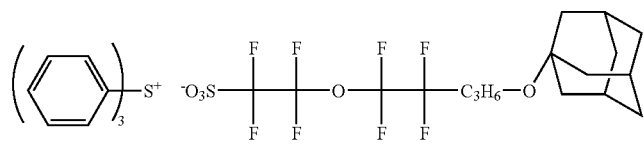
(z66)
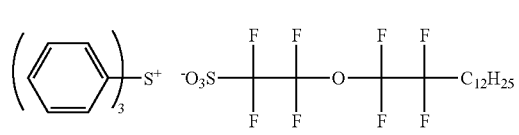
(z67)
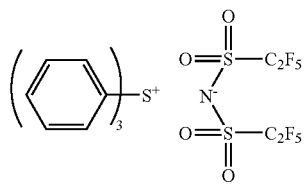
(z68)
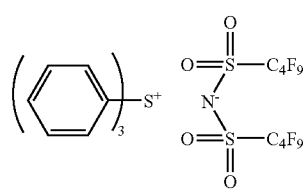
(z69)
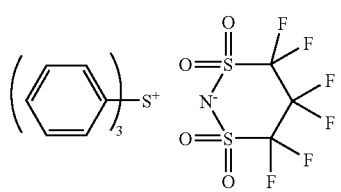
(z70)
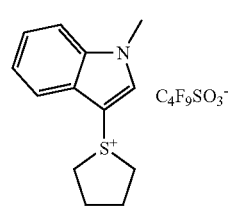
(z71)
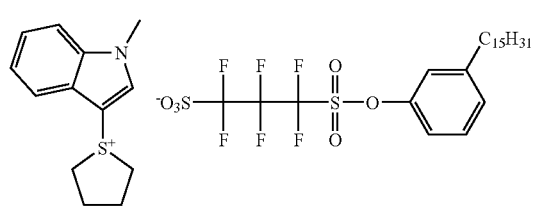
(z72)
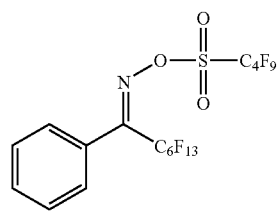
(z73)
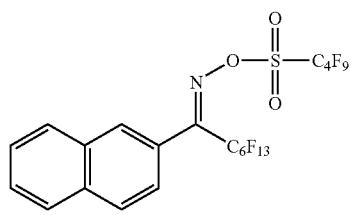
(z74)
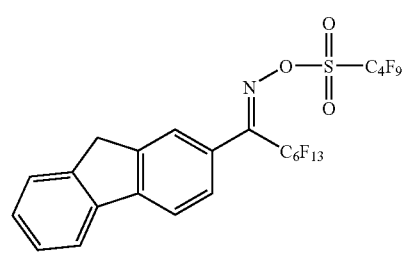
(z75)
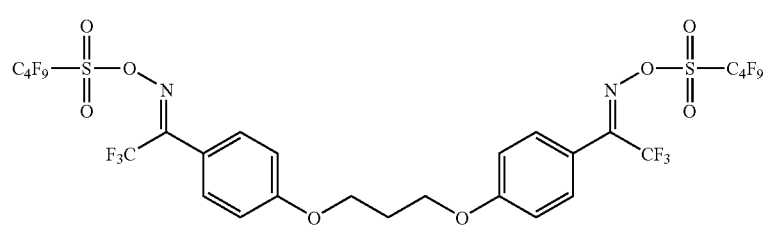
(z76)

-continued
(z77)
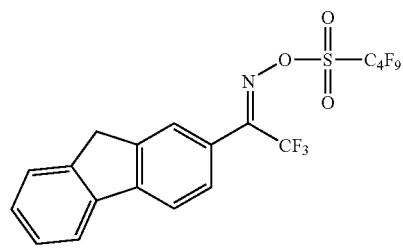
Ba-1
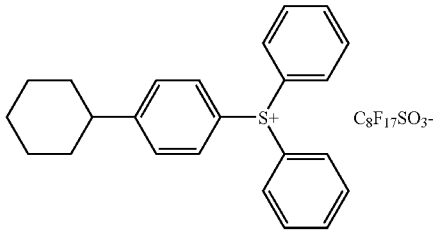
Ba-2
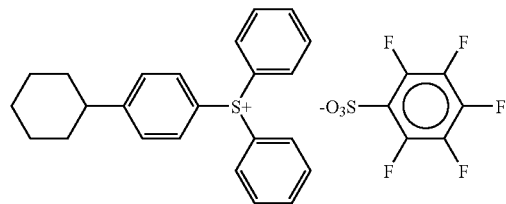
Ba-3
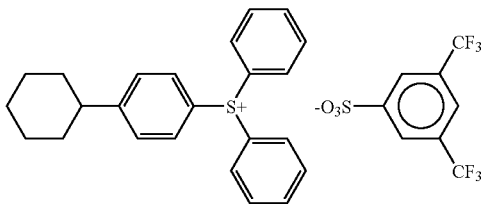
Ba-4
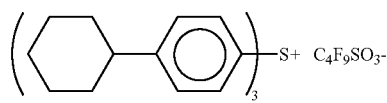
Ba-5
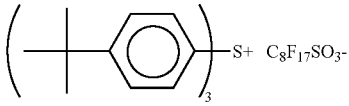
Ba-6
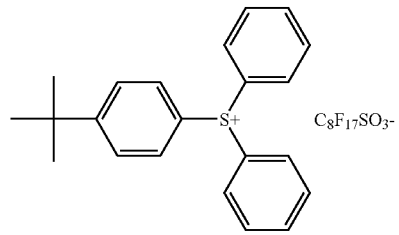
Ba-7
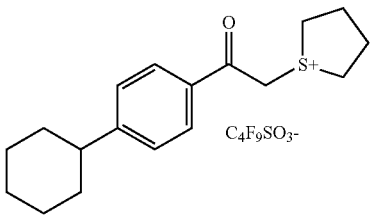
Ba-8
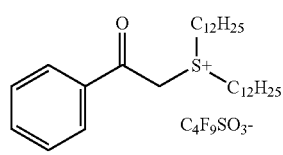
Ba-9
Ba-10
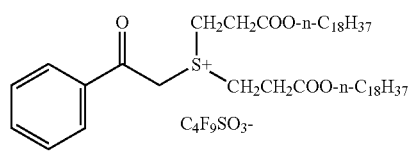
Ba-11
Ba-12
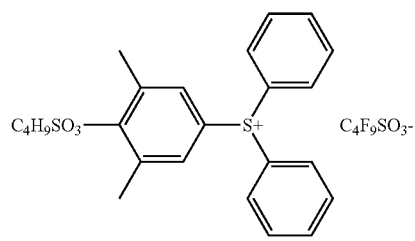
Ba-13
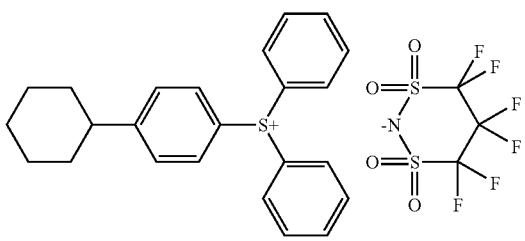

-continued
Ba-14
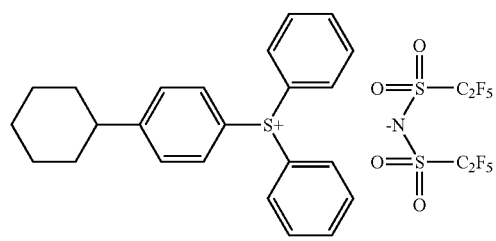
Bb-1
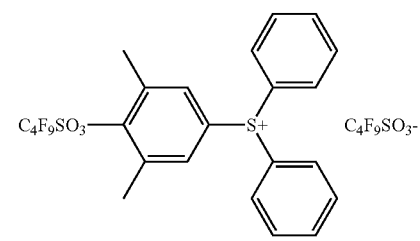
Bb-2
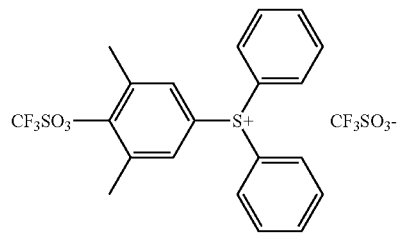
Bb-3
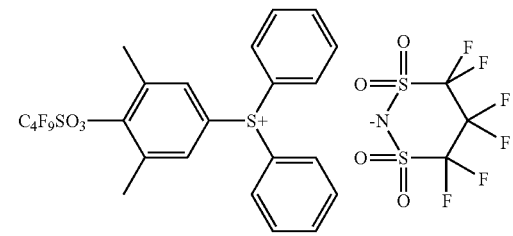
Bb-4
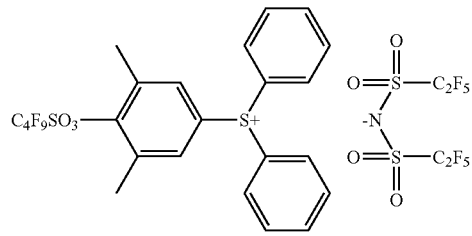
Bb-5
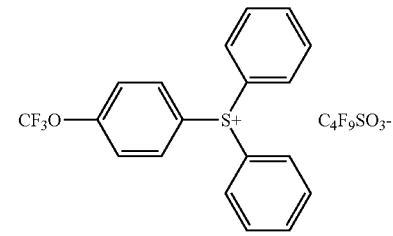
Bb-6
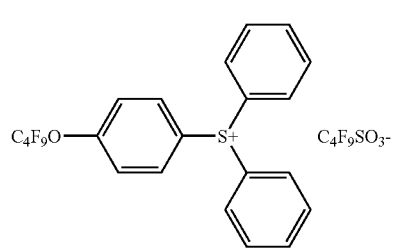
Bb-7
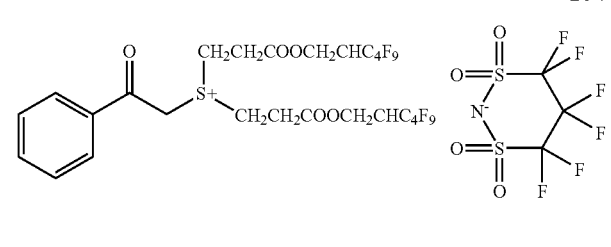
Bb-8
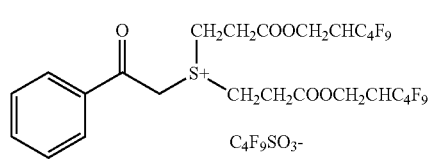
Bc-1
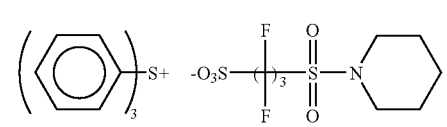
Bc-2
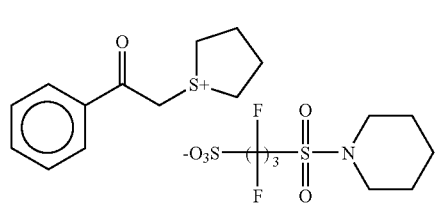
Bc-3
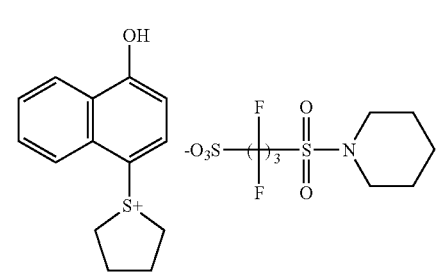
Bc-4
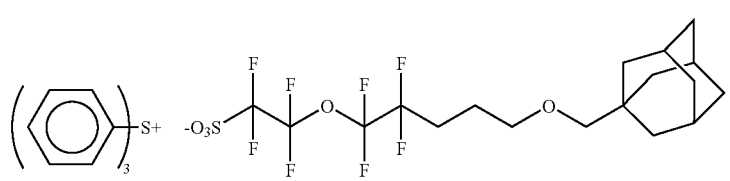

-continued
Bc-5
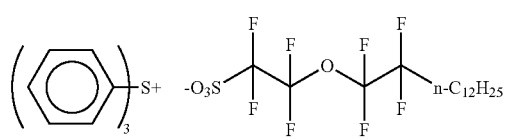
Bc-6
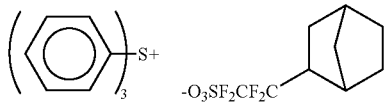
Bc-7
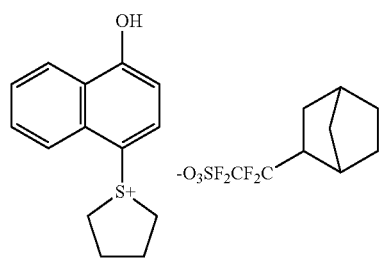
Bc-8
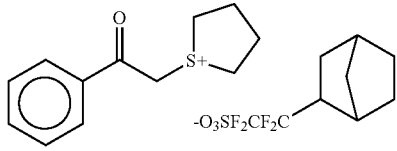
Bc-9
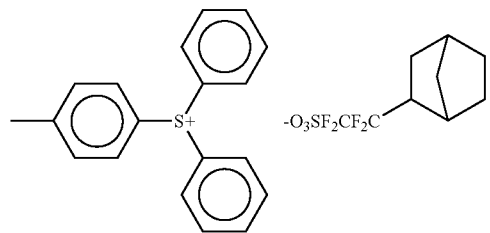
Bc-10
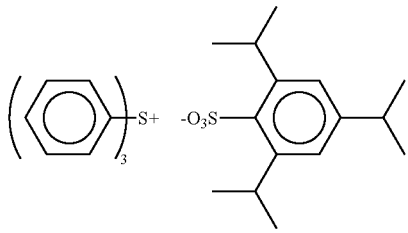
Bc-11
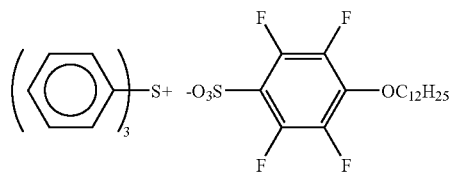
Bc-12
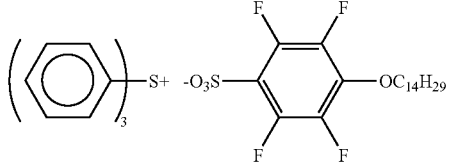
Bc-13
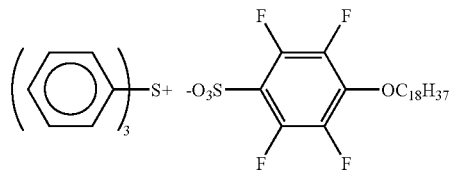
Bc-14
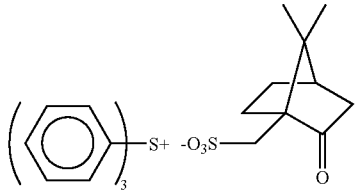
Bc-15
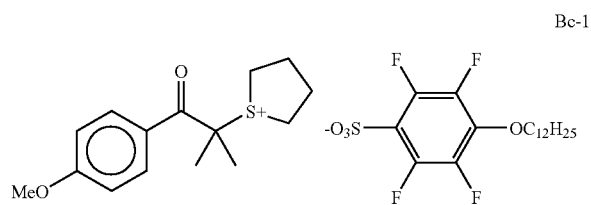
Bc-16
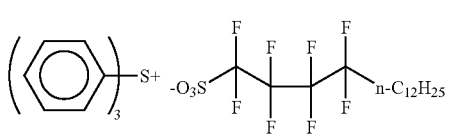
BaBc-1
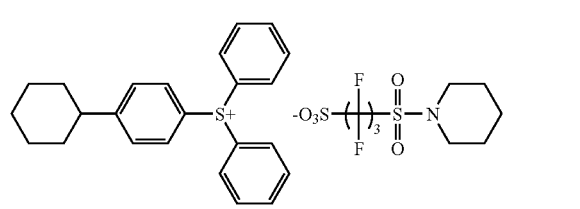
BaBc-2
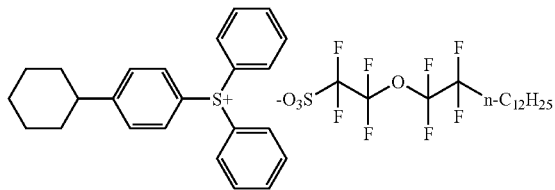
BaBc-3
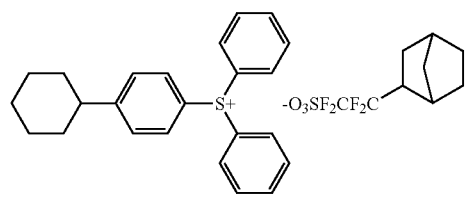
BaBc-4
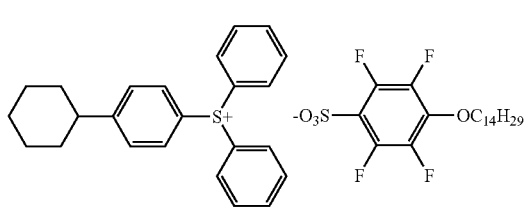

-continued
BaBc-5
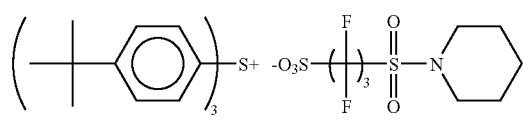
BaBc-6
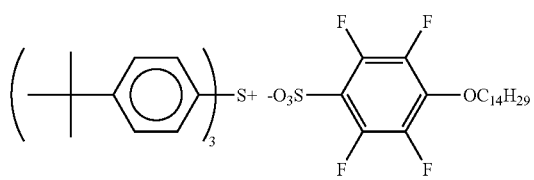
BaBc-7
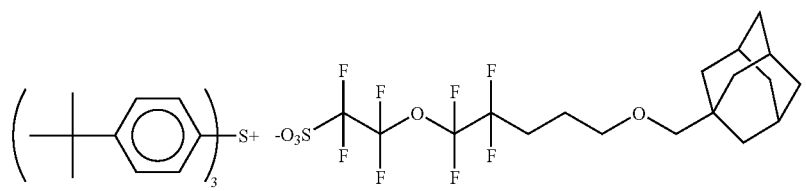
BaBc-8
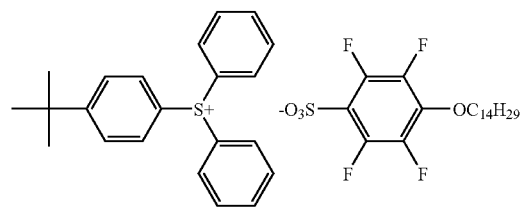
BaBc-9
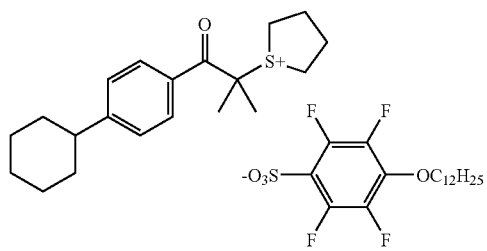
BaBc-10
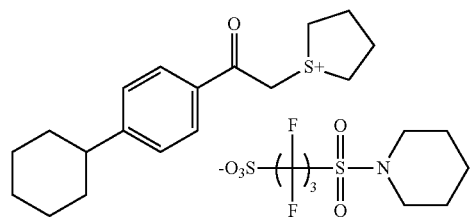
BaBc-11
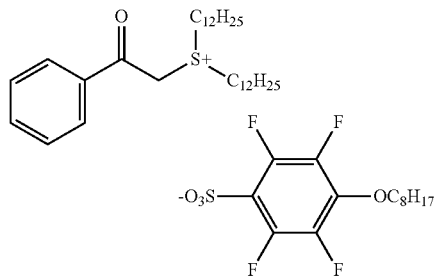
BaBc-12
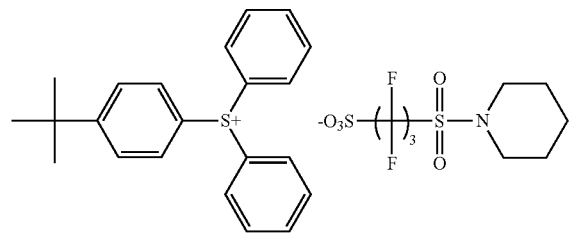
BaBc-13
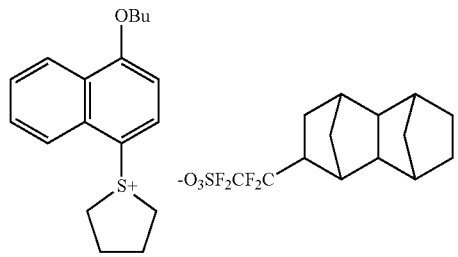
BbBc-1
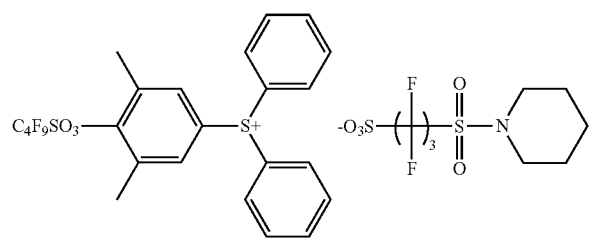

-continued
BbBc-2
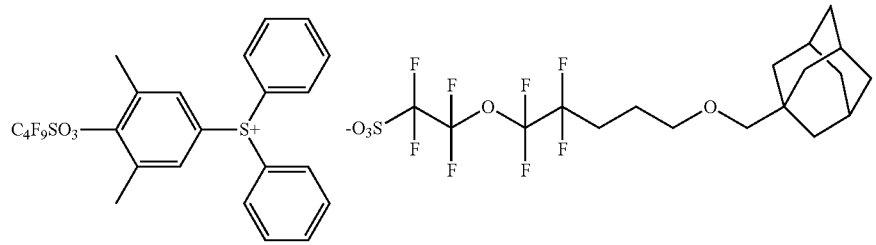
BbBc-3
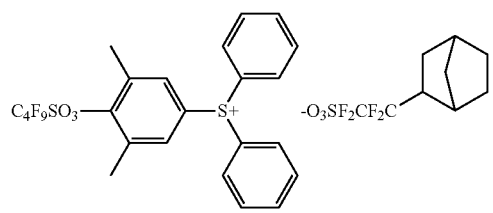
BbBc-4
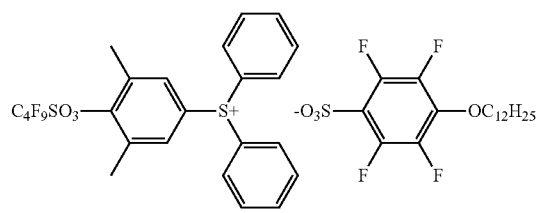
BbBc-5
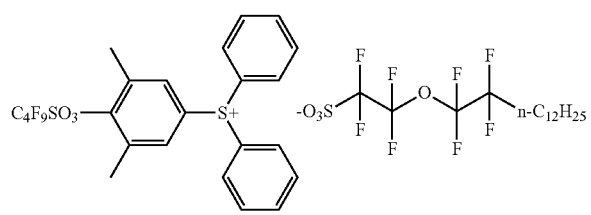
BbBc-6
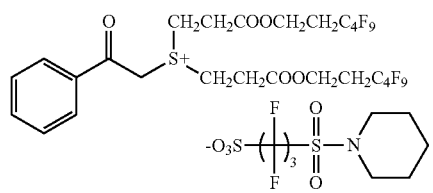
BbBc-7
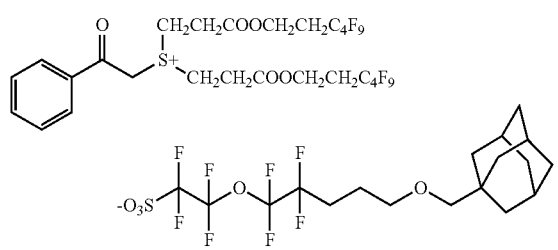
BbBc-8
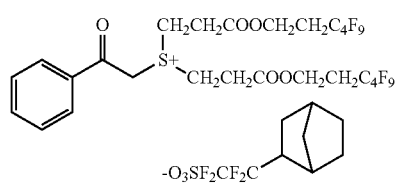
BbBc-9
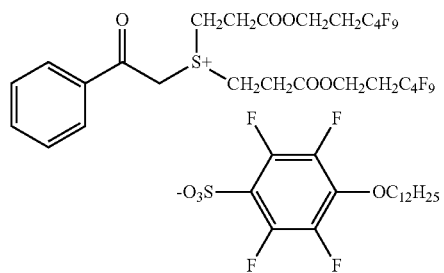
BbBc-10
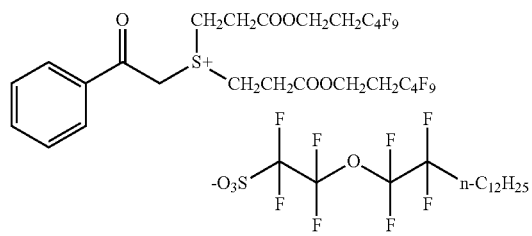
BbBc-11
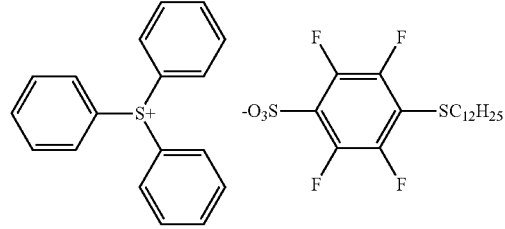
BbBc-12
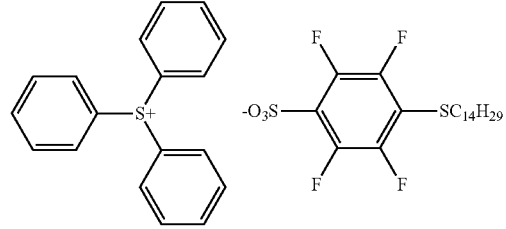

-continued
(PAG4-1)
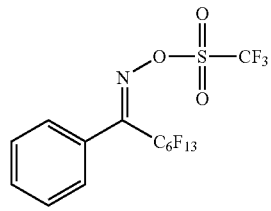
(PAG4-2)
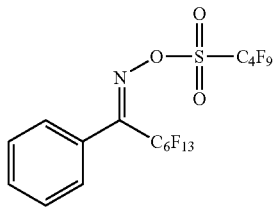
(PAG4-3)
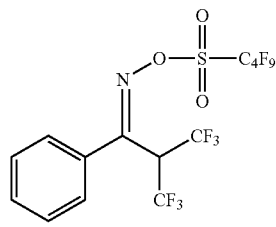
(PAG4-4)
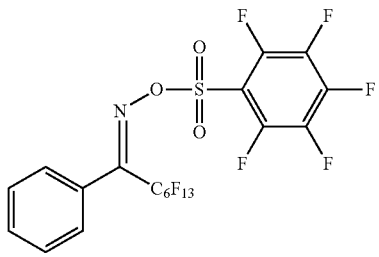
(PAG4-5)
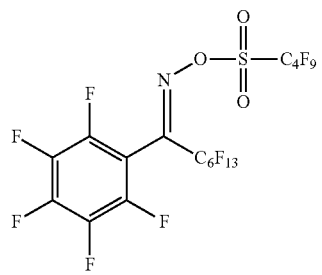
(PAG4-6)
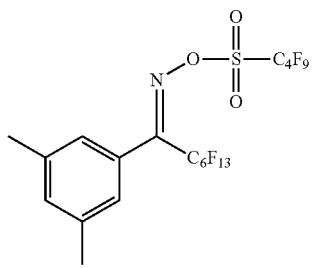
(PAG4-7)
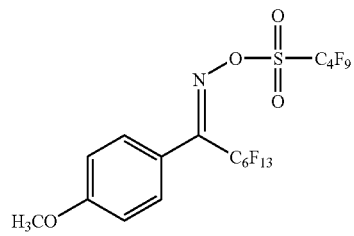
(PAG4-8)
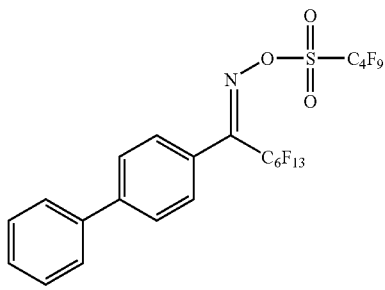
(PAG4-9)
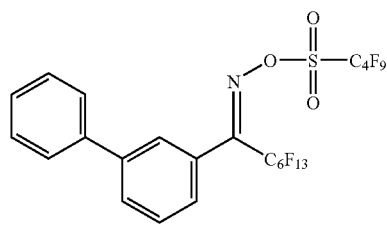
(PAG4-10)
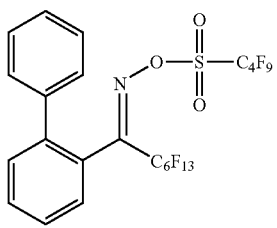
(PAG4-11)
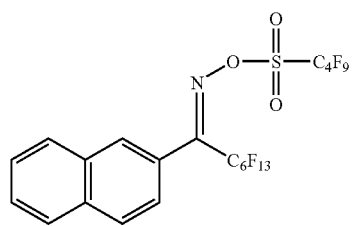
(PAG4-12)
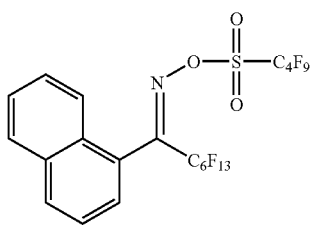

-continued
(PAG4-13)
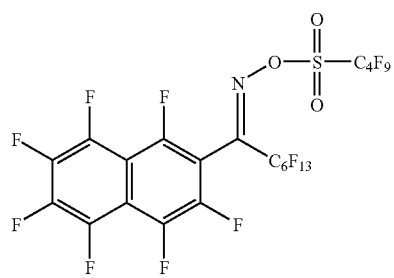
(PAG4-14)
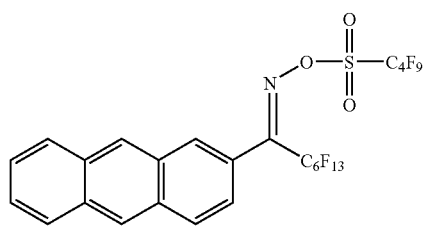
(PAG4-15)
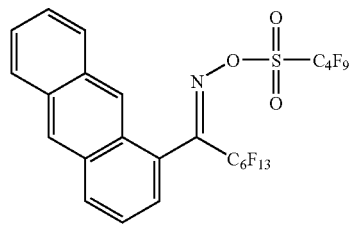
(PAG4-16)
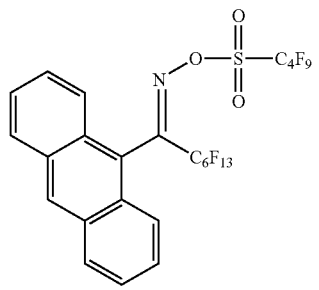
(PAG4-17)
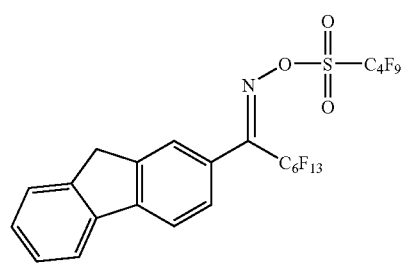
(PAG4-18)
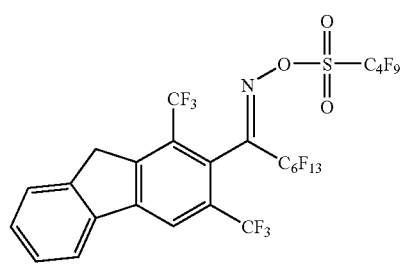
(PAG4-19)
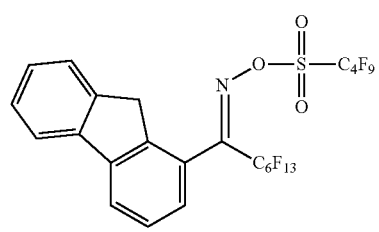
(PAG4-20)
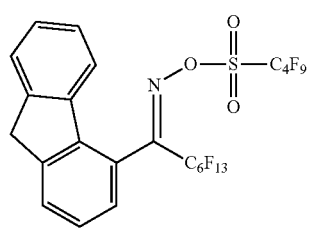
(PAG4-21)
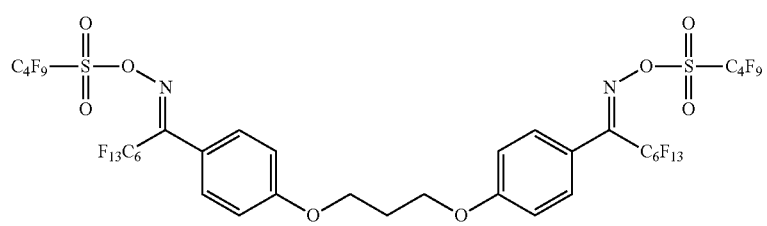
(PAG4-22)
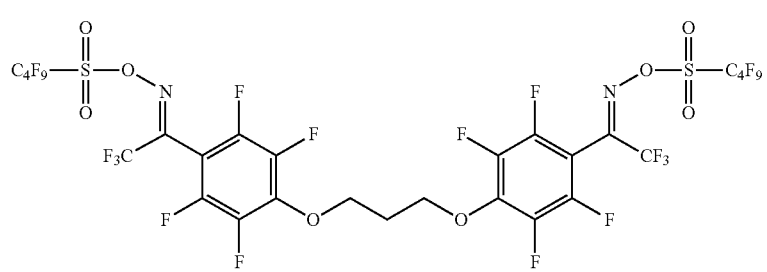

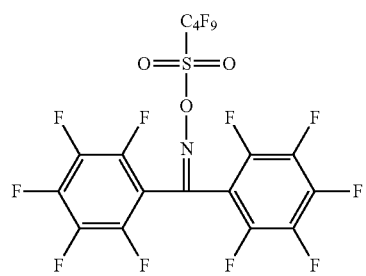
(PAG4-23)

These acid generators may be used either singly or in combination of two or more thereof.

The content of the acid generator in the positive resist composition is preferably from 0.1 to 20 mass %, more preferably from 0.5 to 10 mass %, still more preferably from 1 to 7 mass % based on the total solid content of the positive resist composition.

[3] (C) Solvent:

The positive resist composition of the present invention is used by dissolving the individual components in a predetermined solvent.

Examples of the solvent usable therefor include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofuran.

In the present invention, although these solvents may be used singly or as a mixture, it is preferred to use a mixed solvent containing two or more solvents different in a functional group. As such a mixed solvent having different functional groups, a mixed solvent obtained by mixing a solvent having, in the structure thereof, a hydroxyl group with a solvent having no hydroxyl group or a mixed solvent obtained by mixing a solvent having an ester structure with a solvent having a ketone structure is preferred. Using such a solvent can reduce generation of particles when the resist solution is stored.

Examples of the solvent having a hydroxyl group include ethylene glycol, ethylene glycol monomethyl ether, ethylene glycol monoethyl ether, propylene glycol, propylene glycol monomethyl ether, propylene glycol monoethyl ether, and ethyl lactate. Of these, propylene glycol monomethyl ether and ethyl lactate are preferred.

Examples of the solvent having no hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide, and dimethyl sulfoxide. Of these, propylene glycol monomethyl ether acetate, ethyl ethoxypropionate, 2-heptanone, γ-butyrolactone, cyclohexanone, and butyl acetate are more preferred, with propylene glycol monomethyl ether acetate, ethyl ethoxypropionate, 2-heptanone, and cyclohexanone being especially preferred.

A mixing ratio (by mass) of the solvent having a hydroxyl group to the solvent having no hydroxyl group is usually from 1/99 to 99/1, preferably from 10/90 to 90/10, more preferably from 20/80 to 60/40. A mixed solvent containing 50 mass % or greater of the solvent having no hydroxyl group is preferred from the standpoint of the coating uniformity.

In the mixed solvent obtained by mixing a solvent having an ester structure with a solvent having a ketone structure, examples of the solvent having a ketone structure include cyclohexanone and 2-heptanone, with cyclohexanone being preferred. Examples of the solvent having an ester structure include propylene glycol monomethyl ether acetate, ethyl ethoxypropionate, γ-butyrolactone, and butyl acetate, with propylene glycol monomethyl ether acetate being preferred.

A mixing ratio (by mass) of the solvent having an ester structure to the solvent having a ketone structure is usually from 1/99 to 99/1, preferably from 10/90 to 90/10, more preferably from 20/80 to 60/40. A mixed solvent containing 50 mass % or greater of the solvent having an ester structure is especially preferred from the standpoint of the coating uniformity.

[4] (D) Basic Compound:

The positive resist composition of the present invention preferably contains a basic compound in order to reduce a change in performance with the passage of time from exposure to heating.

Preferred examples of the basic compound include compounds having a structure represented by any of the following formulas (A) to (E):

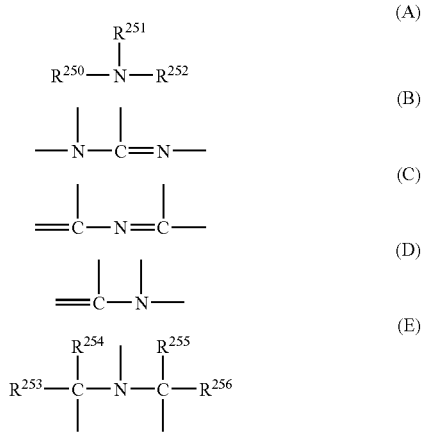

In the above formulas, $R^{250}$, $R^{251}$ and $R^{252}$ each independently represents a hydrogen atom, an alkyl group having from 1 to 20 carbon atoms, a cycloalkyl group having from 3 to 20 carbon atoms, or an aryl group having from 6 to 20 carbon atoms. $R^{250}$ and $R^{251}$ may be coupled together to form a ring. These groups may each have a substituent. As the alkyl group or cycloalkyl group having a substituent, aminoalkyl groups having from 1 to 20 carbon atoms and hydroxyalkyl groups having from 1 to 20 carbon atoms; or aminocycloalkyl groups having from 3 to 20 carbon atoms and hydroxycycloalkyl groups having from 3 to 20 carbon atoms are preferred, respectively.

These groups may contain, in the alkyl chain thereof, an oxygen atom, a sulfur atom or a nitrogen atom.

In the above formulas, $R^{253}$, $R^{254}$, $R^{255}$, and $R^{256}$ each independently represents an alkyl group having from 1 to 20 carbon atoms or a cycloalkyl group having from 3 to 20 carbon atoms.

Preferred examples of the compounds include guanidine, aminopyrrolidine, pyrazole, pyrazoline, piperazine, aminomorpholine, aminoalkylmorpholines, and piperidine and they may have a substituent. More preferred examples of the compounds include compounds having an imidazole structure, a diazabicyclo structure, an onium hydroxide structure, an onium carboxylate structure, a trialkylamine structure, an aniline structure, or a pyridine structure, alkylamine derivatives having a hydroxyl group and/or an ether bond, and aniline derivatives having a hydroxyl group and/or an ether bond.

Examples of the compound having an imidazole structure include imidazole, 2,4,5-triphenylimidazole, and benzimidazole. Examples of the compound having a diazabicyclo structure include 1,4-diazabicyclo[2,2,2]octane, 1,5-diazabicyclo[4,3,0]non-5-ene, and 1,8-diazabicyclo[5,4,0]undec-7-ene. Examples of the compound having an onium hydroxide structure include triarylsulfonium hydroxides, phenacyl sulfonium hydroxides, and sulfonium hydroxides having a 2-oxoalkyl group, more specifically, triphenyl sulfonium hydroxide, tris(t-butylphenyl)sulfonium hydroxide, bis(t-butylphenyl)iodonium hydroxide, phenacylthiophenium hydroxide, and 2-oxopropylthiophenium hydroxide. The compound having an onium carboxylate structure is a compound in which anion moiety of a compound having an onium hydroxide structure is replaced to a carboxylate and examples include acetates, adamantane-1-carboxylate, and perfluoroalkyl carboxylates. Examples of the compound having a trialkylamine structure include tri(n-butyl)amine and tri(n-octyl)amine. Examples of the aniline compound include 2,6-diisopropylaniline and N,N-dimethylaniline. Examples of the alkylamine derivative having a hydroxyl group and/or an ether bond include ethanolamine, diethanolamine, triethanolamine, and tris(methoxyethoxyethyl)amine. Examples of the aniline derivative having a hydroxyl group and/or an ether bond include N,N-bis(hydroxyethyl)aniline.

In the positive resist composition of the present invention, these basic compounds may be used either singly or in combination of two or more thereof. The amount of the basic compound is, in total, usually from 0.001 to 10 mass %, preferably from 0.01 to 5 mass % based on the solid content of the positive resist composition. The amount of the basic compound is preferably 0.001 mass % or greater in order to achieve a sufficient addition effect and is preferably 10 mass % or less in view of the sensitivity and developability of an unexposed area.

[5] (E) Dissolution Inhibiting Compound which Decomposes Under The Action of An Acid to Increase Its Solubility in An Alkaline Developer and Has a Molecular Weight of 3000 or Less (This Compound may Hereinafter be Called "Component (E)" or "Dissolution Inhibiting Compound")

As a dissolution inhibiting compound (E) which decomposes under the action of an acid to increase its solubility in an alkaline developer and has a molecular weight of 3000 or less, alicyclic or aliphatic compounds containing an acid decomposable group, such as cholic acid derivatives containing an acid decomposable group as described in *Proceeding of SPIE*, 2724, 355 (1996) are preferred in order to prevent deterioration of permeability at 220 nm or less. The acid decomposable group and the alicyclic structure are similar to those described above in the alicyclic hydrocarbon based acid decomposable resin.

When the positive resist composition of the present invention is exposed to a KrF excimer laser or an electron beam, phenolic compounds whose phenolic hydroxyl group is substituted with an acid decomposable group are preferred. The phenolic compounds contain preferably from 1 to 9 phenolic skeletons, more preferably from 2 to 6 phenol skeletons.

In the present invention, the dissolution inhibiting compound has a molecular weight of 3000 or less, preferably from 300 to 3,000, more preferably from 500 to 2,500.

The amount of the dissolution inhibiting compound is preferably from 3 to 50 mass %, more preferably from 5 to 40 mass % based on the solid content of the positive resist composition.

The following are specific examples of the dissolution inhibiting compound, but the present invention is not limited thereto.

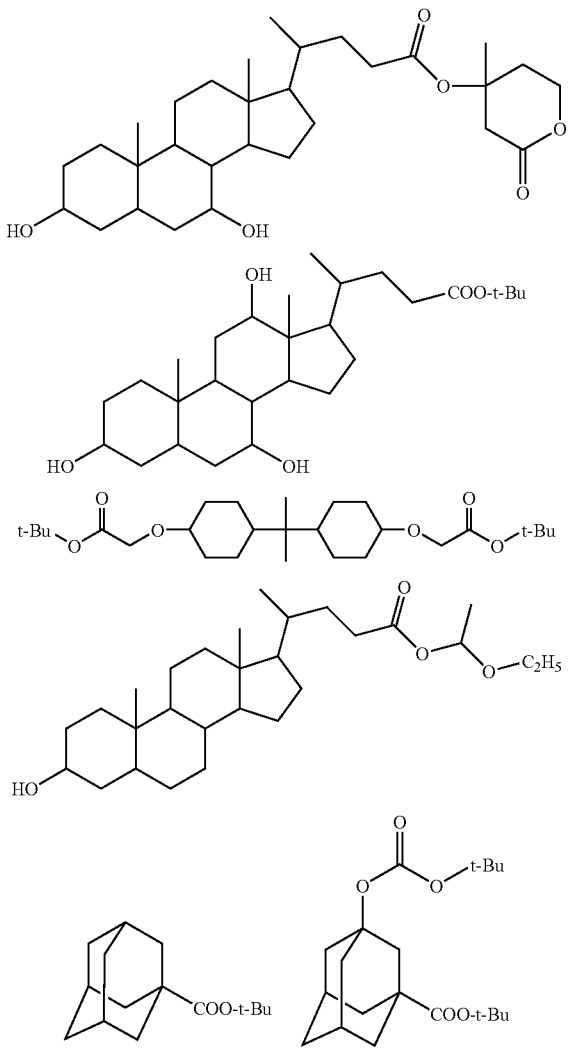

-continued

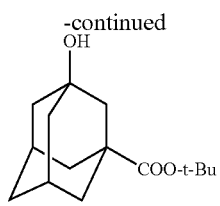

[6] (F) Surfactant:

The positive resist composition of the present invention contains preferably a surfactant, more preferably any of a fluorine-based and/or silicon-based surfactant (a fluorine-based surfactant, a silicon-based surfactant, and a surfactant containing both a fluorine atom and a silicon atom) or two or more of them.

The positive resist composition of the present invention containing a fluorine-based and/or silicon-based surfactant can provide a resist pattern having adhesion and less development defects while showing good sensitivity and resolution when exposed to a light source of 250 nm or less, especially 220 nm or less.

Examples of the fluorine based and/or silicon based surfactant include surfactants as described in Japanese Patent Laid-Open No. Sho 62-36663, Japanese Patent Laid-Open No. Sho 61-226746, Japanese Patent Laid-Open No. Sho 61-226745, Japanese Patent Laid-Open No. Sho 62-170950, Japanese Patent Laid-Open No. Sho 63-34540, Japanese Patent Laid-Open No. Hei 7-230165, Japanese Patent Laid-Open No. Hei 8-62834, Japanese Patent Laid-Open No. Hei 9-54432, Japanese Patent Laid-Open No. Hei 9-5988, Japanese Patent Laid-Open No. 2002-277862, U.S. Pat. Nos. 5,405,720, 5,360,692, 5,529,881, 5,296,330, 5,436,098, 5,576,143, 5,294,511, and 5,824,451. The following commercially available surfactants can also be used as they are.

Examples of the commercially available surfactant usable for the composition include fluorine-based surfactants and silicon-based surfactants such as EFTOP EF301 and EF303 (each, product of Shin-Akita Kasei Co., Ltd.), FLUORAD FC430, FC431, and FC4430 (each, product of Sumitomo 3M Limited), MEGAFACE F171, F173, F176, F189, F113, F110, F177, F120, and R08 (each, product of Dainippon Ink and Chemicals, Incorporated), SURFLON S-382, SC101, SC102, SC103, SC104, SC105, and SC106 (each, product of Asahi Glass Co., Ltd.), TROYSOL S-366 (product of Troy Chemical Company), GF-300 and GF-150 (each, product of TOAGOSEI CO., Ltd.), SURFLON S-393 (product of AGC SEIMI CHEMICAL CO., LTD.), EFTOP EF121, EF122A, EF122B, RF122C, EF125M, EF135M, EF351, EF352, EF801, EF802, and EF601 (each, product of Jemco Inc.), PF636, PF656, PF6320, and PF 6520 (each, OMNOVA Solutions Inc.), and FTX-204D, 208G, 218G, 230G, 204D, 208D, 212D, 218, and 222D (each, NEOS Company Limited). Also, a polysiloxane polymer, KP-341 (product of Shin-Etsu Chemical Co., Ltd.) can also be used as the silicon based surfactant.

Also, as the surfactant, in addition to the known surfactants described above, surfactants using a polymer having a fluoro aliphatic group derived from fluoro aliphatic compounds manufactured by a telomerization method (also called a telomer method) or an oligomerization method (also called an oligomer method) can be used. The fluoro aliphatic compound can be obtained by the method described in Japanese Patent Laid-Open No. 2002-90991.

As the polymer having a fluoro aliphatic group, copolymers of a monomer having a fluoro aliphatic group and a (poly(oxyalkylene)) acrylate and/or a (poly(oxyalkylene)) methacrylate are preferred. They may be distributed irregularly or block copolymerized. Examples of the poly(oxyalkylene) group include a poly(oxyethylene) group, a poly(oxypropylene) group, and a poly(oxybutylene) group. A unit having alkylenes having a different chain length within the same chain length, such as poly(oxyethylene/oxypropylene/oxyethylene blocks connected) and poly(oxyethylene/oxypropylene blocks connected) may also be used. Furthermore, the copolymer of a monomer having a fluoro aliphatic group and a (poly(oxyalkylene)) acrylate (or methacrylate) may be not only a binary copolymer but also a ternary or multi-component copolymer available by simultaneous copolymerization of two or more monomers different in the kind of a fluoro aliphatic group, or two or more (poly(oxyalkylene)) acrylates (or methacrylates) different from each other.

Examples of commercially available surfactants include MEGAFACE F 178, F-470, F-473, F-475, F-476, and F-472 (each, product of Dainippon Ink and Chemicals, Incorporated). Additional examples include copolymers of a $C_6F_{13}$-containing acrylate (or methacrylate) and a (poly(oxyalkylene)) acrylate (or methacrylate), copolymers of a $C_6F_{13}$-containing acrylate (or methacrylate), (poly(oxyethylene)) acrylate (or methacrylate) and (poly(oxypropylene)) acrylate (or methacrylate), copolymers of a $C_8F_{17}$-containing acrylate (or methacrylate) and a (poly(oxyalkylene)) acrylate (or methacrylate), and copolymers of a $C_8F_{17}$-containing acrylate (or methacrylate), (poly(oxyethylene)) acrylate (or methacrylate), and (poly(oxypropylene)) acrylate (or methacrylate).

In the present invention, surfactants other than the fluorine-based and/or silicon-based surfactants can also be used. Specific examples include nonionic surfactants, e.g., polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene octylphenol ether and polyoxyethylene nonylphenol ether, polyoxyethylene/polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate.

These surfactants may be used singly or in combination of some of them.

The amount of the surfactant is preferably from 0.0001 to 2 mass %, more preferably from 0.001 to 1 mass % relative to the whole amount (excluding the solvent) of the positive resist composition.

<Other Additives>

The positive resist composition of the present invention may contain a dye, a light absorber, a plasticizer, a surfactant other than the above-described component (F), a photosensitizer, a compound capable of accelerating its solubility in a developer, and the like as needed.

The dissolution accelerating compound in a developer which compound can be used in the present invention is a low molecular weight compound having two or more phenolic OH groups or one or more carboxyl groups and having a molecular weight of 1000 or less. When the compound has a carboxyl group, it is preferably an alicyclic or aliphatic compound.

The amount of such a dissolution accelerating compound is preferably from 2 to 50 mass %, more preferably from 5 to 30 mass % relative to the resin (A). The amount is preferably 50 mass % or less in order to reduce a development residue and inhibit pattern deformation upon development.

Such a phenolic compound having a molecular weight of 1000 or less can be easily synthesized by those skilled in the art by referring to the method described in, for example, Japanese Patent Laid-Open No. Hei 4-122938, Japanese Patent Laid-Open No. Hei 2-28531, U.S. Pat. No. 4,916,210, and European Patent No. 219,294.

Specific examples of the carboxyl-containing alicyclic or aliphatic compound include carboxylic acid derivatives having a steroid structure, such as cholic acid, deoxycholic acid and lithocholic acid, adamantanecarboxylic acid derivatives, adamantanedicarboxylic acid, cyclohexanecarboxylic acid, and cyclohexanedicarboxylic acid. However, the present invention is not limited thereto.

As the plasticizer, in addition to the commercially available plasticizers, any compound can be used without particular limitation insofar as it is compatible with the polymer to be used, is effective for reducing the softening point of the film, and has a molecular weight not greater than 1000. From the viewpoint of compatibility, the compound has a molecular weight of preferably 750 or less, more preferably 500 or less. The compound has preferably a boiling point of 300° C. or greater and a melting point of 20° C. or less at normal pressure. Specific examples of the compound include diisobutyl phthalate, tricresyl phosphate, triethylene glycol diphenyl ether, diethylene glycol dibenzoate, and triethylene glycol diacetate.

As the light absorber, any compound can be used without particular limitation insofar as it has absorption at the exposure wavelength and does not generate an acid when exposed to light. When the wavelength of a light source is 193 nm, compounds having an aromatic ring are preferred. Specific examples of the compounds include benzene derivatives, naphthalene derivatives, anthracene derivatives, furan derivatives, thiophene derivatives, and indole derivatives.

When a photosensitive film composed of the photosensitive composition of the present invention is exposed to light through an immersion medium, a hydrophobic resin (HR) can be added further as needed. The hydrophobic resin (HR) thus added is localized in the surface layer of the photosensitive film and, when the immersion medium is water, it improves a receding contact angle on the surface of the photosensitive film with water, thereby improving the followability to water used as the immersion medium. Although any resin can be added as the hydrophobic resin (HR) insofar as it is effective for improving the receding contact angle on the surface, a resin having at least one of a fluorine atom and a silicon atom is preferred. The receding contact angle of the photosensitive film is from 60° to 80°, preferably 70° or greater. The amount of the hydrophobic resin can be adjusted as needed so that the receding contact angle of the photosensitive film falls within the above-described range. The amount is preferably from 0.1 to 10 mass %, more preferably from 0.1 to 5 mass % based on the total solid content of the photosensitive composition.

In order to prevent direct contact of the resist film with the immersion liquid, a film which is sparingly soluble in the immersion liquid (which may hereinafter be called "top coat") may be provided between the resist film formed using the resist composition of the present invention and the immersion liquid. Examples of functions necessary for the top coat include coating aptitude to the upper layer of the resist, transparency to radiation, particularly, to that of 193 nm and sparing solubility in the immersion liquid. The top coat is preferably not miscible with the resist and can be uniformly applied onto the upper layer of the resist.

From the viewpoint of the transparency to radiation of 193 nm, a polymer not containing an abundant amount of an aromatic moiety is preferred as the top coat. Specific examples include hydrocarbon polymers, acrylic acid ester polymers, polymethacrylic acid, polyacrylic acid, polyvinyl ether, silicon-containing polymers, and fluorine-containing polymers. The above-described hydrophobic resin (HR) is also suited for use as the top coat. The top coat contains residual monomer components of the polymer in an amount as small as possible because impurities leached from the top coat into the immersion liquid may contaminate an optical lens.

For the removal of the top coat, a developer may be used, or a stripping agent may be used separately. As the stripping agent, a solvent that poorly penetrates into the photosensitive film is preferred. Removal with an alkaline developer is preferred because the removal step and a development step of the photosensitive film can be performed simultaneously. From the viewpoint of removing the top coat with an alkaline developer, the top coat is preferably acidic. However, it may be either neutral or alkaline from the standpoint of immiscibility with the photosensitive film.

As a difference in refractive index between the top coat and the immersion liquid is smaller, the resolution is enhanced. In an ArF excimer laser (wavelength: 193 nm), when water is used as the immersion liquid, the top coat for ArF immersion exposure has a refractive index close to the immersion liquid. From the viewpoint of making a refractive index of the top coat close to that of the immersion liquid, the top coat has preferably a fluorine atom. In addition, from the viewpoints of the transparency and refractive index, the top coat is preferably a thin film.

It is preferred that the top coat neither mixes with the photosensitive film nor mixes with the immersion liquid. From this viewpoint, when the immersion liquid is water, a solvent to be used for the top coat is preferably a medium sparingly soluble in the solvent to be used for the photosensitive composition and insoluble in water. When the immersion liquid is an organic solvent, on the other hand, the top coat may be either soluble in water or insoluble in water.

<Hydrophobic Resin (HR)>

The resist composition of the present invention may contain a hydrophobic resin (HR) for making the surface hydrophobic. As such a hydrophobic resin (HR), a resin having at least one of a fluorine atom and a silicon atom is preferred. The hydrophobic resin (HR) is also suited for use as the top coat.

The resin (HR) may have, in the main chain or side chain thereof, a fluorine atom or silicon atom.

The resin (HR) has, as a fluorine-containing partial structure, preferably a fluorine-containing alkyl group, a fluorine-containing cycloalkyl group, or a fluorine-containing aryl group.

The fluorine-containing alkyl group (having preferably from 1 to 10 carbon atoms, more preferably from 1 to 4 carbon atoms) is a linear or branched alkyl group in which at least one hydrogen atom is substituted with a fluorine atom and it may have another substituent further.

The fluorine-containing cycloalkyl group is a monocyclic or polycyclic cycloalkyl group in which at least one hydrogen atom is substituted with a fluorine atom and it may have another substituent further.

The fluorine-containing aryl group is an aryl group such as phenyl or naphthyl in which at least one hydrogen atom is substituted with a fluorine atom and it may have another substituent further.

Specific examples of the fluorine-containing alkyl group, the fluorine-containing cycloalkyl group, and the fluorine-containing aryl group include groups represented by the following formulas (F2) to (F4), but the present invention is not limited thereto.

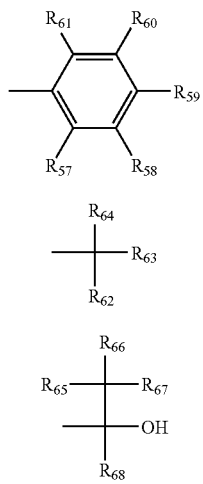

(F2)

(F3)

(F4)

In the formulas (F2) to (F4), $R_{57}$ to $R_{68}$ each independently represents a hydrogen atom, a fluorine atom, or an alkyl group, with the proviso that at least one of $R_{57}$ to $R_{61}$, $R_{62}$ to $R_{64}$ and $R_{65}$ to $R_{68}$ represents a fluorine atom or an alkyl group (having preferably from 1 to 4 carbon atoms) in which at least one hydrogen atom is substituted with a fluorine atom. It is preferred that all of $R_{57}$ to $R_{61}$ and $R_{65}$ to $R_{67}$ are a fluorine atom. Each of $R_{62}$, $R_{63}$ and $R_{68}$ is preferably an alkyl group (having preferably from 1 to 4 carbon atoms) in which at least one hydrogen atom is substituted with a fluorine atom, more preferably a perfluoroalkyl group having from 1 to 4 carbon atoms. $R_{62}$ and $R_{63}$ may be coupled together to form a ring.

Specific examples of the group represented by the formula (F2) include a p-fluorophenyl group, a pentafluorophenyl group, and a 3,5-di(trifluoromethyl)phenyl group.

Specific examples of the group represented by the formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, and a perfluorocyclohexyl group. Of these, a hexafluoroisopropyl group, a heptafluoroisopropyl group, a hexafluoro(2-methyl)isopropyl group, an octafluoroisobutyl group, a nonafluoro-t-butyl group, and a perfluoroisopentyl group are preferred, with a hexafluoroisopropyl group and a heptafluoroisopropyl group being more preferred.

Specific examples of the group represented by the formula (F4) include —C(CF$_3$)$_2$OH, —C(C$_2$F$_5$)$_2$OH, —C(CF$_3$)(CH$_3$)OH and —CH(CF$_3$)OH, with —C(CF$_3$)$_2$OH being preferred.

The following are specific examples of the recurring unit containing a group represented by any of the formulas (F2) to (F4). In the formula, $X_1$ represents a hydrogen atom, —CH$_3$, —F or —CF$_3$ and $X_2$ represents —F or —CF$_3$.

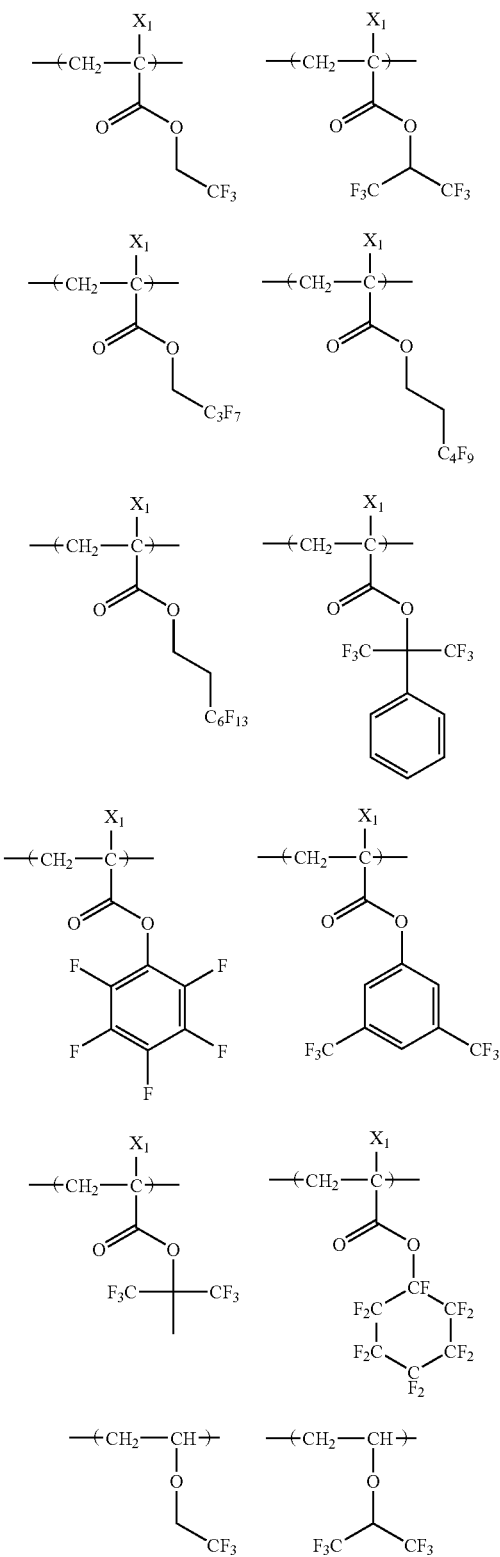

-continued

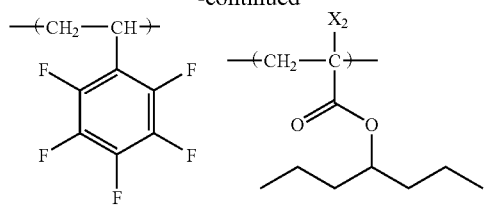

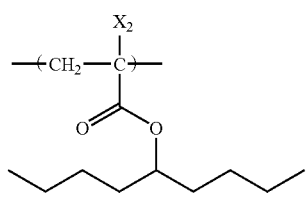

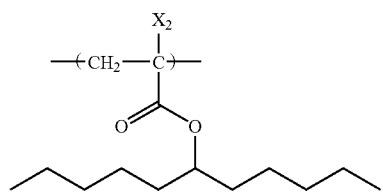

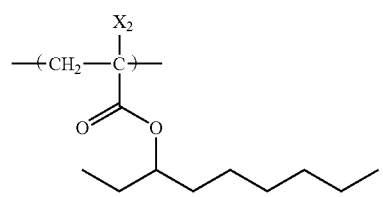

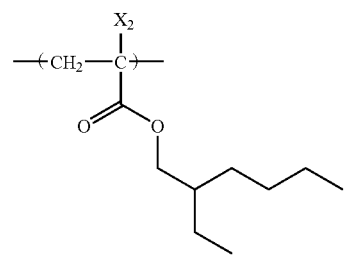

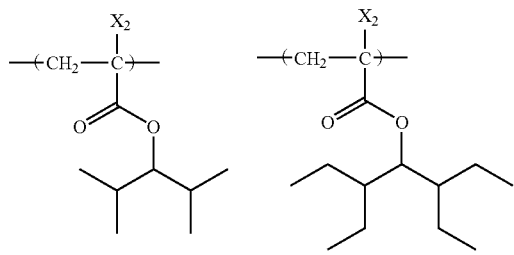

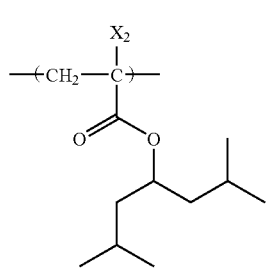

-continued

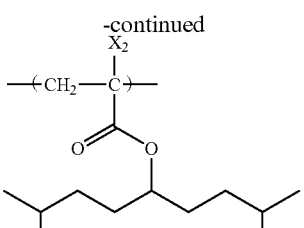

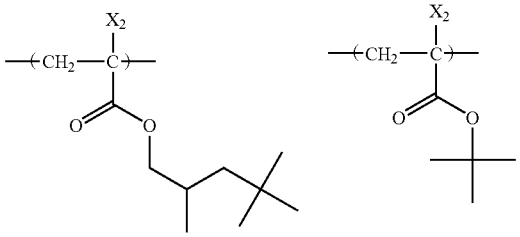

The resin (HR) has preferably an alkylsilyl structure (preferably a trialkylsilyl group) or a cyclic siloxane structure as the partial structure having a silicon atom.

Specific examples of the alkylsilyl structure and the cyclic siloxane structure include groups represented by the following formulas (CS-1) to (CS-3).

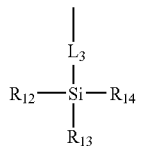
(CS-1)

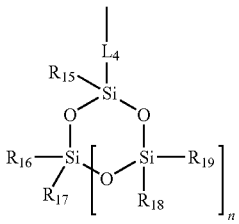
(CS-2)

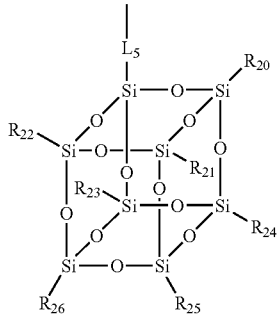
(CS-3)

In the formulas (CS-1) to (CS-3), $R_{12}$ to $R_{26}$ each independently represents a linear or branched alkyl group (having preferably from 1 to 20 carbon atoms) or a cycloalkyl group (having preferably from 3 to 20 carbon atoms).

$L_3$ to $L_5$ each represents a single bond or a divalent linking group. Examples of the divalent linking group include one group or combination of two or more groups selected from the group consisting of alkylene groups, phenyl groups, ether groups, thioether groups, a carbonyl group, ester groups, an amide group, a urethane group, and a urea group.
n stands for an integer of from 1 to 5.
The following are specific examples of the recurring unit containing a group represented by any of the formulas (CS-1) to (CS-3).
$X_1$ represents a hydrogen atom, —$CH_3$, —F, or —$CF_3$.
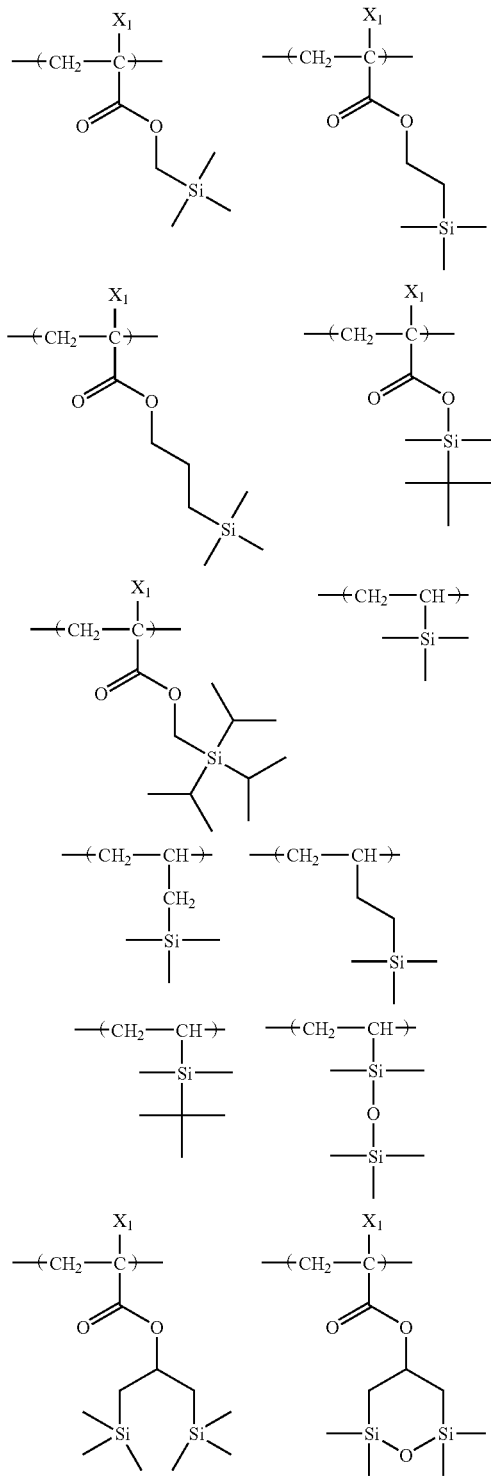
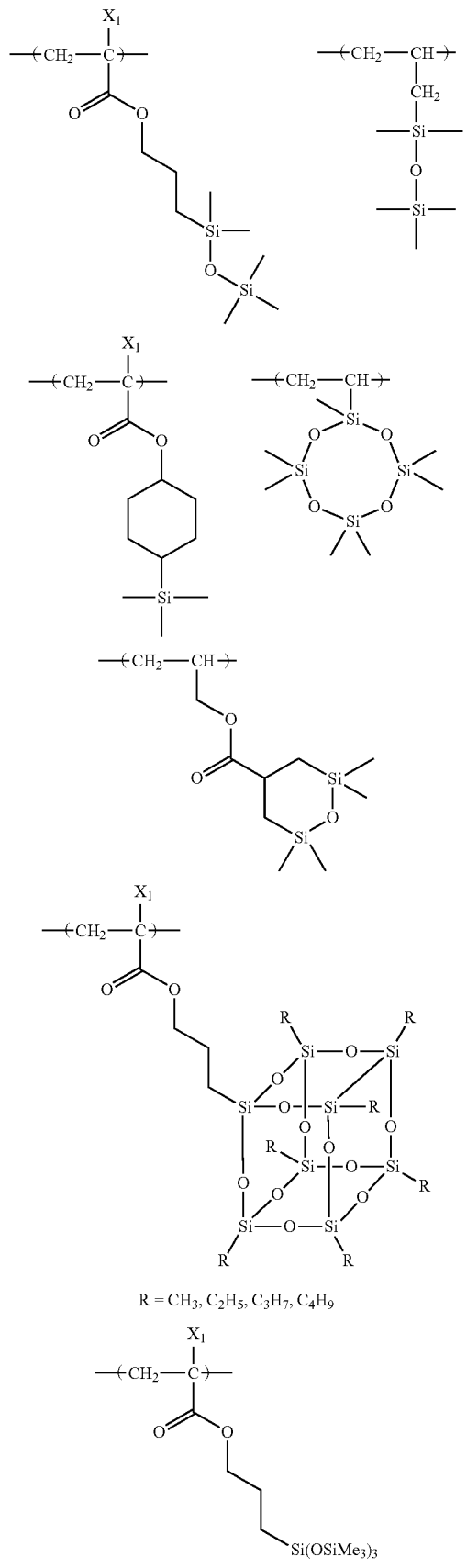
R = $CH_3$, $C_2H_5$, $C_3H_7$, $C_4H_9$ Further, the resin (HR) may contain at least one group selected from the group consisting of the following groups (x) to (z):

(x) alkali soluble groups,
(y) groups which decompose under the action of an alkaline developer to increase their solubility in the alkaline developer, and
(z) groups which decompose under the action of an acid.

Examples of the alkali soluble groups (x) include groups having a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsuofonyl)imide group, a tris(alkylcarbonyl)methylene group, or a tris(alkylsulfonyl)methylene group.

Preferred examples of the alkali soluble group include fluorinated alcohol groups (preferably hexafluoroisopropanol), a sulfonimide group, and a bis(carbonyl)methylene group.

As the recurring unit having the alkali soluble group (x), preferred is any of a recurring unit in which an alkali soluble group is directly bound to the main chain of a resin, such as a recurring unit of acrylic acid or methacrylic acid; a recurring unit in which an alkali soluble group is bound to the main chain of a resin via a linking group; and a recurring unit introduced in to the end of the polymer chain by using a polymerization initiator or chain transfer agent having an alkali soluble group upon polymerization.

The content of the recurring unit having the alkali soluble group (x) is preferably from 1 to 50 mol %, more preferably from 3 to 35 mol %, still more preferably from 5 to 20 mol % based on all the recurring units in the resin (HR).

The following are specific examples of the recurring unit having the alkali soluble group (x). In the formulas, $R_x$ represents H, $CH_3$, $CF_3$ or $CH_2OH$.

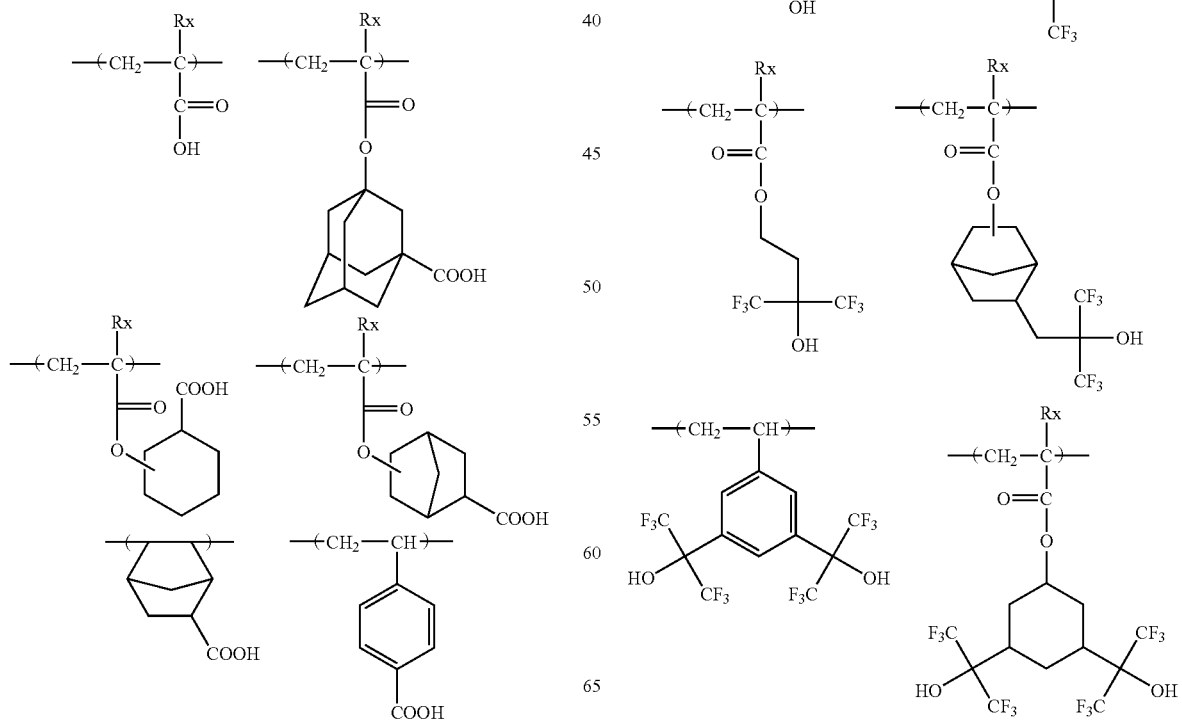

Examples of the groups (y) which decompose under the action of an alkaline developer to increase their solubility in the alkaline developer include groups having a lactone structure, acid anhydrides, and acid imide groups. Of these, a lactone group is preferred.

As the recurring unit having the group (y) which decomposes under the action of an alkaline developer to increase its solubility in the alkaline developer, preferred is any of a recurring unit in which an alkali soluble group is bound to the main chain of a resin via a linking group, such as a recurring unit of acrylate or methacrylate; and a recurring unit introduced into the end group of the polymer chain by using a polymerization initiator or chain transfer agent having the group (y) which increases its solubility in the alkaline solution.

The content of the recurring unit having the group (y) which increase its solubility in the alkaline developer is preferably from 1 to 40 mol %, more preferably from 3 to 30 mol %, still more preferably from 5 to 15 mol % based on all the recurring units in the resin (HR).

Specific examples of the recurring unit having the group (y) which increases its solubility in the alkaline developer include recurring units similar to those having a lactone structure as described in the resin (A) and those having a structure represented by the formula (VIII).

Examples of the recurring unit containing the group (z) which decomposes under the action of an acid include recurring units similar to those having an acid-decomposable group as described in the resin (A).

The content of the recurring unit having the group (z) which decomposes under the action of an acid is preferably from 1 to 80 mol %, more preferably from 10 to 80 mol %, still more preferably from 20 to 60 mol % relative to all the recurring units in the resin (HR).

The resin (HR) may further have a recurring unit represented by the following formula (III):

$$\begin{array}{c}\text{(III)}\\ -\!\!\!-\!\!(CH_2-CH)\!\!-\!\!\!-\\ |\\ L_6\\ |\\ R_4\end{array}$$

In the formula (III), $R_4$ represents a group having an alkyl, cycloalkyl, alkenyl, or cycloalkenyl group.

$L_6$ represents a single bond or a divalent linking group.

In the formula (III), the alkyl group represented by $R_4$ is preferably a linear or branched alkyl group having from 3 to 20 carbon atoms.

The cycloalkyl group is preferably a cycloalkyl group having from 3 to 20 carbon atoms.

The alkenyl group is preferably an alkenyl group having from 3 to 20 carbon atoms.

The cycloalkenyl group is preferably a cycloalkenyl group having from 3 to 20 carbon atoms.

The divalent linking group represented by $L_6$ is preferably an alkylene group (having preferably from 1 to 5 carbon atoms) or an oxy group.

When the resin (HR) has a fluorine atom, the content of the fluorine atom is preferably from 5 to 80 mass %, more preferably from 10 to 80 mass % based on the molecular weight of the resin (HR). The content of the fluorine-containing recurring unit is preferably from 10 to 100 mass %, more preferably from 30 to 100 mass % in the resin (HR).

A weight average molecular weight, in terms of standard polystyrene, of the resin (HR) is preferably 1,000 to 100,000, more preferably from 1,000 to 50,000, still more preferably from 2,000 to 15,000.

The resin (HR) of course contains only a small amount of impurities such as metals. In addition, the content of residual monomers or oligomer components is preferably from 0 to 10 mass %, more preferably from 0 to 5 mass %, still more preferably from 0 to 1 mass %. When their content is small, a resist which is free from a temporal change in, for example, foreign substances in the solution or sensitivity can be obtained. Also, from the standpoint of the resolution, resist profile, side walls of resist pattern, roughness, and so on, the molecular weight distribution (Mw/Mn, which is also called "dispersity") is within a range of preferably from 1 to 5, more preferably from 1 to 3.

As the resin (HR), various commercially available products can be utilized or it can be synthesized in the conventional manner (for example, radical polymerization). Examples of the general synthesis process include batch polymerization in which monomer species and an initiator are dissolved in a solvent and the resulting solution is polymerized while heating; and dropwise addition polymerization in which a solution of monomer species and an initiator is added dropwise to a heated solvent over from 1 to 10 hours. Of these, dropwise addition polymerization is preferred. Examples of the reaction solvent include ethers such as tetrahydrofuran, 1,4-dioxane, and diisopropyl ether, ketones such as methyl ethyl ketone and methyl isobutyl ketone, ester solvents such as ethyl acetate, amide solvents such as dimethylformamide and dimethylacetamide, and solvents capable of dissolving therein the resist composition of the present invention which will be described later such as propylene glycol monomethyl ether acetate, propylene glycol monomethyl ether, and cyclohexanone. It is more preferred that the polymerization is carried out by using the same solvent as the solvent used in the resist composition of the present invention. This enables to suppress generation of particles during storage.

The polymerization reaction is carried out preferably in an inert gas atmosphere such as nitrogen and argon. The polymerization is initiated by using a commercially available radical initiator (for example, an azo based initiator or a peroxide) as the polymerization initiator. An azo based initiator is preferred as the radical initiator, and an azo based initiator having an ester group, a cyano group or a carboxyl group is preferred. Preferred examples of the initiator include azobisisobutyronitrile, azobisdimethylvaleronitrile, and dimethyl 2,2'-azobis(2-methylpropionate). The reaction concentration is from 5 to 50 mass %, preferably from 30 to 50 mass %. The reaction temperature is usually from 10° C. to 150° C., preferably from 30° C. to 120° C., more preferably from 60° C. to 100° C.

After completion of the reaction, the reaction mixture is allowed to cool to room temperature and then, purified. The reaction mixture is purified in a conventional method, for example, a method under a solution state such as liquid-liquid extraction to wash it with water or proper solvents used in combination and thereby remove residual monomers and oligomer components or ultrafiltration to extract and remove only substances having a molecular weight not greater than a specified value; or a method under a solid state such as reprecipitation to remove residual monomers and the like by adding dropwise the resin solution to a poor solvent to solidify the resin in the poor solvent or washing, with a poor solvent, a resin slurry separated by filtration. For example, the resin is brought into contact with a solvent in which the above resin is sparingly soluble or insoluble (poor solvent) in an amount of 10 times or less, preferably from 10 to 5 times of the reaction solution to precipitate it as a solid.

As the solvent (precipitation or reprecipitation solvent) to be used in the precipitation or reprecipitation operation from the polymer solution, any solvent is usable insofar as it is a poor solvent of the polymer. Depending on the kind of the polymer, it can be selected as needed from hydrocarbons, halogenated hydrocarbons, nitro compounds, ethers, ketones, esters, carbonates, alcohols, carboxylic acids, and water, and mixed solvents containing these solvents. Of these, solvents containing at least an alcohol (especially, methanol or the like) or water are preferred as the precipitation or reprecipitation solvent.

The amount of the precipitation or reprecipitation solvent can be selected as needed in consideration of its efficiency, yield or the like. It is usually from 100 to 10000 parts by mass, preferably from 200 to 2000 parts by mass, more preferably from 300 to 1000 parts by mass based on 100 parts by mass of the polymer solution.

Although the precipitation or reprecipitation temperature can be selected as needed in consideration of its efficiency or operability, it is usually from about 0 to 50° C., preferably around room temperature (for example, from about 20 to 35° C.). The precipitation or reprecipitation operation can be carried out by using a conventionally used mixing vessel such as stirring tank in a known manner such as a batchwise mode or a continuous mode.

The precipitated or reprecipitated polymer is usually subjected to conventional solid-liquid separation such as filtration or centrifugation, dried and then provided for use. The filtration is carried out preferably under a pressure while using a solvent-resistant filter material. The drying is carried out at a temperature of from about 30 to 100° C., preferably from about 30 to 50° C. at normal pressure or under reduced pressure (preferably under reduced pressure).

After the resin is separated by precipitation, the resulting precipitate may be dissolved in a solvent again, followed by contact with a solvent in which the resin is sparingly soluble or insoluble. Described specifically, the method may include the following steps: after completion of the radical polymerization reaction, bringing the reaction mixture into contact with a solvent in which the polymer is sparingly soluble or insoluble to precipitate the resin (step a); separating the resin from the solution (step b); dissolving the resin in the solvent again to prepare a resin solution A (step c); bringing the resin solution A into contact with a solvent in which the resin is sparingly soluble or insoluble while using the solvent in a volume amount less than 10 times of the resin solution A (preferably in a volume amount not greater than 5 times of the resin solution A) to precipitate a resin solid (step d); and separating thus precipitated resin (step e).

The following are specific examples of the resin (HR). The molar ratio of the recurring units (the number on the left side corresponds to the recurring unit of the formula shown in the left side), weight average molecular weight, and dispersity in each resin are shown in the following Table.

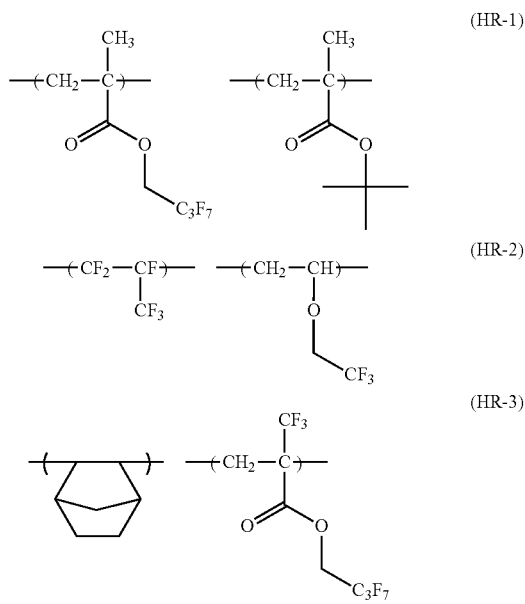

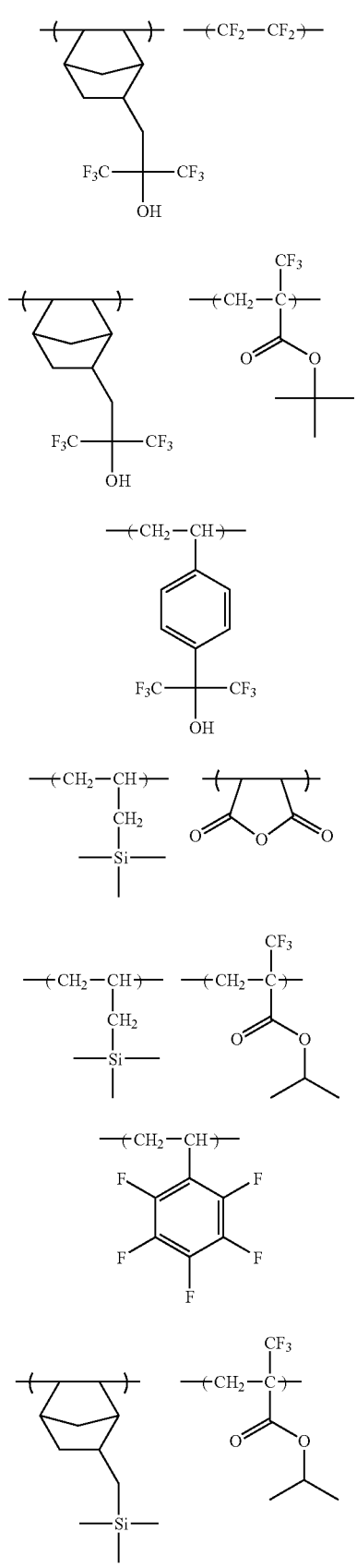
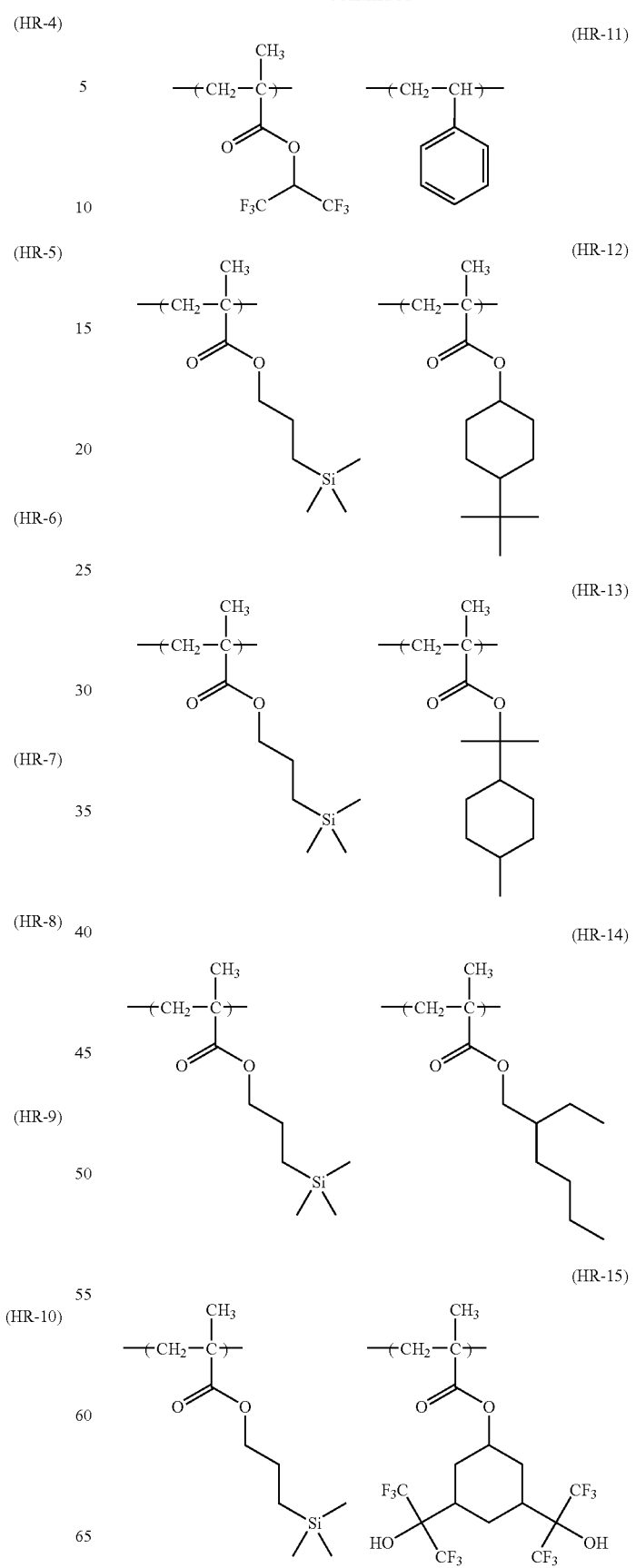

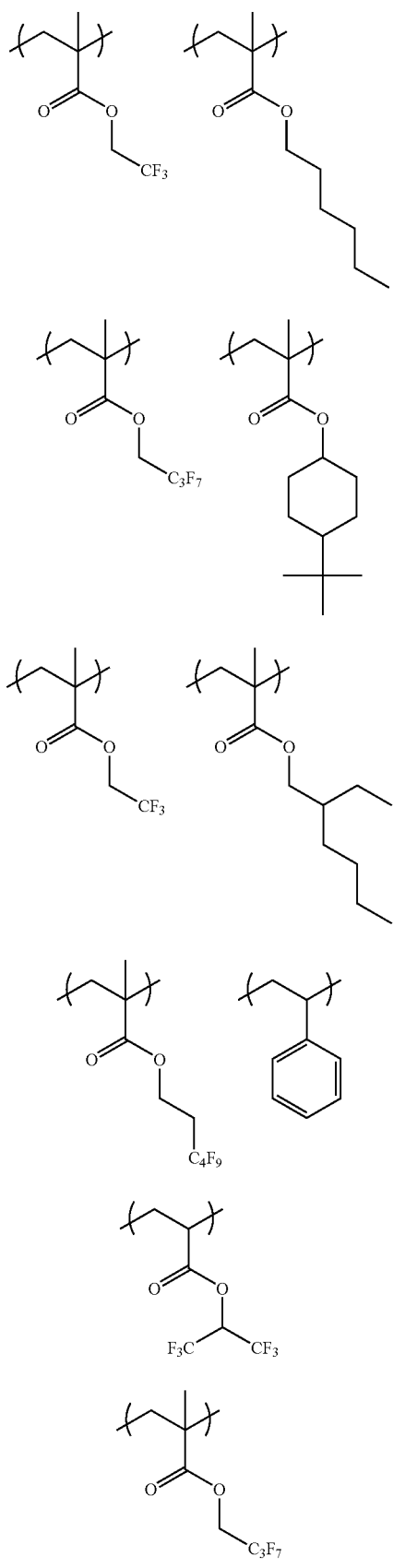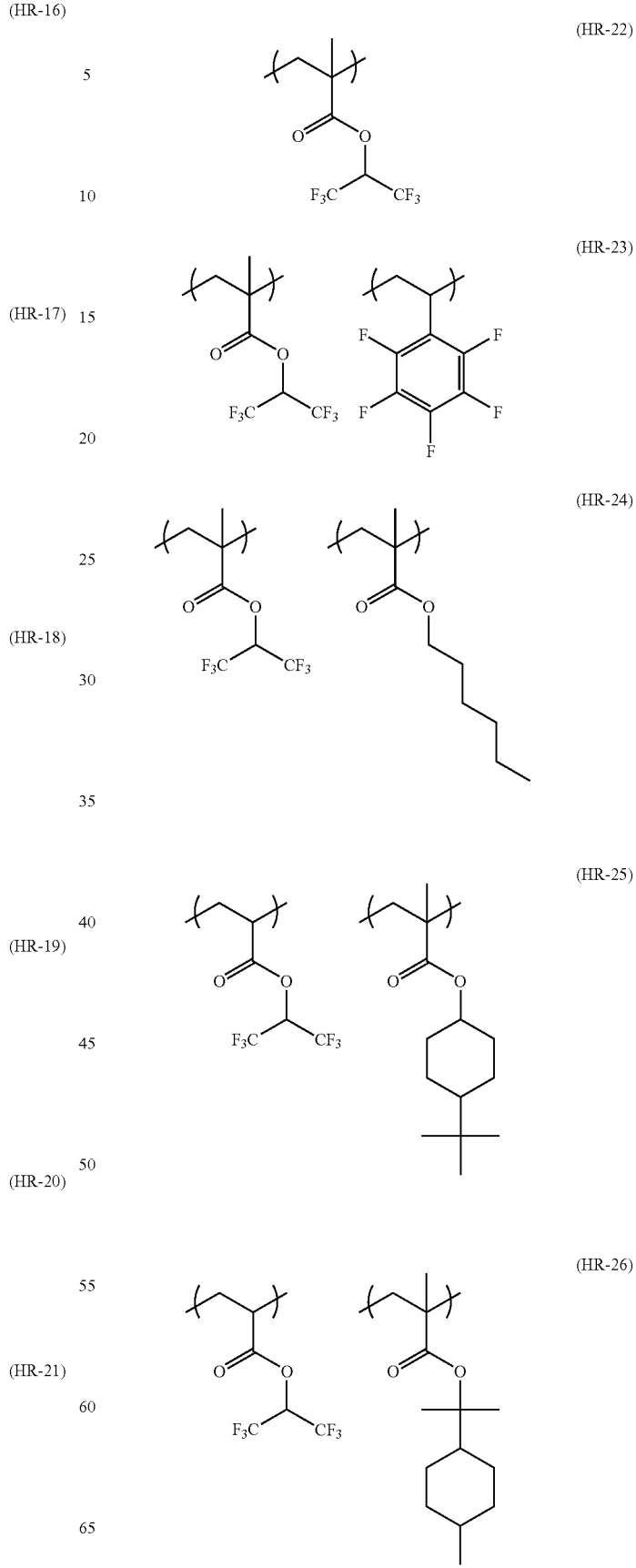

(HR-27) 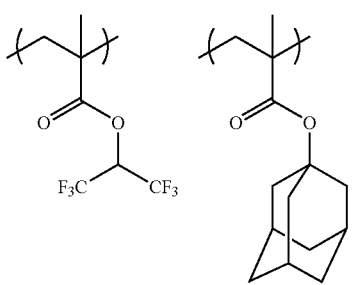
(HR-28) 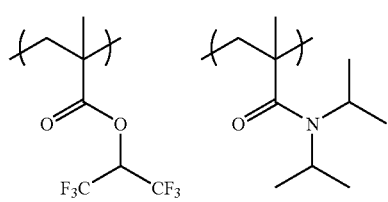
(HR-29) 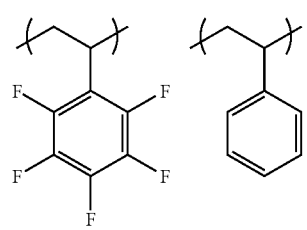
(HR-30) 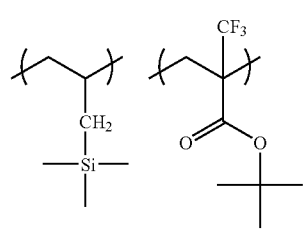
(HR-31) 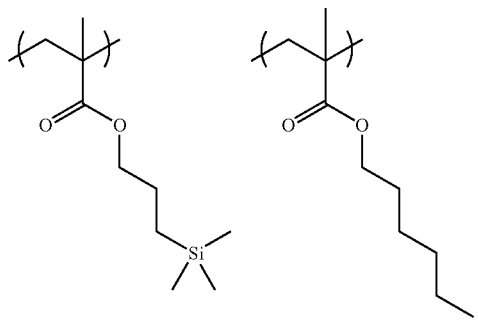
(HR-32) 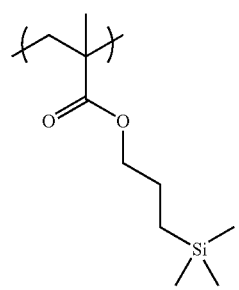
(HR-33) 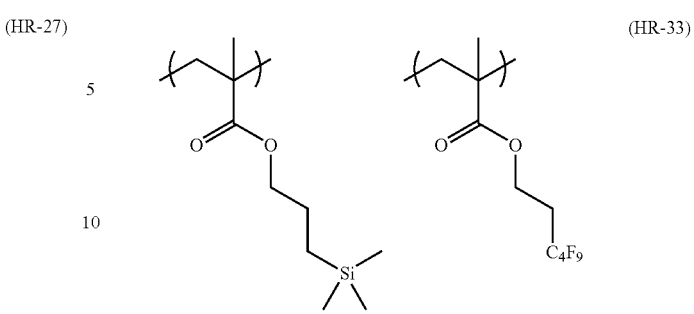
(HR-34) 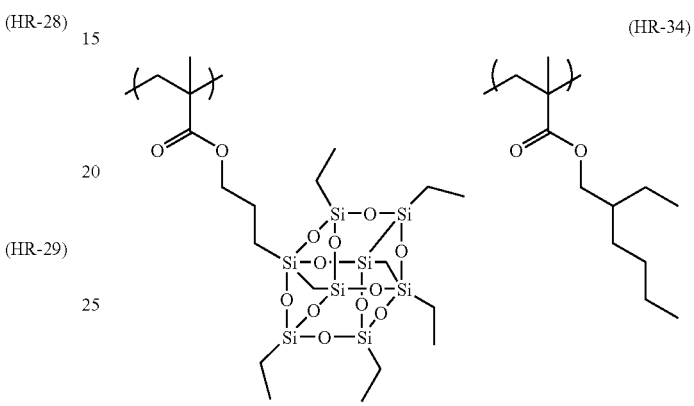
(HR-35) 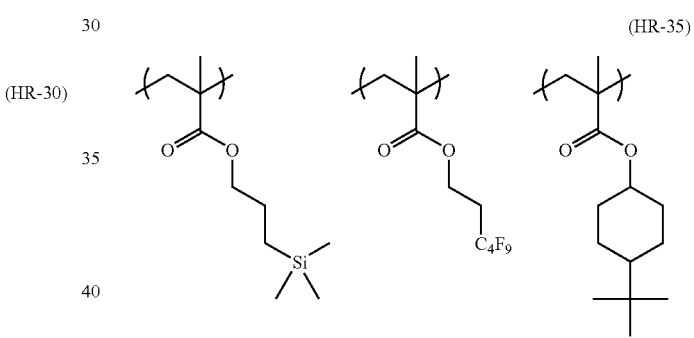
(HR-36) 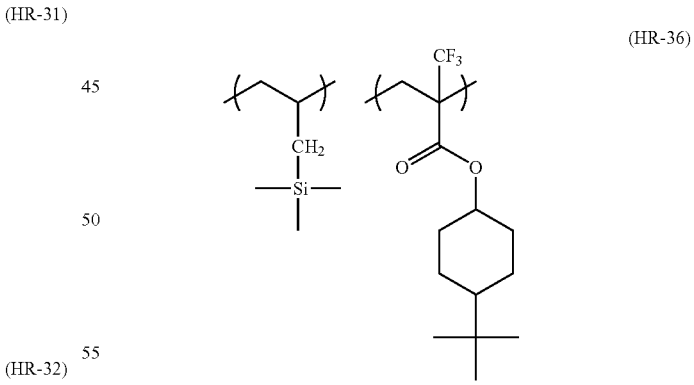
(HR-37) 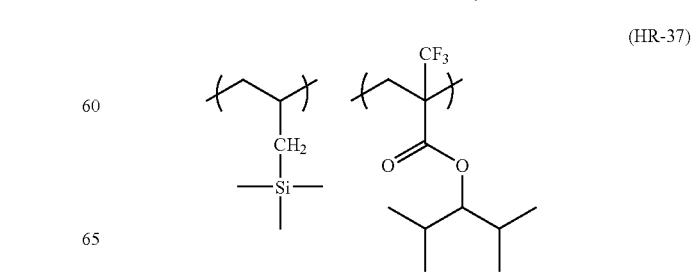

(HR-38) (HR-39) (HR-40) (HR-41) (HR-42) (HR-43) (HR-44) (HR-45) (HR-46) (HR-47) (HR-48)

(HR-49)
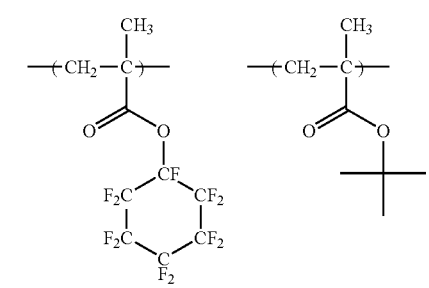
(HR-50)
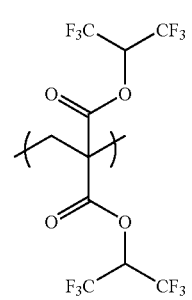
(HR-51)
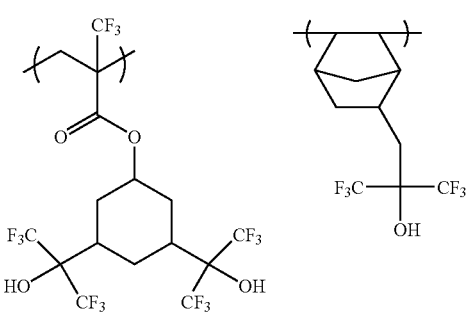
(HR-52)
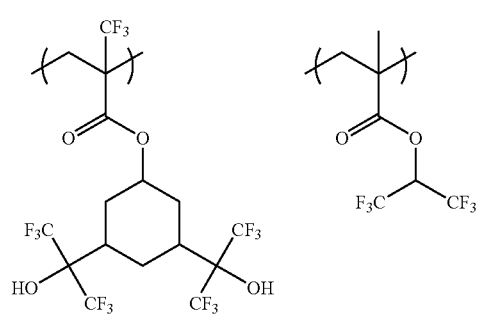
(HR-53)
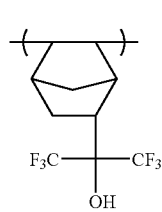
(HR-54)
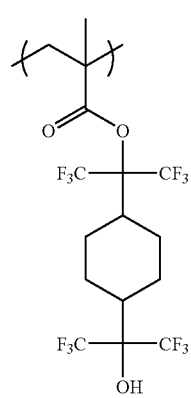
(HR-55)
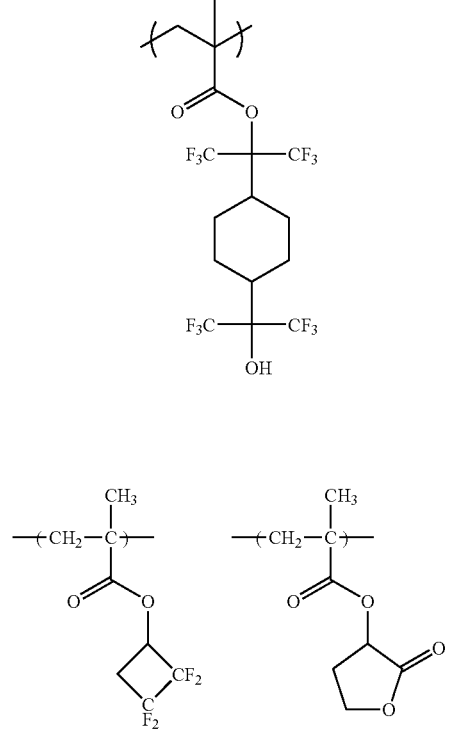
(HR-56)
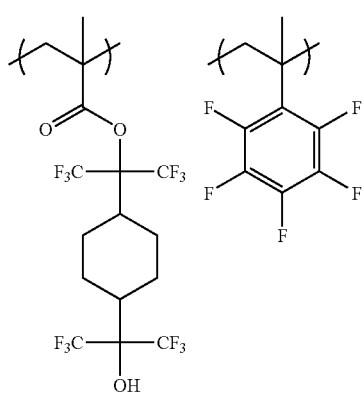
(HR-57)
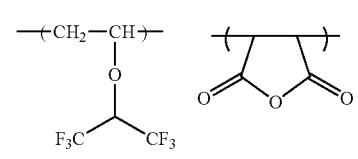
(HR-58)
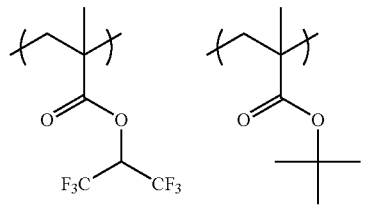

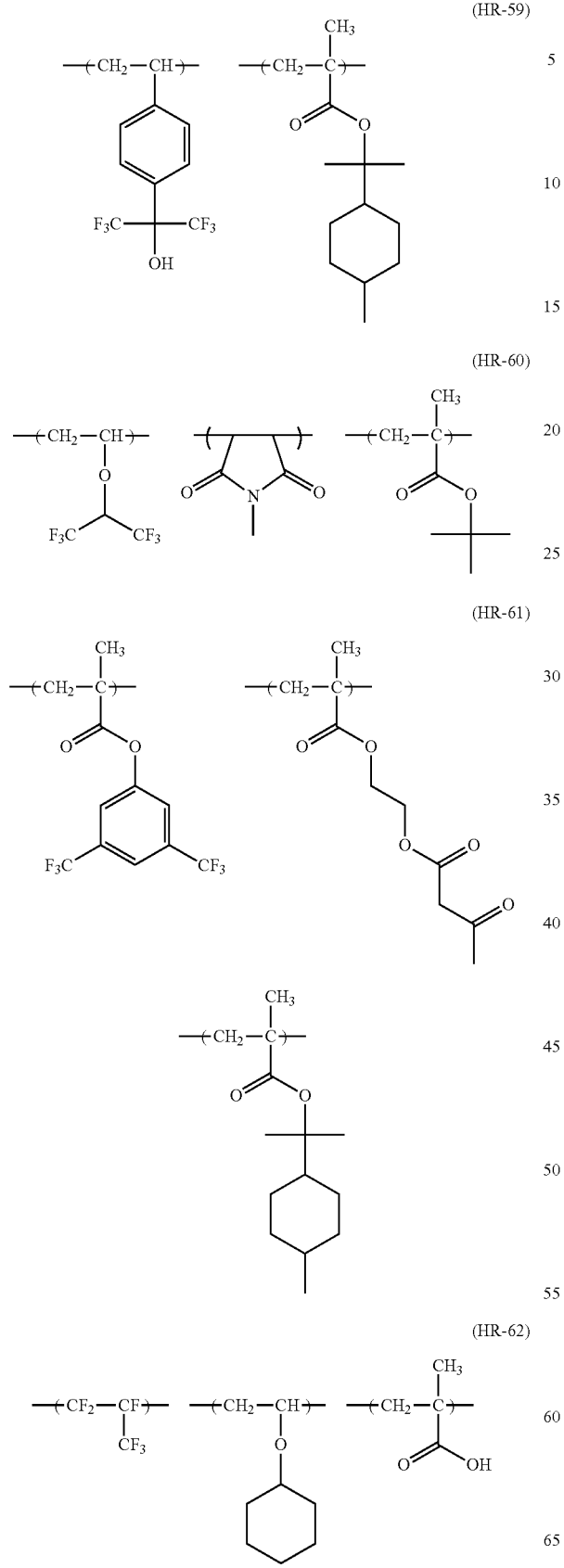
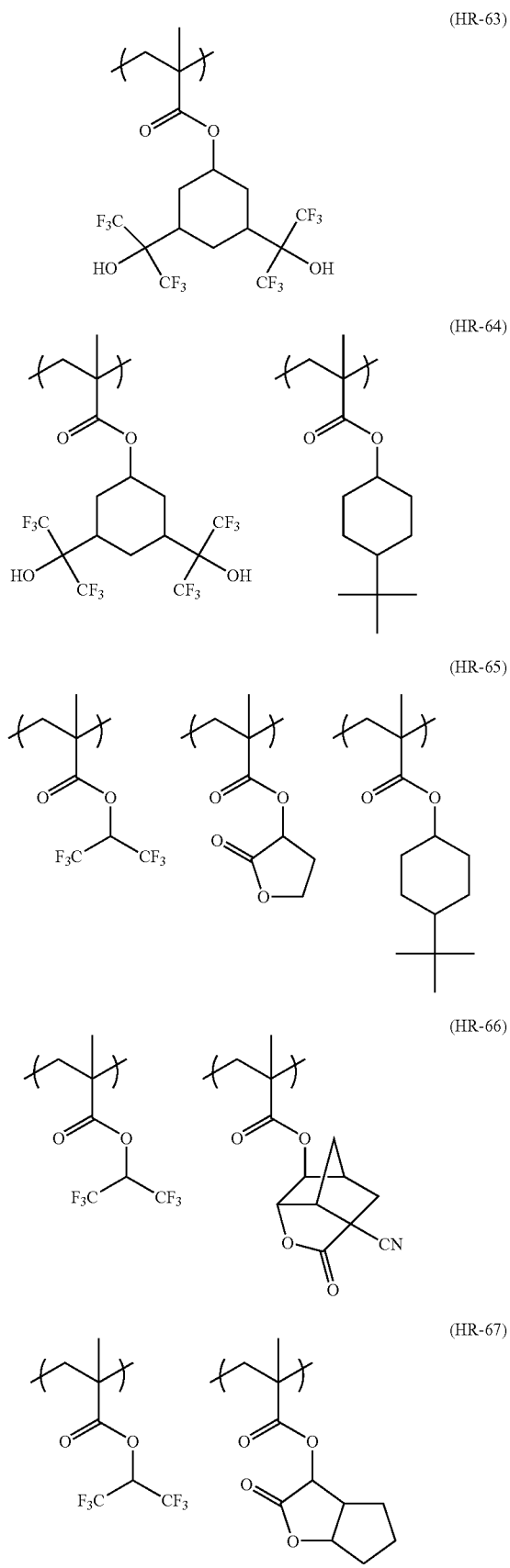

(HR-68)
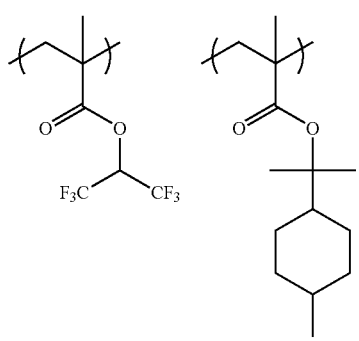
(HR-69)
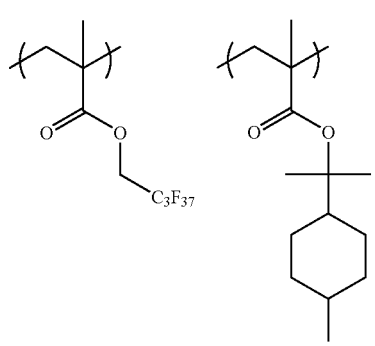
(HR-70)
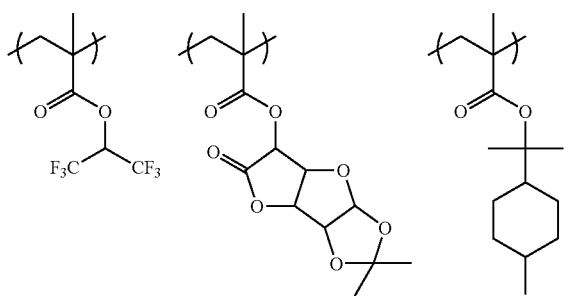
(HR-71)
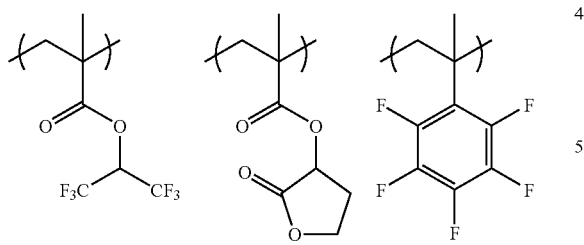
(HR-72)
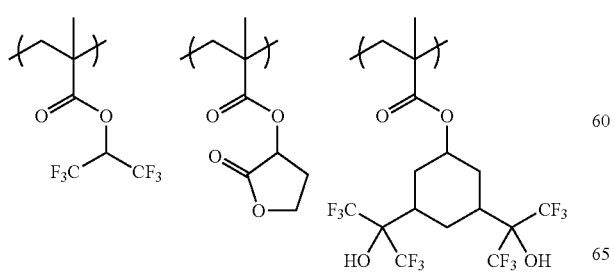
(HR-73)
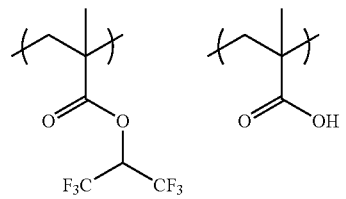
(HR-74)
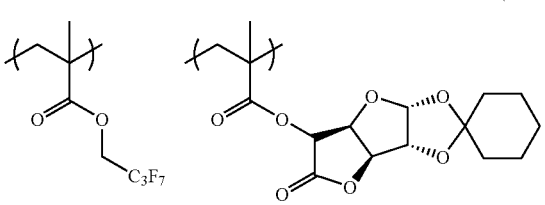
(HR-75)
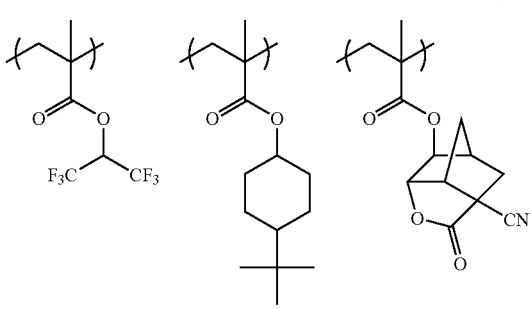
(HR-76)
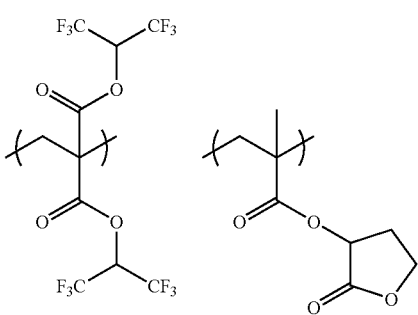
(HR-77)
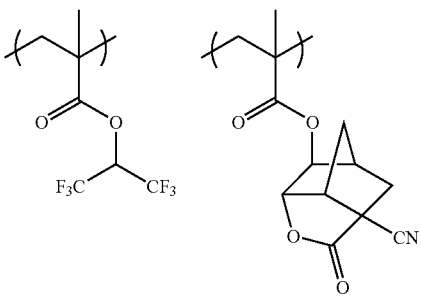

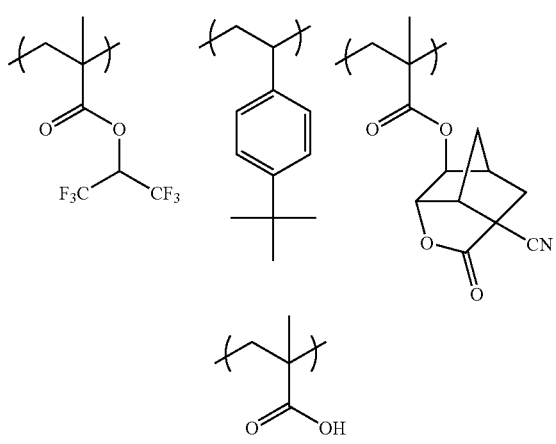
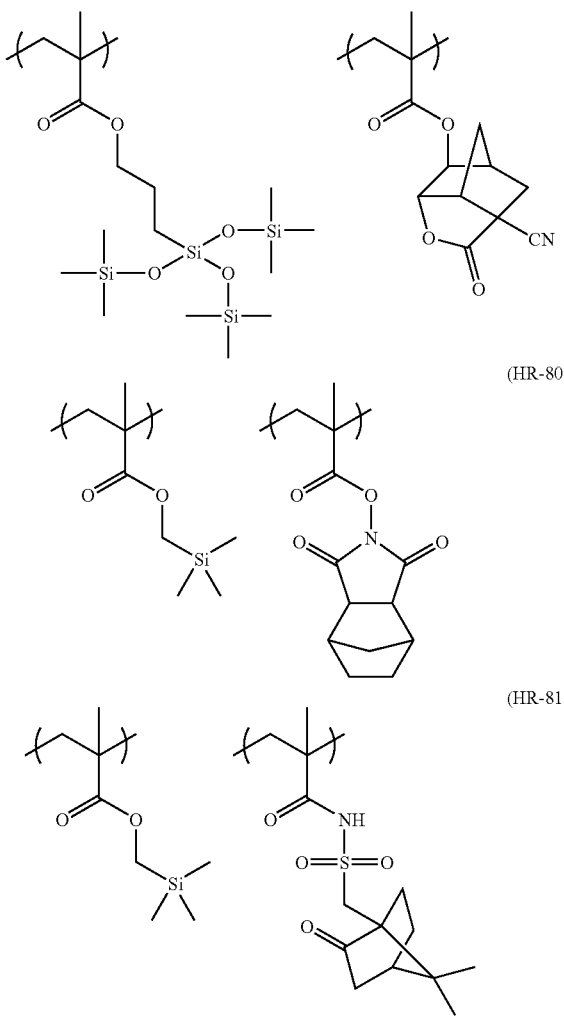
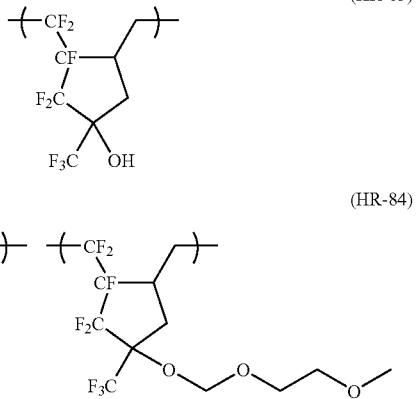
TABLE 1
| Resin | Composition | Mw | Mw/Mn |
|---|---|---|---|
| HR-1 | 50/50 | 8800 | 2.1 |
| HR-2 | 50/50 | 5200 | 1.8 |
| HR-3 | 50/50 | 4800 | 1.9 |
| HR-4 | 50/50 | 5300 | 1.9 |
| HR-5 | 50/50 | 6200 | 1.9 |
| HR-6 | 100 | 12000 | 2.0 |
| HR-7 | 50/50 | 5800 | 1.9 |
| HR-8 | 50/50 | 6300 | 1.9 |
| HR-9 | 100 | 5500 | 2.0 |
| HR-10 | 50/50 | 7500 | 1.9 |
| HR-11 | 70/30 | 10200 | 2.2 |
| HR-12 | 40/60 | 15000 | 2.2 |
| HR-13 | 40/60 | 13000 | 2.2 |
| HR-14 | 80/20 | 11000 | 2.2 |
| HR-15 | 60/40 | 9800 | 2.2 |
| HR-16 | 50/50 | 8000 | 2.2 |
| HR-17 | 50/50 | 7600 | 2.0 |
| HR-18 | 50/50 | 12000 | 2.0 |
| HR-19 | 20/80 | 6500 | 1.8 |
| HR-20 | 100 | 6500 | 1.2 |
| HR-21 | 100 | 6000 | 1.6 |
| HR-22 | 100 | 2000 | 1.6 |
| HR-23 | 50/50 | 6000 | 1.7 |
| HR-24 | 50/50 | 8800 | 1.9 |
| HR-25 | 50/50 | 7800 | 2.0 |
| HR-26 | 50/50 | 8000 | 2.0 |
| HR-27 | 80/20 | 8000 | 1.8 |
| HR-28 | 30/70 | 7000 | 1.7 |
| HR-29 | 50/50 | 6500 | 1.6 |
| HR-30 | 50/50 | 6500 | 1.6 |
| HR-31 | 50/50 | 9000 | 1.8 |
| HR-32 | 100 | 10000 | 1.6 |
| HR-33 | 70/30 | 8000 | 2.0 |
| HR-34 | 10/90 | 8000 | 1.8 |
| HR-35 | 30/30/40 | 9000 | 2.0 |
| HR-36 | 50/50 | 6000 | 1.4 |
| HR-37 | 50/50 | 5500 | 1.5 |
| HR-38 | 50/50 | 4800 | 1.8 |
| HR-39 | 60/40 | 5200 | 1.8 |
| HR-40 | 50/50 | 8000 | 1.5 |
| HR-41 | 20/80 | 7500 | 1.8 |
| HR-42 | 50/50 | 6200 | 1.6 |
| HR-43 | 60/40 | 16000 | 1.8 |
| HR-44 | 80/20 | 10200 | 1.8 |
| HR-45 | 50/50 | 12000 | 2.6 |
| HR-46 | 50/50 | 10900 | 1.9 |
| HR-47 | 50/50 | 6000 | 1.4 |
| HR-48 | 50/50 | 4500 | 1.4 |
| HR-49 | 50/50 | 6900 | 1.9 |
| HR-50 | 100 | 2300 | 2.6 |
| HR-51 | 60/40 | 8800 | 1.5 |
| HR-52 | 68/32 | 11000 | 1.7 |
| HR-53 | 100 | 8000 | 1.4 |
| HR-54 | 100 | 8500 | 1.4 |

TABLE 1-continued

| Resin | Composition | Mw | Mw/Mn |
|---|---|---|---|
| HR-55 | 80/20 | 13000 | 2.1 |
| HR-56 | 70/30 | 18000 | 2.3 |
| HR-57 | 50/50 | 5200 | 1.9 |
| HR-58 | 50/50 | 10200 | 2.2 |
| HR-59 | 60/40 | 7200 | 2.2 |
| HR-60 | 32/32/36 | 5600 | 2.0 |
| HR-61 | 30/30/40 | 9600 | 1.6 |
| HR-62 | 40/40/20 | 12000 | 2.0 |
| HR-63 | 100 | 6800 | 1.6 |
| HR-64 | 50/50 | 7900 | 1.9 |
| HR-65 | 40/30/30 | 5600 | 2.1 |
| HR-66 | 50/50 | 6800 | 1.7 |
| HR-67 | 50/50 | 5900 | 1.6 |
| HR-68 | 49/51 | 6200 | 1.8 |
| HR-69 | 50/50 | 8000 | 1.9 |
| HR-70 | 30/40/30 | 9600 | 2.3 |
| HR-71 | 30/40/30 | 9200 | 2.0 |
| HR-72 | 40/29/31 | 3200 | 2.1 |
| HR-73 | 90/10 | 6500 | 2.2 |
| HR-74 | 50/50 | 7900 | 1.9 |
| HR-75 | 20/30/50 | 10800 | 1.6 |
| HR-76 | 50/50 | 2200 | 1.9 |
| HR-77 | 50/50 | 5900 | 2.1 |
| HR-78 | 40/20/30/10 | 14000 | 2.2 |
| HR-79 | 50/50 | 5500 | 1.8 |
| HR-80 | 50/50 | 10600 | 1.9 |
| HR-81 | 50/50 | 8600 | 2.3 |
| HR-82 | 100 | 15000 | 2.1 |
| HR-83 | 100 | 6900 | 2.5 |
| HR-84 | 50/50 | 9900 | 2.3 |

The positive photosensitive composition of the present invention is used by dissolving the above-described components in a predetermined organic solvent, preferably in the above-described mixed solvent, filtering the resulting solution through a filter, applying the filtrate to a predetermined support in the following manner. The filter used for filtration is preferably made of polytetrafluoroethylene, polyethylene, or nylon and has a pore size of 0.1 μm or less, more preferably 0.05 μm or less, still more preferably 0.03 μm or less.

For example, the positive photosensitive composition is applied to a substrate to be used for the manufacture of a precise integrated circuit device (coated, for example, with silicon/silicon dioxide) to a desired thickness (usually from 50 to 500 nm) by a proper application method using a spinner, a coater, or the like. After application, a resist film is formed by drying through spinning or baking. The baking temperature can be set as needed but is usually from 60 to 150° C., preferably from 90 to 130° C.

Then, the resist film is exposed to light through a mask or the like for pattern formation.

The exposure energy can be determined as needed but usually from 1 to 100 mJ/cm². After exposure, the resulting film is subjected to spinning and/or baking, developed, and then rinsed to obtain a pattern.

Exposure (immersion exposure) may be carried out by filling a liquid (immersion medium) having a higher refractive index than air between the photosensitive film and a lens upon irradiation with actinic rays or radiation. This enables to enhance the resolution. Although any liquid is usable as the immersion medium insofar as it has a higher refractive index than air, pure water is preferred. In order to prevent direct contact between the immersion medium and the photosensitive film upon immersion exposure, an overcoat layer may be placed over the photosensitive film. This makes it possible to suppress leaching of the composition from the photosensitive film into the immersion medium, thereby reducing development defects.

Examples of the actinic rays or radiation include infrared light, visible light, ultraviolet light, far ultraviolet light, X-rays and an electron beam. Of these, far ultraviolet light having a wavelength of 250 nm or less is preferred, with that having a wavelength of 220 nm or less being more preferred. Specific examples include a KrF excimer laser (248 nm), an ArF excimer laser (193 nm), an $F_2$ excimer laser (157 nm), X-rays, and an electron beam. Of these, an ArF excimer laser, an $F_2$ excimer laser, EUV (13 nm) and an electron beam are preferred.

Prior to the formation of the resist film, an antireflective film may be formed over the substrate in advance.

As the antireflective film, any of inorganic antireflective films made of titanium, titanium dioxide, titanium nitride, chromium oxide, carbon, amorphous silicon, or the like and organic antireflective films made of a light absorber and a polymer material can be used. Also, commercially available organic antireflective films such as DUV-30 Series and DUV-40 Series, each product of Brewers Science, Ltd. and AR-2, AR-3 and AR-5, each product of Shipley Co. can be used.

In the development step, the alkaline developer is used in the following manner. Examples of the alkaline developer usable for the resist composition include aqueous alkali solutions of an inorganic alkali such as sodium hydroxide, potassium hydroxide, sodium carbonate, sodium silicate, sodium metasilicate, or aqueous ammonia, a primary amine such as ethylamine or n-propylamine, a secondary amine such as diethylamine or di-n-butylamine, a tertiary amine such as triethylamine or methyldiethylamine, an alcoholamine such as dimethylethanolamine or triethanolamine, a quaternary ammonium salt such as tetramethylammonium hydroxide or tetraethylammonium hydroxide, or a cyclic amine such as pyrrole or piperidine.

The alkaline developer containing a proper amount of an alcohol or surfactant may also be used.

The alkaline developer has an alkali concentration of usually from 0.1 to 20 mass %.

The alkaline developer has a pH of usually from 10.0 to 15.0.

The positive resist composition of the present invention may be used in a multilayer resist process (in particular, a three-layer resist process). The multilayer resist process includes the following steps.

(a) A lower resist layer composed of an organic material is formed on a substrate to be processed.

(b) An intermediate layer and then an upper resist layer made of an organic material which crosslinks or decomposes upon exposure to radiation are stacked over the lower resist layer one after another.

(c) After formation of a prescribed pattern on the upper resist layer, the intermediate layer, the lower layer and the substrate are etched successively.

For the formation of the intermediate layer, an organopolysiloxane (silicone resin) or an $SiO_2$ coating solution (SOG) is generally used. Although an appropriate organic high molecular film is used as the lower resist layer, various known photoresists may be used. Examples include FH Series and FHi Series, each product of Fujifilm Arch Co., Ltd. and PFI Series, each product of Sumitomo Chemical Co., Ltd.

The film thickness of the lower resist layer is preferably from 0.1 to 4.0 μm, more preferably from 0.2 to 2.0 μm, especially preferably from 0.25 to 1.5 μm, Film thicknesses adjusted to 0.1 μm or greater are preferred from the standpoint of antireflection and dry etching resistance, while film thicknesses adjusted to not greater than 4.0 μm are preferred from the standpoint of an aspect ratio and pattern collapse of fine patterns after formation.

Example 1
The present invention will hereinafter be described in further detail by using Examples, but the present invention is not limited to or by them.
The following are monomers corresponding to recurring units used for the synthesis of the resin (A) used in Examples.
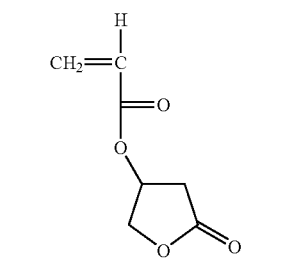
LM-1
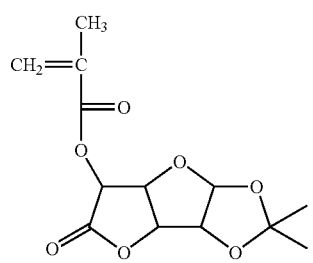
LM-2
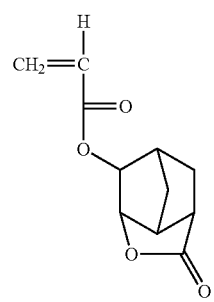
LM-3
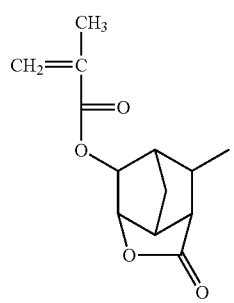
LM-4
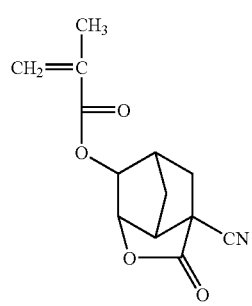
LM-5
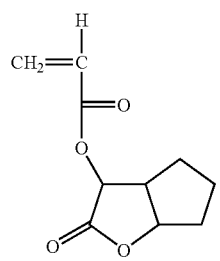
LM-6
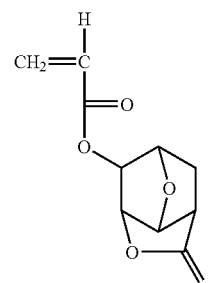
LM-7
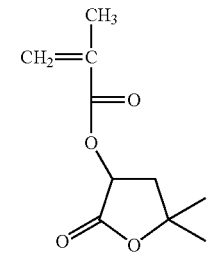
LM-8
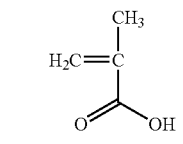
AM-1
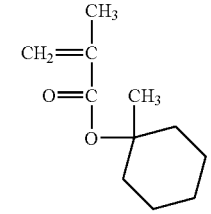
PM-1
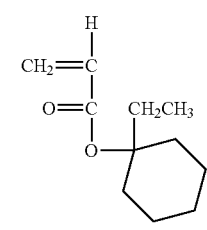
PM-2
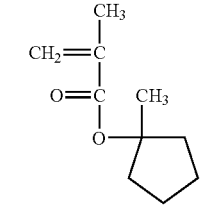
PM-3

PM-4
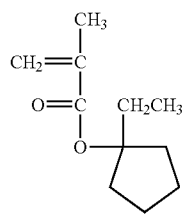
PM-5
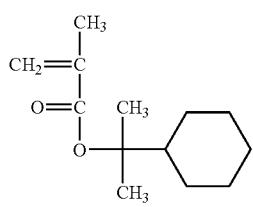
PM-6
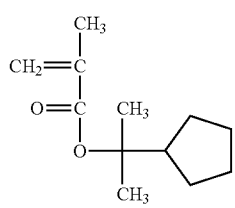
PM-7
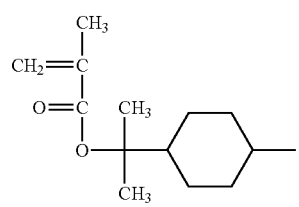
PM-8
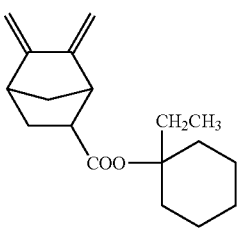
PM-9
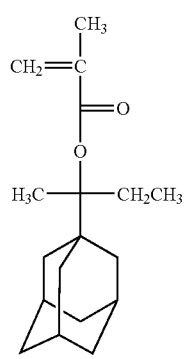
PM-10
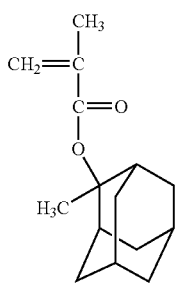
PM-11
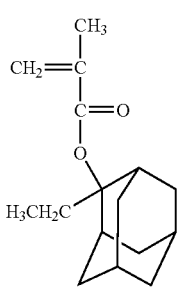
PM-12
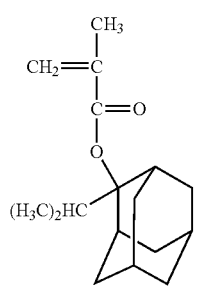
PM-13
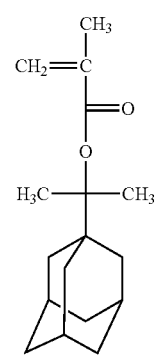
IM-1
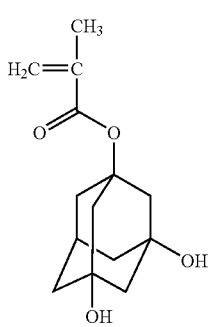

-continued

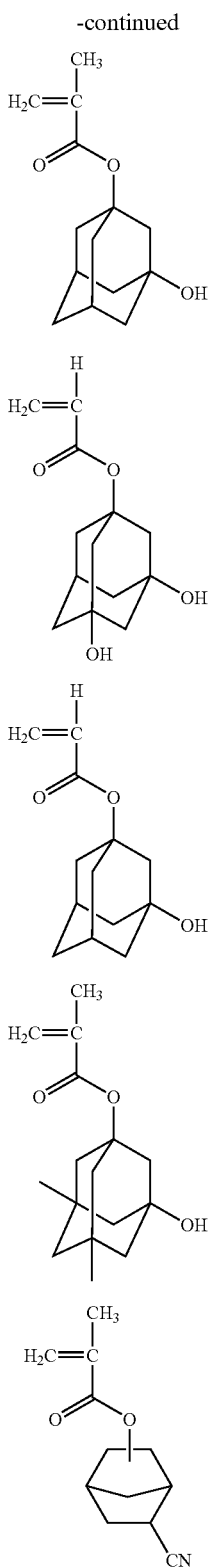

Synthesis Examples 1 to 17 of Resin A

Under a nitrogen gas stream, 4.7 g of cyclohexanone was charged in a three-necked flask and heated to 80° C. Then, a solution obtained by dissolving 4.70 g of (LM-1), 2.52 g of (IM-1), 2.30 g of (PM-1), 2.40 g of (PM-9), 0.0821 g of a polymerization initiator (azobisisobutyronitrile (AIBN): product of Wako Pure Chemical Industries, Ltd.), and 0.947 g of the compound (Si) of the present invention in 41.9 g of cyclohexanone was added dropwise over 6 hours. After completion of the dropwise addition, the resulting mixture was reacted for 2 hours at 80° C. The reaction solution was allowed to cool down and then added dropwise to 700 ml of methanol over 20 minutes. Powders thus precipitated were collected by filtration, followed by drying to yield 7.5 g of the intended resin (A-1). The resin thus obtained had a weight average molecular weight of 7300 in terms of standard polystyrene and dispersity (Mw/Mn) of 1.4.

In a similar manner, resins (A-2) to (A-17) were synthesized.

Comparative Synthesis Example 1 of Comparative Resin

Under a nitrogen gas stream, 4.7 g of cyclohexanone was charged in a three-necked flask and heated to 80° C. Then, a solution obtained by dissolving 4.70 g of (LM-1), 2.52 g of (IM-1), 2.30 g of (PM-1), 2.40 g of (PM-9), and 0.328 g of a polymerization initiator (azobisisobutyronitrile (AIBN): product of Wako Pure Chemical Industries, Ltd.) in 41.9 g of cyclohexanone was added dropwise over 6 hours. After completion of the dropwise addition, the resulting mixture was reacted for 2 hours at 80° C. The reaction solution was allowed to cool down and then added dropwise to 700 ml of methanol over 20 minutes. Powders thus precipitated were collected by filtration, followed by drying to yield 8.0 g of the intended resin (Ref-1). The resin thus obtained had a weight average molecular weight of 8300 in terms of standard polystyrene and dispersity (Mw/Mn) of 1.4.

Comparative Synthesis Example 2 of Comparative resin

Under a nitrogen gas stream, 4.7 g of cyclohexanone was charged in a three-necked flask and heated to 80° C. Then, a solution obtained by dissolving 4.70 g of (LM-1), 2.52 g of (IM-1), 4.70 g of (PM-1), 0.0821 g of a polymerization initiator (azobisisobutyronitrile (AIBN): product of Wako Pure Chemical Industries, Ltd.), and 0.947 g of the compound (S1) of the present invention in 41.9 g of cyclohexanone was added dropwise over 6 hours. After completion of the dropwise addition, the resulting mixture was reacted for 2 hours at 80° C. The reaction mixture was allowed to cool down and then added dropwise to 700 ml of methanol over 20 minutes. Powders thus precipitated were collected by filtration, followed by drying to yield 7.5 g of the intended resin (Ref-2). The resin thus obtained had a weight average molecular weight of 8600 in terms of standard polystyrene and dispersity (Mw/Mn) of 1.4.

Structural units employed for the synthesis, composition ratio (molar ratio) of them, and weight average molecular weight (Mw) and diversity (Mw/Mn) of the resin thus obtained are shown in Table 1. In the table, Compound (S)s have already been described above in the specific examples.

TABLE 1

| Synthesis Example | LM | IM | PM1 | PM2 | AM | Compound (S) of the formula (2) and content thereof (mol %) | Composition ratio | Weight average molecular weight | Dispersity |
|---|---|---|---|---|---|---|---|---|---|
| A-1 | LM-1 | IM-1 | PM-1 | PM-9 | — | S1 (5.0) | 39/21/29/11 | 7300 | 1.4 |
| A-2 | LM-2 | IM-2 | PM-2 | PM-10 | — | S4 (5.0) | 49/12/19/20 | 8500 | 1.3 |
| A-3 | LM-3 | IM-3 | PM-4 | PM-11 | — | S12 (5.0) | 45/15/20/20 | 6900 | 1.5 |
| A-4 | LM-4 | IM-2 | PM-5 | PM-12 | AM-1 | S3 (5.0) | 40/12/22/19/7 | 7800 | 1.4 |
| A-5 | LM-5 | IM-1 | PM-7 | PM-13 | — | S17 (5.0) | 48/11/31/10 | 8200 | 1.4 |
| A-6 | LM-6 | IM-4 | PM-1 | PM-3 | — | S2 (3.5) | 38/22/31/9 | 7300 | 1.3 |
| A-7 | LM-7 | IM-1 | PM-4 | PM-6 | — | S7 (4.0) | 32/12/30/26 | 8000 | 1.5 |
| A-8 | LM-8 | IM-5 | PM-6 | PM-9 | — | S5 (5.0) | 43/16/11/30 | 7400 | 1.4 |
| A-9 | LM-2 | IM-2 | PM-2 | PM-8 | — | S9 (2.0) | 29/10/26/35 | 8600 | 1.2 |
| A-10 | LM-3 | IM-3 | PM-3 | PM-10 | — | S10 (4.5) | 46/13/21/20 | 9000 | 1.5 |
| A-11 | LM-5 | IM-6 | PM-5 | PM-11 | AM-1 | S19 (4.0) | 40/20/14/16/10 | 6800 | 1.3 |
| A-12 | LM-8 | IM-1 | PM-6 | PM-12 | — | S1 (5.0) | 52/12/18/18 | 7200 | 1.4 |
| A-13 | LM-1 | IM-1 | PM-8 | PM-13 | — | S4 (5.0) | 41/13/26/20 | 7000 | 1.3 |
| A-14 | LM-4 | IM-1 | PM-4 | PM-7 | — | S7 (6.0) | 40/21/9/30 | 8400 | 1.5 |
| A-15 | LM-6 | IM-1 | PM-7 | PM-10 | — | S2 (5.0) | 46/14/29/11 | 7500 | 1.5 |
| A-16 | LM-7 | IM-1 | PM-6 | PM-13 | — | S24 (5.0) | 38/18/24/20 | 8200 | 1.4 |
| A-17 | LM-5 | IM-1 | PM-7 | PM-10 | — | S6 (5.0) | 41/19/22/18 | 8600 | 1.3 |
| Ref-1 | LM-1 | IM-1 | PM-1 | PM-9 | — | — | 39/19/31/11 | 8300 | 1.4 |
| Ref2 | LM-1 | IM-1 | PM-1 | — | — | S1 (5.0) | 38/19/43 | 8600 | 1.4 |

The resins thus synthesized contain the following structure and the structure represented by the formula (1) corresponding to the compound represented by the formula (2) in Table 1.

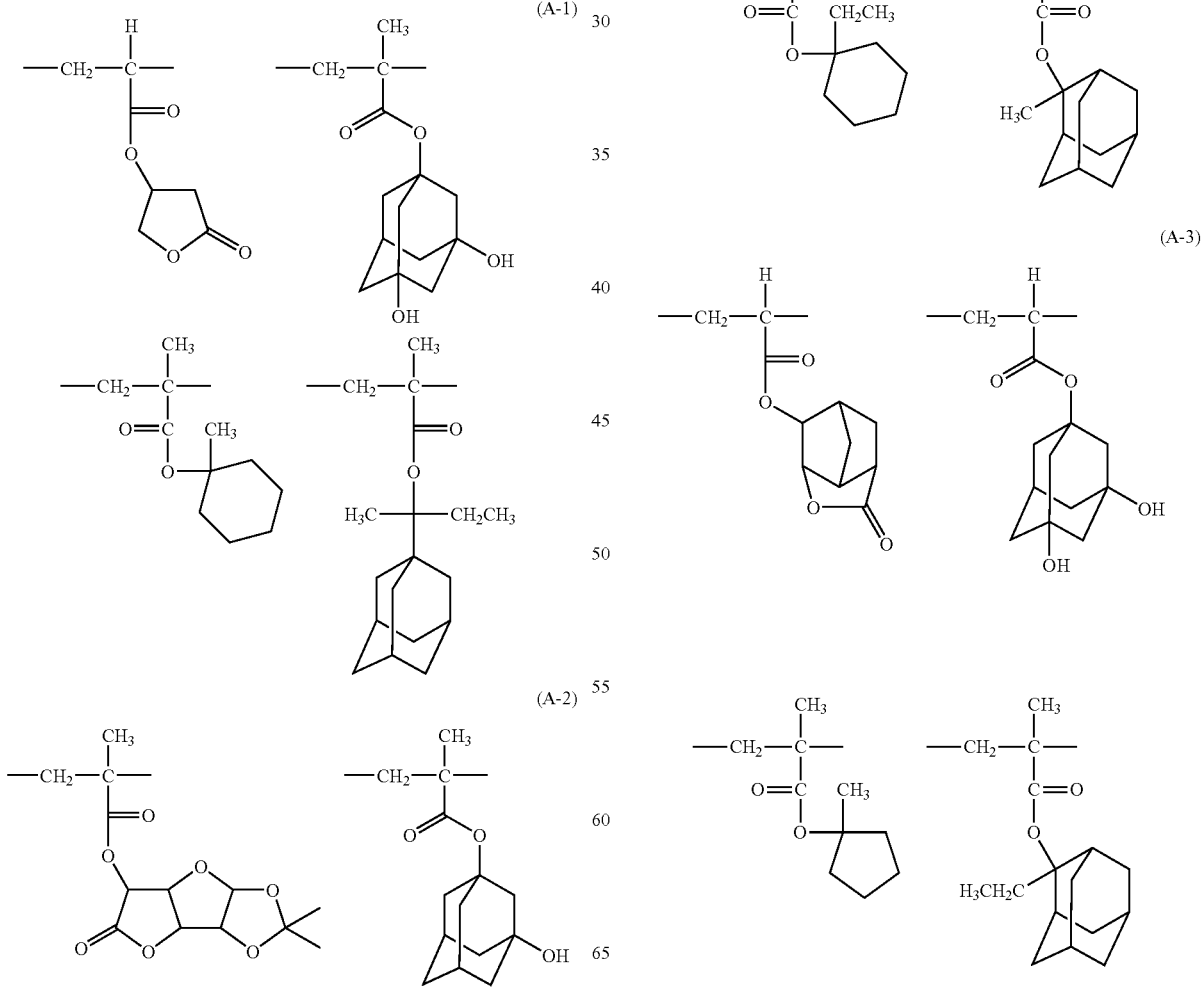

-continued
(A-4)
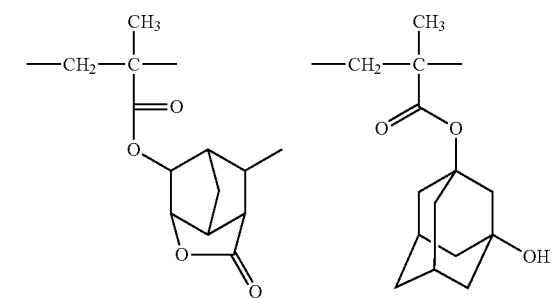
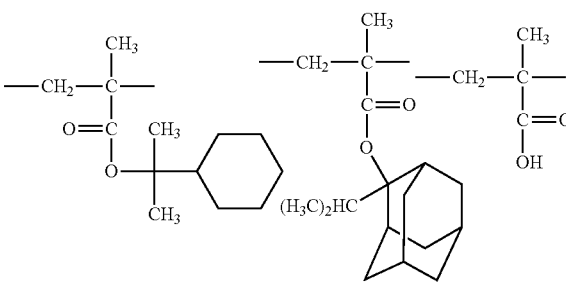
(A-5)
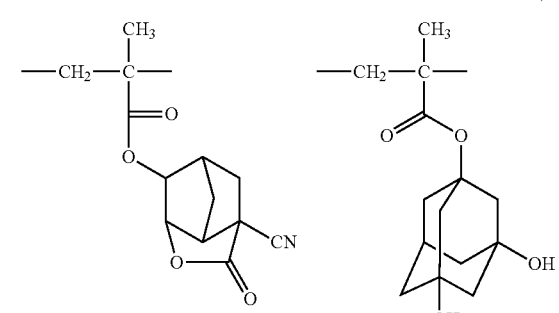
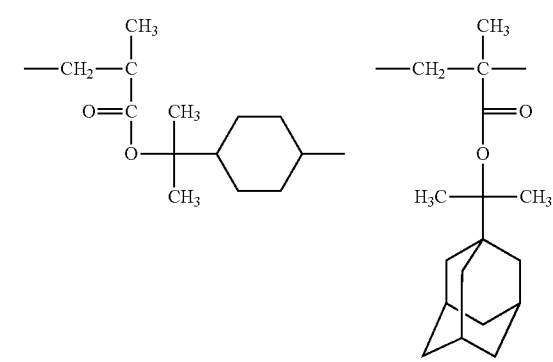
(A-6)
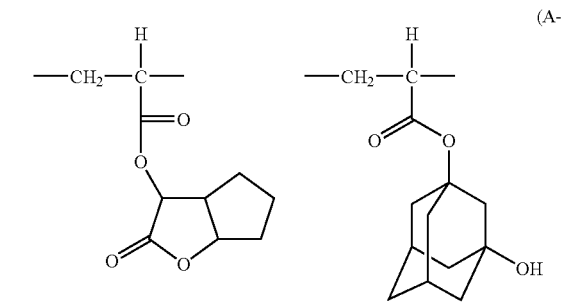
-continued
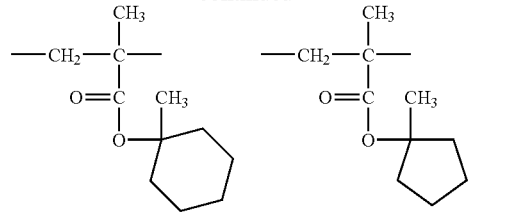
(A-7)
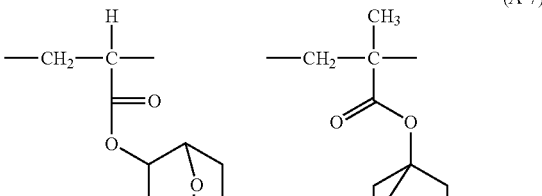
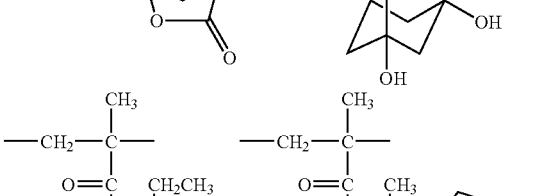
(A-8)
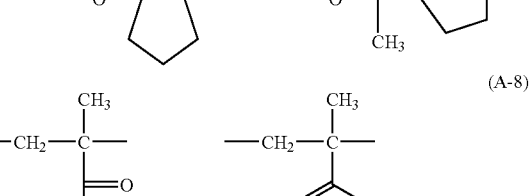
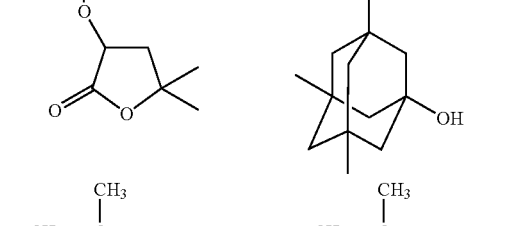
(A-9)
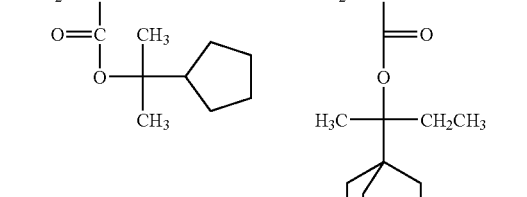

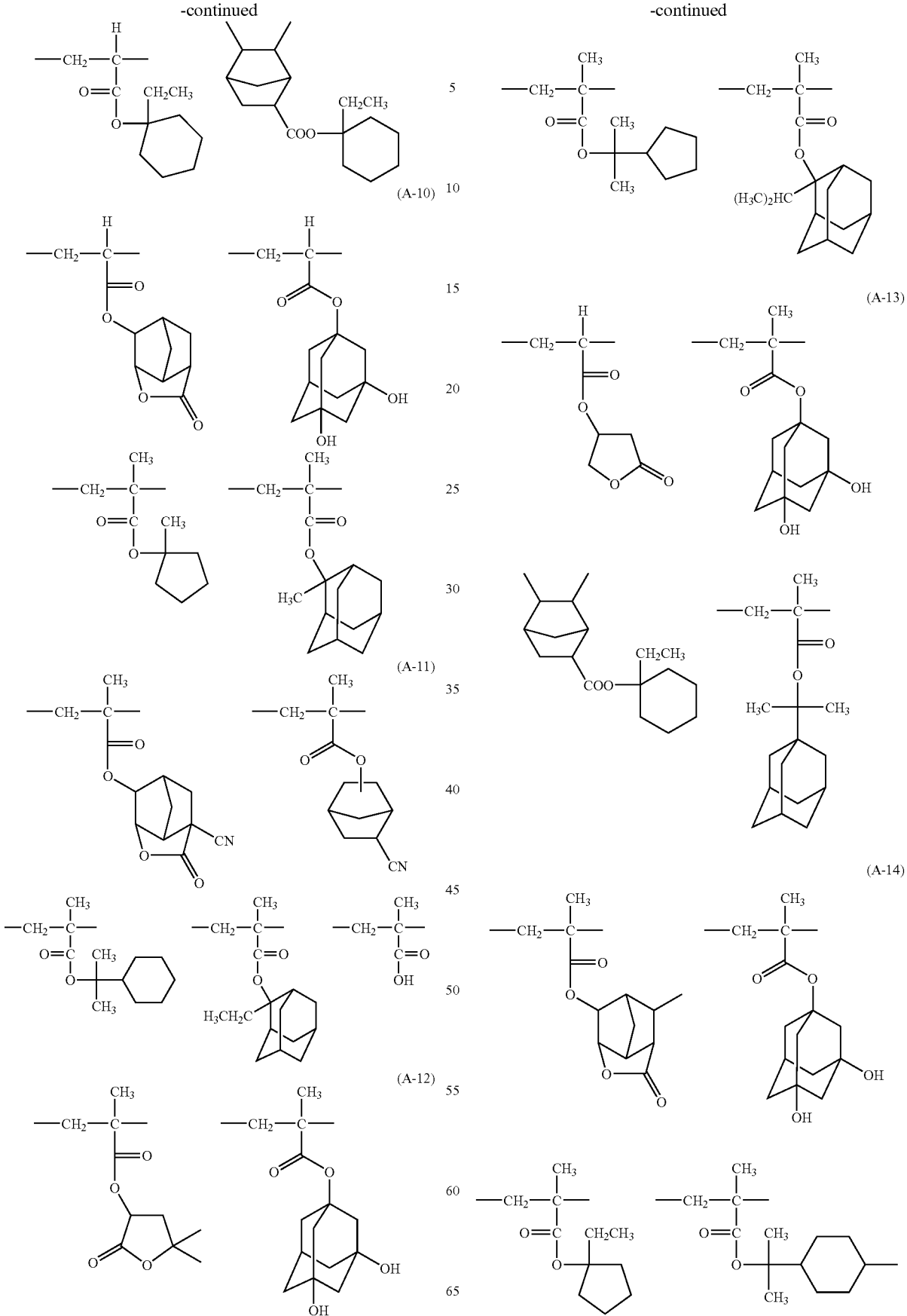
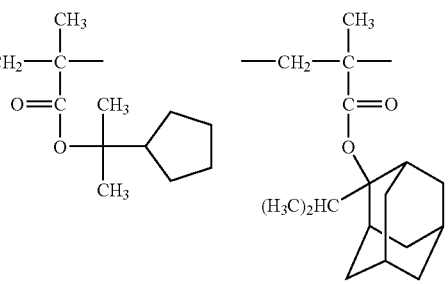

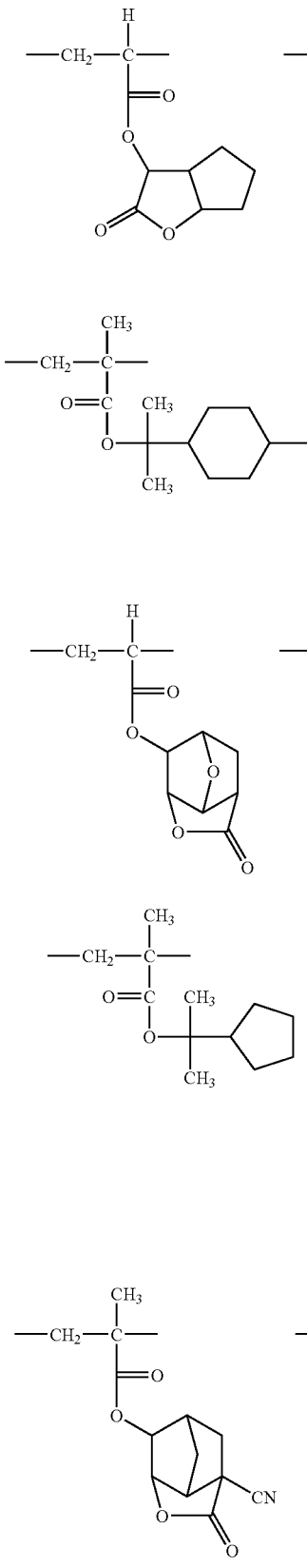

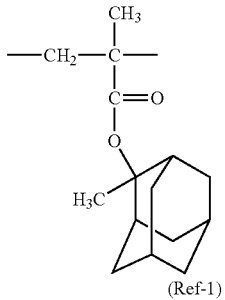

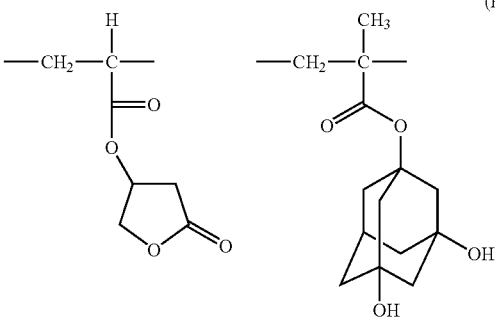

(Ref-1)

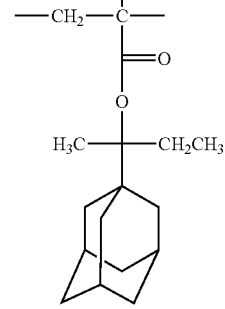

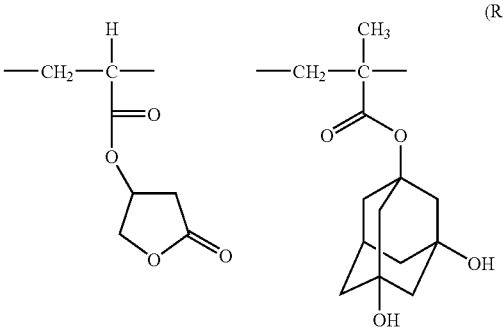

(Ref-2)

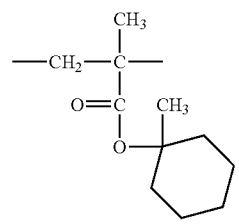

Examples 1-8, 10-17 and Comparative Examples 1-2<

Preparation of a Resist Solution

A positive resist solution was prepared by dissolving the components shown below in Table 2 in a solvent to prepare a solution having a solid concentration of 5% and filtering the resulting solution through a 0.1-μm polyethylene filter. The positive resist solution thus prepared was evaluated in the following manner.

[Standard Resist Evaluation]

An antireflective film ARC29A (product of Brewers Science, Ltd.) was uniformly applied onto a silicon substrate with a thickness 780 angstroms by using a spin coater and dried on a hot plate at 205° C. for 60 seconds, followed by cooling to room temperature. Each of the positive resist solutions was then applied by using a spin coater and dried at 120° C. for 60 seconds to form a resist film of 160 nm.

The resulting resist film was exposed through a 90-nm 1/:1 line-and-space mask by using an ArF excimer laser stepper (product by ASML, NA=0.75) while changing the exposure energy. Immediately after the exposure, the resulting film was heated on a hot plate at 120° C. for 60 seconds and then cooled to room temperature. Further, the film was developed with a 2.38 mass % aqueous tetramethylammonium hydroxide solution at 23° C. for 30 seconds, rinsed with pure water for 30 seconds, and then spin-dried to obtain a line pattern.

[Evaluation of Exposure latitude (EL)]

With respect to the 90 nm (line/space=1/1) line pattern formed in the above standard resist evaluation, the exposure energy permitting reproduction of this mask pattern is set as the optimum exposure energy; a margin of an exposure energy permitting a pattern size of 90 nm±10% when an exposure energy is changed is determined; and the margin of an exposure energy is divided by the optimum exposure energy to obtain an exposure latitude, which is indicated by percentage. The greater the value, the smaller a change in performance due to a change in the exposure energy and the better the exposure latitude.

[Evaluation of Focus Latitude]

Relative to the optimum exposure energy permitting formation of a 1:1 line and space pattern with a line width of 90 nm obtained in the above standard resist evaluation, the maximum focus deviation within a range permitting formation of a line width of 90 nm ±10%, that is, the target line width ±10%, and not causing deterioration of a pattern profile when the focus upon exposure is shifted up and down by 0.1 μm is determined as a focus latitude. The greater the value, the allowance to the focus deviation is greater.

[Evaluation of Pattern Collapse]

The optimum exposure energy for reproduction of the mask pattern in the above-described standard resist evaluation was changed by 10 mJcm$^{-2}$ to an overexposure side and the pattern thus formed was observed with a scanning electron microscope (SEM). The resist not causing pattern collapse was evaluated as "A"; the resist causing a slight pattern collapse was evaluated as "B"; and the resist causing a pattern collapse was evaluated as "C".

[Evaluation of Development Defect]

In the above-described standard resist evaluation, patterns were formed in repetition over the whole wafer surface at an exposure energy to give a line pattern of 90 nm and then the number of development defects (Threshold, 12; pixel size=0.39) was measured with KLA 2112 (product of KLA-Tencor Japan Ltd.). The evaluation results were indicated by the number of defects per 8-inch wafer.

The above evaluation results are shown in Table 2.

TABLE 2

| | Composition | | | | | | Evaluation | | | |
|---|---|---|---|---|---|---|---|---|---|---|
| | Resin (parts by mass) | Acid generator (parts by mass) | Basic compound (parts by mass) | Additive (parts by mass) | Surfactant (parts by mass) | Solvent (parts by mass) | EL (%) | Focus latitude (μm) | Pattern collapse prevention | Development defects (the number of defects) |
| Ex. 1 | A-1 (94.6) | z1 (4.5) | N-2 (0.35) | | W-1 (0.50) | SL-1/SL-5 (1140/760) | 13.6 | 0.40 | A | 22 |
| Ex. 2 | A-2 (94.0) | z2 (4.7) | N-3 (0.40) | AD-1 (0.5) | W-3 (0.50) | SL-1/SL-5/SL-8 (1354/531/15) | 12.5 | 0.35 | A | 26 |
| Ex. 3 | A-3 (92.8) | z1 (5.8) | N-5 (0.38) | AD-1 (0.5) | W-6 (0.50) | SL-2/SL-6/SL-8 (1354/531/15) | 13.4 | 0.38 | A | 23 |
| Ex. 4 | A-4 (92.7) | z2 (6.1) | N-6 (0.25) | AD-3 (0.5) | W-2 (0.50) | SL-1/SL-6 (1369/531) | 12.8 | 0.42 | A | 27 |
| Ex. 5 | A-5 (94.5) | z38/z62 (4.2/2.5) | N-3/N-5 (0.40/0.10) | | W-1 (0.50) | SL-1/SL-6 (1369/531) | 13.9 | 0.37 | A | 24 |
| Ex. 6 | A-6 (92.5) | z55/z60 (4.0/2.5) | N-8 (0.52) | | W-6 (0.50) | SL-2/SL-5 (1656/244) | 13.1 | 0.41 | A | 24 |
| Ex. 7 | A-7 (92.7) | z65/z1 (3.5/3.0) | N-1/N-3 (0.20/0.10) | AD-2 (0.7) | W-1 (0.50) | SL-1/SL-6/SL-8 (1641/244/15) | 13.2 | 0.36 | A | 29 |
| Ex. 8 | A-8 (91.9) | z70/z62 (2.2/4.4) | N-3 (0.35) | | W-4 (0.50) | SL-1/SL-6/SL-7 (1438/442/20) | 13.4 | 0.39 | A | 21 |
| Ex. 10 | A-10 (91.9) | z60/z1 (2.2/4.4) | N-7 (0.35) | AD-2 (0.7) | W-4 (0.50) | SL-3/SL-4 (1438/462) | 13.0 | 0.40 | A | 24 |
| Ex. 11 | A-11 (94.6) | z62 (4.5) | N-3 (0.40) | | W-1 (0.50) | SL-1/SL5 (1354/531) | 12.5 | 0.37 | A | 23 |
| Ex. 12 | A-12 (94.4) | z40 (4.5) | N-3 (0.40) | AD-1 (0.2) | W-1 (0.50) | SL-1/SL-5/SL-8 (1369/531/15) | 12.8 | 0.42 | A | 28 |
| Ex. 13 | A-13 (94.5) | z40 (4.7) | N-4 (0.35) | | W-3 (0.50) | SL-1/SL-5/SL-8 (1641/244/15) | 13.0 | 0.42 | A | 22 |
| Ex. 14 | A-14 (94.5) | z65 (4.7) | N-2 (0.35) | | W-5 (0.50) | SL-1/SL-5/SL-8 (1641/244/15) | 12.4 | 0.39 | A | 24 |
| Ex. 15 | A-15 (94.5) | z2 (4.7) | N-2 (0.35) | | W-3 (0.50) | SL-1/SL-5/SL-8 (1641/244/15) | 12.6 | 0.37 | A | 27 |
| Ex. 16 | A-16 (94.5) | z38 (4.7) | N-2 (0.35) | | W-3 (0.50) | SL-1/SL-5/SL-8 (1641/244/15) | 13.1 | 0.38 | A | 28 |
| Ex. 17 | A-17 (94.5) | z38 (4.7) | N-2 (0.35) | | W-3 (0.50) | SL-1/SL-5/SL-8 (1641/244/15) | 12.8 | 0.37 | A | 21 |
| Comp. Ex. 1 | Ref-1 (94.5) | z1 (4.7) | N-2 (0.35) | | W-1 (0.50) | SL-1/SL-5 (1140/760) | 10.5 | 0.20 | C | 75 |
| Comp. Ex. 2 | Ref-2 (94.5) | z1 (4.7) | N-2 (0.35) | | W-1 (0.50) | SL-1/SL-5 (1140/760) | 11.4 | 0.25 | C | 38 |

The following are compounds corresponding to the abbreviations in Table 2.

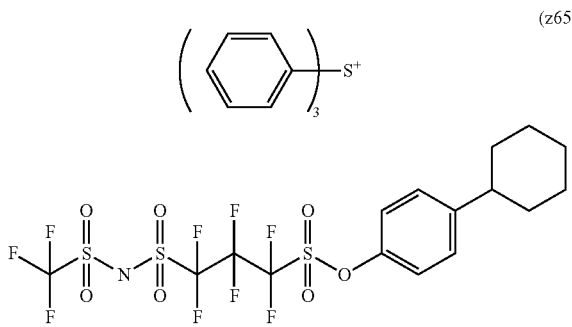

N-1: N,N-Dibutylaniline
N-2: Trioctylamine
N-3: N,N-Dihydroxyethylaniline
N-4: 2,4,5-Triphenylimidazole
N-5: 2,6-Diisopropylaniline
N-6: Hydroxyantipyrine
N-7: Trismethoxymethoxyethylamine
N-8: Triethanolamine
(Dissolution Accelerating Compound)

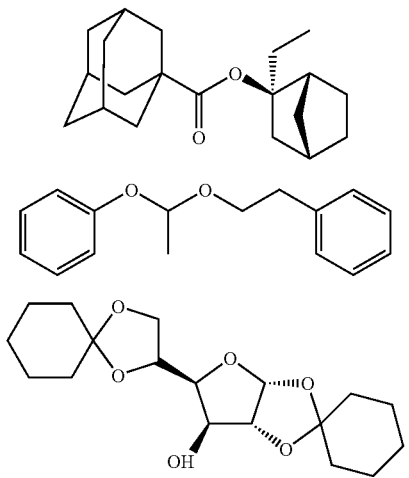

W-1: MEGAFACE F176 (fluorine-based one, product of Dainippon Ink and Chemicals, Incorporated)
W-2: MEGAFACE R08 (fluorine- and silicon-based one, product of Dainippon Ink and Chemicals, Incorporated)
W-3: Polysiloxane polymer KP-341 (silicon-based one, product of Shin-Etsu Chemical Co., Ltd.)
W-4: TROYSOL S-366 (product of Troy Chemical Company)
W-5: KH-20 (product of Asahi Kasei orporation)
W-6: PF6320 (product of OMNOVA Solutions Inc.)
W-7: PF6520 (product of OMNOVA Solutions Inc.)
SL-1: Propylene glycol monomethyl ether acetate
SL-2: Propylene glycol monomethyl ether propionate
SL-3: 2-Heptanone
SL-4: Ethyl lactate
SL-5: Propylene glycol monomethyl ether
SL-6: Cyclohexanone
SL-7: γ-Butyrolactone
SL-8: Propylene carbonate It is apparent from Table 2 that the positive resist compositions of the present invention have less development defects and is satisfactory in exposure latitude, focus latitude, and pattern collapse prevention at a higher level, compared with the comparative positive resist compositions.

Examples 18-25 and 27-34

Evaluation of Immersion Exposure

An antireflective film ARC29A (product of Brewers Science, Ltd.) was applied onto a silicon wafer and baked at 205° C. for 60 seconds to form an antireflective film of 78 nm. Each of the positive resist compositions shown in Table 3 was applied onto the antireflective film and dried at 120° C. for 60 seconds to form a resist film of 160 nm thick. The wafer thus obtained was subjected to pattern exposure by using an ArF excimer laser immersion scanner (NA=0.75). Ultra pure water having an impurity content of 5 ppb or less was used as the immersion liquid. After heating at 120° C. for 60 seconds, the resulting wafer was developed with an aqueous solution of tetramethylammonium hydroxide (2.38 mass %) for 30 seconds, rinsed with pure water, and then spin-dried to obtain a line pattern. Each of the resist composition was evaluated for exposure latitude, focus latitude, pattern collapse, and development defects in a similar manner to that employed in the above-described standard resist evaluation. The results are shown in Table 3. The hydrophobic resin (HR) in the table is that described in the above specific examples.

TABLE 3

| | Composition | | | | | | | Evaluation | | | |
|---|---|---|---|---|---|---|---|---|---|---|---|
| | Resin (parts by mass) | Acid generator (parts by mass) | Basic compound (parts by mass) | Additive (parts by mass) | Surfactant (parts by mass) | Hydrophobic resin (HR) (parts by mass) | Solvent (parts by mass) | EL (%) | Focus latitude (μm) | Pattern collapse prevention | Development defects (the number of defects) |
| Ex. 18 | A-1 (94.6) | z1 (4.5) | N-2 (0.35) | | W-1 (0.50) | HR-45 (0.5) | SL-1/SL-5 (1140/760) | 13.4 | 0.38 | A | 23 |
| Ex. 19 | A-2 (94.0) | z2 (4.7) | N-3 (0.40) | AD-1 (0.5) | W-3 (0.50) | HR-45 (0.7) | SL-1/SL-5/SL-8 (1354/531/15) | 12.7 | 0.40 | A | 28 |
| Ex. 20 | A-3 (92.8) | z1 (5.8) | N-5 (0.38) | AD-1 (0.5) | W-6 (0.50) | HR-45 (1.0) | SL-2/SL-6/SL-8 (1354/531/15) | 13.0 | 0.37 | A | 24 |
| Ex. 21 | A-4 (92.7) | z2 (6.1) | N-6 (0.25) | AD-3 (0.5) | W-2 (0.50) | HR-37 (0.7) | SL-1/SL-6 (1369/531) | 12.5 | 0.42 | A | 29 |
| Ex. 22 | A-5 (94.5) | z38/z62 (4.2/2.5) | N-3/N-5 (0.40/0.10) | | W-1 (0.50) | HR-37 (0.8) | SL-1/SL-6 (1369/531) | 13.5 | 0.42 | A | 26 |
| Ex. 23 | A-6 (92.5) | z55/z60 (4.0/2.5) | N-8 (0.52) | | W-6 (0.50) | HR-37 (0.8) | SL-2/SL-5 (1656/244) | 13.0 | 0.39 | A | 22 |

TABLE 3-continued

| | Composition | | | | | | | Evaluation | | | |
|---|---|---|---|---|---|---|---|---|---|---|---|
| | Resin (parts by mass) | Acid generator (parts by mass) | Basic compound (parts by mass) | Additive (parts by mass) | Surfactant (parts by mass) | Hydrophobic resin (HR) (parts by mass) | Solvent (parts by mass) | EL (%) | Focus latitude (μm) | Pattern collapse prevention | Development defects (the number of defects) |
| Ex. 24 | A-7 (92.7) | z65/z1 (3.5/3.0) | N-1/N-3 (0.20/0.10) | AD-2 (0.7) | W-1 (0.50) | HR-1 (0.6) | SL-1/SL-6/SL-8 (1641/244/15) | 12.4 | 0.37 | A | 28 |
| Ex. 25 | A-8 (91.9) | z70/z62 (2.2/4.4) | N-3 (0.35) | | W-4 (0.50) | HR-1 (0.7) | SL-1/SL-6/SL-7 (1438/442/20) | 12.6 | 0.38 | A | 23 |
| Ex. 27 | A-10 (91.9) | z60/z1 (2.2/4.4) | N-7 (0.35) | AD-2 (0.7) | W-4 (0.50) | HR-8 (0.6) | SL-3/SL-4 (1438/462) | 12.8 | 0.40 | A | 26 |
| Ex. 28 | A-11 (94.6) | z62 (4.5) | N-3 (0.40) | | W-1 (0.50) | HR-30 (0.5) | SL-1/SL5 (1354/531) | 13.6 | 0.35 | A | 24 |
| Ex. 29 | A-12 (94.4) | z40 (4.5) | N-3 (0.40) | AD-1 (0.2) | W-1 (0.50) | HR-25 (0.5) | SL-1/SL-5/SL-8 (1369/531/15) | 12.5 | 0.38 | A | 26 |
| Ex. 30 | A-13 (94.5) | z40 (4.7) | N-2 (0.35) | | W-3 (0.50) | HR-25 (0.7) | SL-1/SL-5/SL-8 (1641/244/15) | 13.4 | 0.42 | A | 25 |
| Ex. 31 | A-14 (94.5) | z65 (4.7) | N-2 (0.35) | | W-3 (0.50) | HR-28 (1.0) | SL-1/SL-5/SL-8 (1641/244/15) | 12.8 | 0.37 | A | 24 |
| Ex. 32 | A-15 (94.5) | z2 (4.7) | N-2 (0.35) | | W-3 (0.50) | HR-34 (0.7) | SL-1/SL-5/SL-8 (1641/244/15) | 13.9 | 0.41 | A | 27 |
| Ex. 33 | A-16 (94.5) | z38 (4.7) | N-2 (0.35) | | W-3 (0.50) | HR-34 (0.8) | SL-1/SL-5/SL-8 (1641/244/15) | 13.1 | 0.36 | A | 26 |
| Ex. 34 | A-17 (94.5) | z38 (4.7) | N-2 (0.35) | | W-3 (0.50) | HR-37 (0.8) | SL-1/SL-5/SL-8 (1641/244/15) | 13.2 | 0.39 | A | 21 |

It has been confirmed from the above results that the positive resist compositions of the present invention are suited for use in the pattern formation by ArF immersion exposure.

INDUSTRIAL APPLICABILITY

From the positive resist composition of the present invention, positive resist films satisfactory in exposure latitude, focus latitude, and pattern collapse prevention at a high level and having reduced development effect are available. The positive resist compositions according to the present invention and the pattern forming method using the positive resist compositions are suited for use in a manufacturing process of semiconductors such as IC, manufacture of circuit substrates for liquid crystals, thermal heads and the like, other photo-fabrication processes, and formation of lithographic printing or acid-curable compositions.

The present invention was described in detail referring to specific embodiments. It is apparent for those skilled in the art that various changes or modifications may be made without departing from the spirit and scope of the present invention.

The present application is based on Japanese Patent Application (Japanese Patent Application No. 2007-184394) filed on Jul. 13, 2007 and details thereof are incorporated herein by reference.

The invention claimed is:

1. A positive resist composition, comprising:
(A) a resin capable of increasing solubility in an alkaline developer under action of an acid, wherein the resin (A) has a recurring unit having a first group selected from the groups represented by any of the following formulas (pI) to (pV), a recurring unit having a second group selected from the groups represented by any of the following formulas (pI) to (pV) but different from the first group, and a structure represented by the following formula (1) in a polymer main chain;
(B) a compound generating an acid upon irradiation with actinic rays or radiation; and
(C) a solvent:

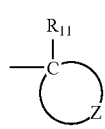 (pI)

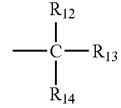 (pII)

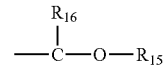 (pIII)

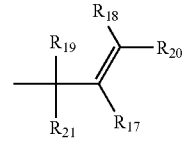 (pIV)

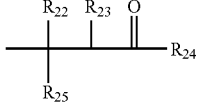 (pV)

in the formulas (pI) to (pV), $R_{11}$ represents an alkyl group or a cycloalkyl group;

Z represents an atomic group necessary to form a cycloalkyl group with the carbon atom;

$R_{12}$ to $R_{16}$ each independently represents an alkyl group or a cycloalkyl group provided that at least one of $R_{12}$ to $R_{14}$ or either one of $R_{15}$ or $R_{16}$ represents a cycloalkyl group;

$R_{17}$ to $R_{21}$ each independently represents a hydrogen atom, an alkyl group, or a cycloalkyl group provided that at least one of $R_{17}$ to $R_{21}$ represents a cycloalkyl group and either one of $R_{19}$ or $R_{21}$ represents an alkyl group or a cycloalkyl group; and $R_{22}$ to $R_{25}$ each independently represents a hydrogen atom, an alkyl group, or a cycloalkyl group provided that at least one of $R_{22}$ to $R_{25}$ represents a cycloalkyl group and $R_{23}$ and $R_{24}$ may be coupled together to form a ring,

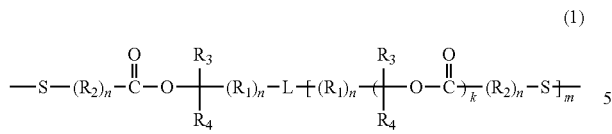

(1)

in the formula (1),

L represents, when m=1, a single bond or a divalent hydrocarbon group which may have a heteroatom and L represents, when m≧2, an m+1 valent hydrocarbon group which may have a heteroatom;

$R_1$ and $R_2$ each independently represents a group selected from the group consisting of alkylenes, cycloalkylenes, oxyalkylenes, arylenes, divalent thiazoline rings, divalent oxazoline rings, and divalent imidazoline rings or a divalent group formed using two or more thereof in combination;

$R_3$ and $R_4$ each independently represents an alkyl group, a cycloalkyl group, an alkenyl group, or an aryl group and $R_3$ and $R_4$ may be coupled with a carbon atom of $R_1$ or L adjacent thereto to form a ring structure;

n and k each independently stands for 0 or 1; and m stands for an integer of from 1 to 16.

2. The positive resist composition according to claim 1, wherein the resin (A) is obtained by polymerization of monomers by using a compound represented by the following formula (2) and a polymerization initiator:

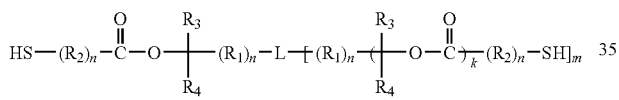

(2)

in the formula (2),

L represents, when m=1, a single bond or a divalent hydrocarbon group which may have a heteroatom and L represents, when m≧2, an m+1 valent hydrocarbon group which may have a heteroatom;

$R_1$ and $R_2$ each independently represents a group selected from the group consisting of alkylenes, cycloalkylenes, oxyalkylenes, arylenes, divalent thiazoline rings, divalent oxazoline rings, and divalent imidazoline rings or a divalent group formed using two or more thereof in combination;

$R_3$ and $R_4$ each independently represents an alkyl group, a cycloalkyl group, an alkenyl group, or an aryl group and $R_3$ and $R_4$ may be coupled with a carbon atom of $R_1$ or L adjacent thereto to form a ring structure;

n and k each independently stands for 0 or 1; and m stands for an integer of from 1 to 16.

3. The positive resist composition according to claim 1, wherein the resin (A) further has a recurring unit containing a lactone group.

4. The positive resist composition according to claim 1, wherein the resin (A) further contains a recurring unit containing an alicyclic hydrocarbon structure substituted with a polar group.

5. The positive resist composition according to claim 1, wherein the resin (A) further contains a recurring unit containing an alkali soluble group.

6. The positive resist composition according to claim 1, wherein the number of moles of the structure represented by the formula (1) is from 2.5 to 10 mol % based on the total number of moles of the structural units contained in the resin (A).

7. The positive resist composition according to claim 1, further comprising:

a hydrophobic resin.

8. A process for producing a resin capable of increasing solubility in an alkaline developer under action of an acid, the process comprising:

polymerizing monomers by using a monomer having a first group selected from the groups represented by any of the following formulas (pI) to (pV), a monomer having a second group selected from the groups represented by any of the following formulas (pI) to (pV) but different from the first group, a compound represented by formula (2) and a polymerization initiator:

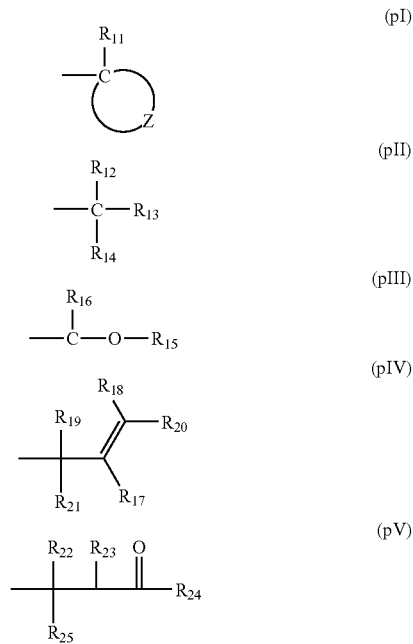

in the formulas (pI) to (pV), $R_{11}$ represents an alkyl group or a cycloalkyl group;

Z represents an atomic group necessary to form a cycloalkyl group with the carbon atom;

$R_{12}$ to $R_{16}$ each independently represents an alkyl group or a cycloalkyl group provided that at least one of $R_{12}$ to $R_{14}$ or either one of $R_{15}$ or $R_{16}$ represents a cycloalkyl group;

$R_{17}$ to $R_{21}$ each independently represents a hydrogen atom, an alkyl group, or a cycloalkyl group provided that at least one of $R_{17}$ to $R_{21}$ represents a cycloalkyl group and either one of $R_{19}$ or $R_{21}$ represents an alkyl or cycloalkyl group;

$R_{22}$ to $R_{25}$ each independently represents a hydrogen atom, an alkyl group, or a cycloalkyl group provided that at least one of $R_{22}$ to $R_{25}$ represents a cycloalkyl group and $R_{23}$ and $R_{24}$ may be coupled together to form a ring, (2)

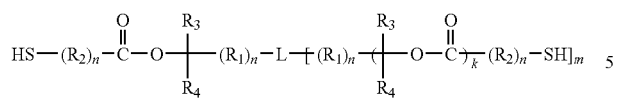

in the formula (2),

L represents, when m=1, a single bond or a divalent hydrocarbon group which may have a heteroatom and L represents, when m≧2, an m+1 valent hydrocarbon group which may have a heteroatom;

$R_1$ and $R_2$ each independently represents a group selected from the group consisting of alkylenes, cycloalkylenes, oxyalkylenes, arylenes, divalent thiazoline rings, divalent oxazoline rings, and divalent imidazoline rings or a divalent group formed using two or more thereof in combination;

$R_3$ and $R_4$ each independently represents an alkyl group, a cycloalkyl group, an alkenyl group, or an aryl group and $R_3$ and $R_4$ may be coupled with a carbon atom of $R_1$, or L adjacent thereto to form a ring structure;

n and k each independently stands for 0 or 1; and m stands for an integer of from 1 to 16.

9. A pattern forming method comprising:

forming a film from the positive resist composition according to claim 1; and exposing and developing the film.

10. The pattern forming method according to claim 9, the exposure is carried out through an immersion medium.

11. The positive resist composition according to claim 7, wherein the hydrophobic resin is a resin having at least one of a fluorine atom and a silicon atom.

* * * * *